(12) United States Patent
Nagata

(10) Patent No.: US 10,134,888 B2
(45) Date of Patent: Nov. 20, 2018

(54) SEMICONDUCTOR DEVICE AND METHOD OF MANUFACTURING THE SAME

(71) Applicant: Renesas Electronics Corporation, Tokyo (JP)

(72) Inventor: Nao Nagata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/992,405

(22) Filed: May 30, 2018

(65) Prior Publication Data

US 2018/0277668 A1 Sep. 27, 2018

Related U.S. Application Data

(60) Continuation of application No. 15/807,978, filed on Nov. 9, 2017, now Pat. No. 10,002,953, which is a
(Continued)

(30) Foreign Application Priority Data

Sep. 25, 2015 (JP) .................................. 2015-187817

(51) Int. Cl.
*H01L 29/739* (2006.01)
*H01L 29/66* (2006.01)
(Continued)

(52) U.S. Cl.
CPC ........ *H01L 29/7397* (2013.01); *H01L 21/761* (2013.01); *H01L 29/0619* (2013.01);
(Continued)

(58) Field of Classification Search
CPC . H01L 29/7397; H01L 29/404; H01L 29/401; H01L 29/407; H01L 29/0619;
(Continued)

(56) References Cited

U.S. PATENT DOCUMENTS 8,994,102 B2 3/2015 Hikasa
9,614,066 B2 4/2017 Matsuura et al.
(Continued)

FOREIGN PATENT DOCUMENTS

EP 3 073 529 A1 9/2016
JP 2012-256839 A 12/2012
(Continued)

OTHER PUBLICATIONS

Extended European Search Report received in corresponding European Application No. 16190153.3 dated Feb. 2, 2017.

*Primary Examiner* — Dao H Nguyen
(74) *Attorney, Agent, or Firm* — Mattingly & Malur, PC

(57) ABSTRACT

A performance of a semiconductor device is improved. A semiconductor device includes two element portions and an interposition portion interposed between the two element portions. The interposition portion includes a p-type body region formed in a part of a semiconductor layer, the part being located between two trenches, and two p-type floating regions formed in two respective parts of the semiconductor layer, the two respective portions being located on both sides of the p-type body region via the two respective trenches. A lower end of the p-type floating region is arranged on a lower side with reference to a lower end of the p-type body region.

13 Claims, 45 Drawing Sheets

Related U.S. Application Data division of application No. 15/271,350, filed on Sep. 21, 2016, now Pat. No. 9,837,515.

(51) Int. Cl.
| | | |
|---|---|---|
| *H01L 29/40* | (2006.01) | |
| *H01L 29/06* | (2006.01) | |
| *H02M 7/537* | (2006.01) | |
| *H01L 21/761* | (2006.01) | |
| *H01L 29/10* | (2006.01) | |

(52) U.S. Cl.
CPC ...... *H01L 29/0623* (2013.01); *H01L 29/0696* (2013.01); *H01L 29/1095* (2013.01); *H01L 29/401* (2013.01); *H01L 29/404* (2013.01); *H01L 29/407* (2013.01); *H01L 29/66348* (2013.01); *H02M 7/537* (2013.01); *H05K 999/99* (2013.01)

(58) Field of Classification Search
CPC ............ H01L 29/0623; H01L 29/0696; H01L 29/1095; H01L 29/66348; H01L 21/761; H02M 7/537; H05K 999/99
USPC ....... 257/139, 140, 144, 328, 329, 330, 378, 257/E29.107, E29.198, E29.255; 438/138, 270

See application file for complete search history.

(56) References Cited

U.S. PATENT DOCUMENTS

| | | | |
|---|---|---|---|
| 2010/0327313 A1* | 12/2010 | Nakamura | H01L 29/0834 257/133 |
| 2012/0292662 A1* | 11/2012 | Matsuura | H01L 29/66348 257/139 |
| 2013/0037853 A1 | 2/2013 | Onozawa | |
| 2013/0075810 A1* | 3/2013 | Hsieh | H01L 29/66348 257/328 |
| 2013/0175574 A1* | 7/2013 | Matsuura | H01L 29/66348 257/139 |
| 2015/0076554 A1 | 3/2015 | Laven et al. | |
| 2015/0145028 A1 | 5/2015 | Laven et al. | |
| 2017/0110563 A1* | 4/2017 | Hikasa | H01L 29/7397 |
| 2017/0278956 A1* | 9/2017 | Tsuyuki | H01L 29/66348 |

FOREIGN PATENT DOCUMENTS

| | | |
|---|---|---|
| JP | 2013-140885 A | 7/2013 |
| WO | 2011111500 A1 | 9/2011 |

* cited by examiner

SEMICONDUCTOR DEVICE AND METHOD OF MANUFACTURING THE SAME

CROSS-REFERENCE TO RELATED APPLICATION

The present application claims priority from Japanese Patent Application No. 2015-187817 filed on Sep. 25, 2015, the content of which is hereby incorporated by reference into this application.

TECHNICAL FIELD OF THE INVENTION

The present invention relates to a semiconductor device, and can be used suitably as, for example, a semiconductor device including an insulated gate bipolar transistor (IGBT).

BACKGROUND OF THE INVENTION

As an IGBT with low on-resistance, a trench gate type IGBT has widely been used. An IE (injection enhancement)-type IGBT has been developed, the IE-type IGBT enabling to use an IE effect because an active cell connected to an emitter electrode and an inactive cell region having a floating region are arranged alternately in a cell formation region. The IE effect serves to increase the concentration of charges accumulated in a drift region by preventing holes from being discharged from the emitter electrode side when the IGBT is in an on state.

Japanese Patent Application Laid-Open Publication No. 2012-256839 (Patent Document 1) discloses a technique in an IE-type trench gate IGBT in which each of linear unit cell regions provided in a cell formation region includes a linear active cell region and linear inactive cell regions provided so as to sandwich the linear active cell region from both sides thereof.

Japanese Patent Application Laid-Open Publication No. 2013-140885 (Patent Document 2) discloses a technique in an IE-type trench gate IGBT in which each of linear unit cell regions provided in a cell formation region includes first and second linear unit cell regions, in which the first linear unit cell region has a linear active cell region, and in which the second linear unit cell region has a linear hole collector cell region.

International Publication WO/2011/111500 (Patent Document 3) discloses a technique in an insulated gate semiconductor device in which one or more second trenches each formed to be between first trenches adjacent to each other and be parallel to the first trenches are formed, and in which a first conductor is buried in the second trench via an insulating film.

SUMMARY OF THE INVENTION

A semiconductor device including an IGBT having an EGE-type (emitter-gate-emitter-type) active cell region is known as an IE-type trench gate IGBT, such as the IE-type trench gate IGBT disclosed in Patent Document 2 described above.

The semiconductor device including the IGBT having the EGE-type active cell region has a smaller influence of a displacement current generated in the active cell region on a gate potential in a switching operation when an inductance is connected as a load, than that of a semiconductor device including an IGBT having a GG-type (gate-gate-type) active cell region.

However, it is desirable for the semiconductor device including the IGBT having the EGE-type active cell region to further improve a performance as a semiconductor device such as the IE effect.

Other object and novel characteristics of the present invention will be apparent from the description of the present specification and the accompanying drawings.

A semiconductor device according to the present first embodiment includes two element portions each formed in a first semiconductor layer in each of two first regions arranged to be spaced from each other in a first direction, and includes an interposition portion formed in the first semiconductor layer and interposed between the two element portions in a second region located between the two first regions. The interposition portion includes a p-type body region formed in a part of the first semiconductor layer located between two trenches and two p-type floating regions formed in two respective parts of the first semiconductor layer located on both sides of the p-type body region via the two respective trenches. Each of lower ends of the two p-type floating regions are arranged to be lower than a lower end of the p-type body region.

Also, according to another embodiment, a method of manufacturing a semiconductor device includes a step of forming an element portion in a first semiconductor layer in each of two first regions arranged to be spaced from each other in a first direction and a step of forming an interposition portion interposed between the two element portions formed in the two respective first regions in the first semiconductor layer in a second region located between the two first regions. The step of forming the interposition portion includes a step of forming a p-type body region in a part of the first semiconductor layer located between two trenches and a step of forming two p-type floating regions each in two parts of the first semiconductor layer located on both sides of the p-type body region via the two respective trenches. Each of lower ends of the two p-type floating regions is arranged to be lower than a lower end of the p-type body region.

According to an embodiment, a performance of a semiconductor device can be improved.

BRIEF DESCRIPTIONS OF THE DRAWINGS

DESCRIPTIONS OF THE PREFERRED EMBODIMENTS

Figure 1:
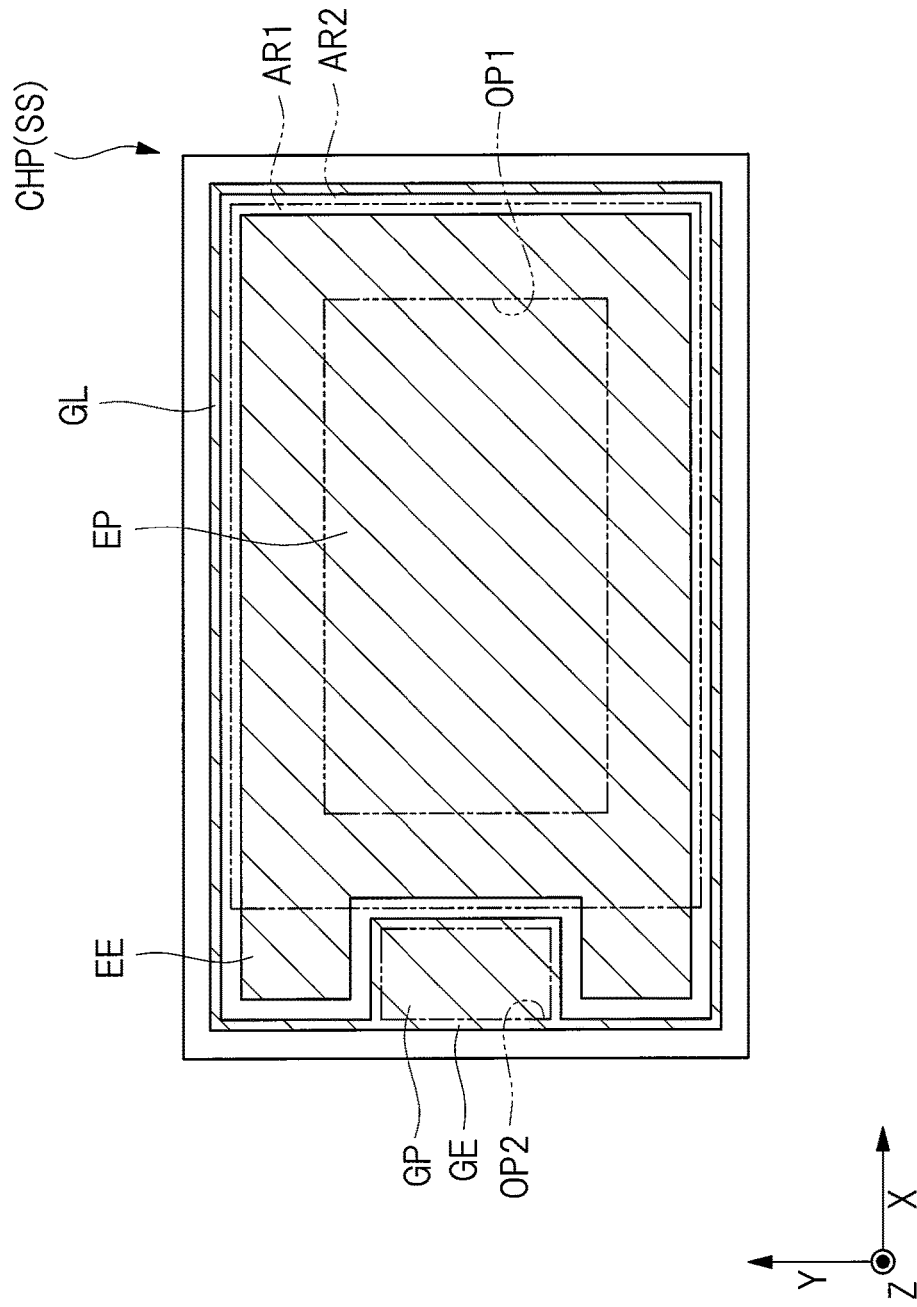
FIG. 1 is a plan view of a semiconductor chip as a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and others are mentioned, the substantially approximate and similar shapes and others are included therein unless otherwise stated or except the case where it is conceivable that they are apparently excluded in principle. The same goes for the numerical value and the range described above.

Hereinafter, typical embodiments of the present invention will be described based on the drawings. Note that components having the same function are denoted by the same reference symbols throughout all the drawings for describing the embodiment, and the repetitive description thereof will be omitted. Also, in the following embodiments, the description of the same or similar parts is not repeated in principle unless otherwise particularly required.

Further, in some drawings used in the embodiments, hatching is omitted in some cases even in a cross-sectional view so as to make the drawings easy to see. Also, hatching is used in some cases even in a plan view so as to make the drawings easy to see.

First Embodiment

Hereinafter, a semiconductor device according to a first embodiment will be described in detail with reference to the drawings. The semiconductor device according to the present first embodiment is a semiconductor device including an IGBT having an EGE-type (emitter-gate-emitter-type) active cell region. Note that a phrase in which "an IGBT has an EGE-type active cell region means that a trench electrode arranged at a center among three trench electrodes arranged in an active cell region to be spaced from each other is electrically connected to a gate electrode while each of two trench electrodes arranged on both ends is electrically connected to an emitter electrode.

<Configuration of Semiconductor Device>

First, a configuration of a semiconductor chip as the semiconductor device according to the first embodiment will be described.

Figure 2:
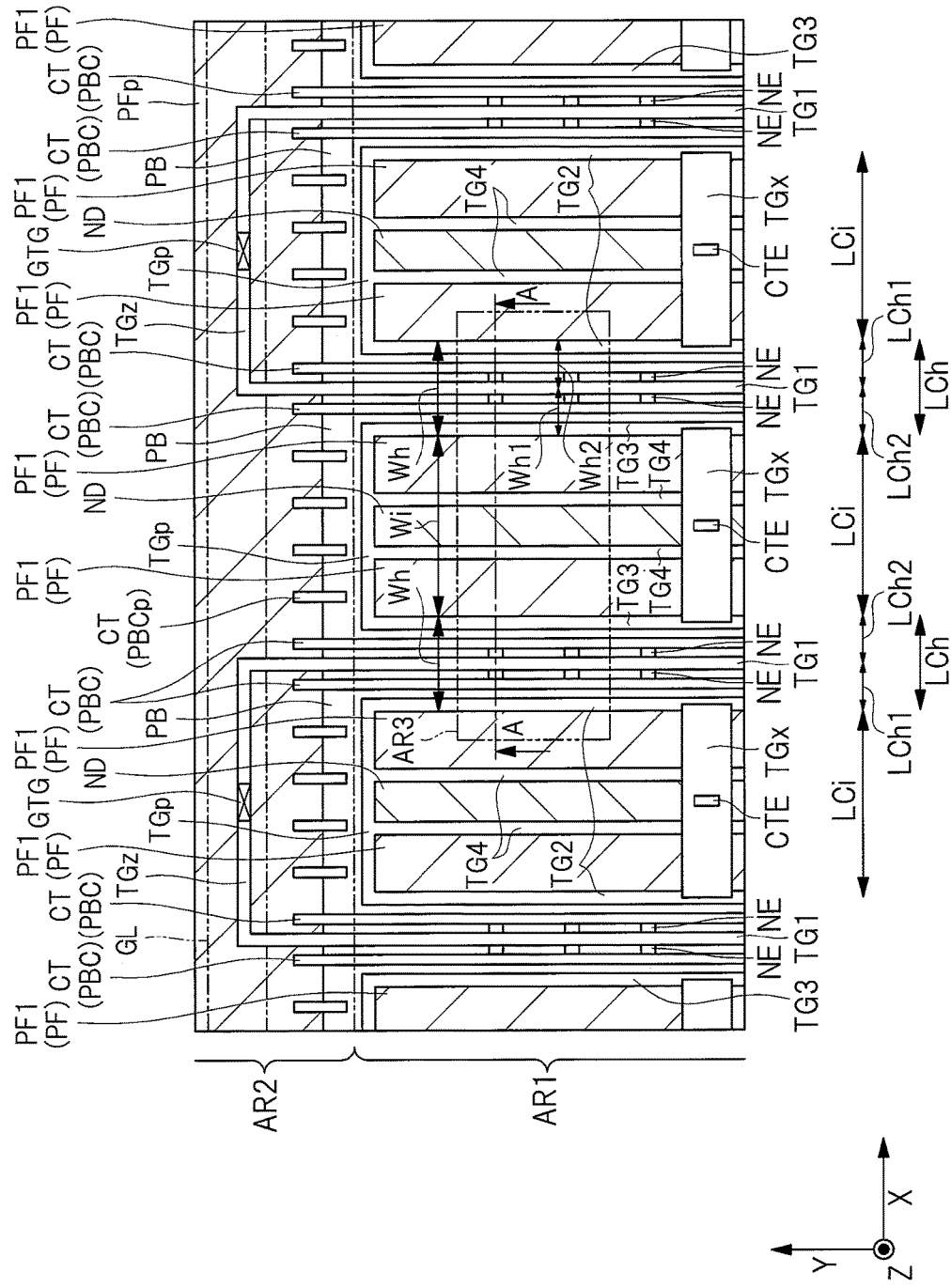
FIG. 2 is a plan view of a principal part of the semiconductor device according to the first embodiment.
Figure 3:
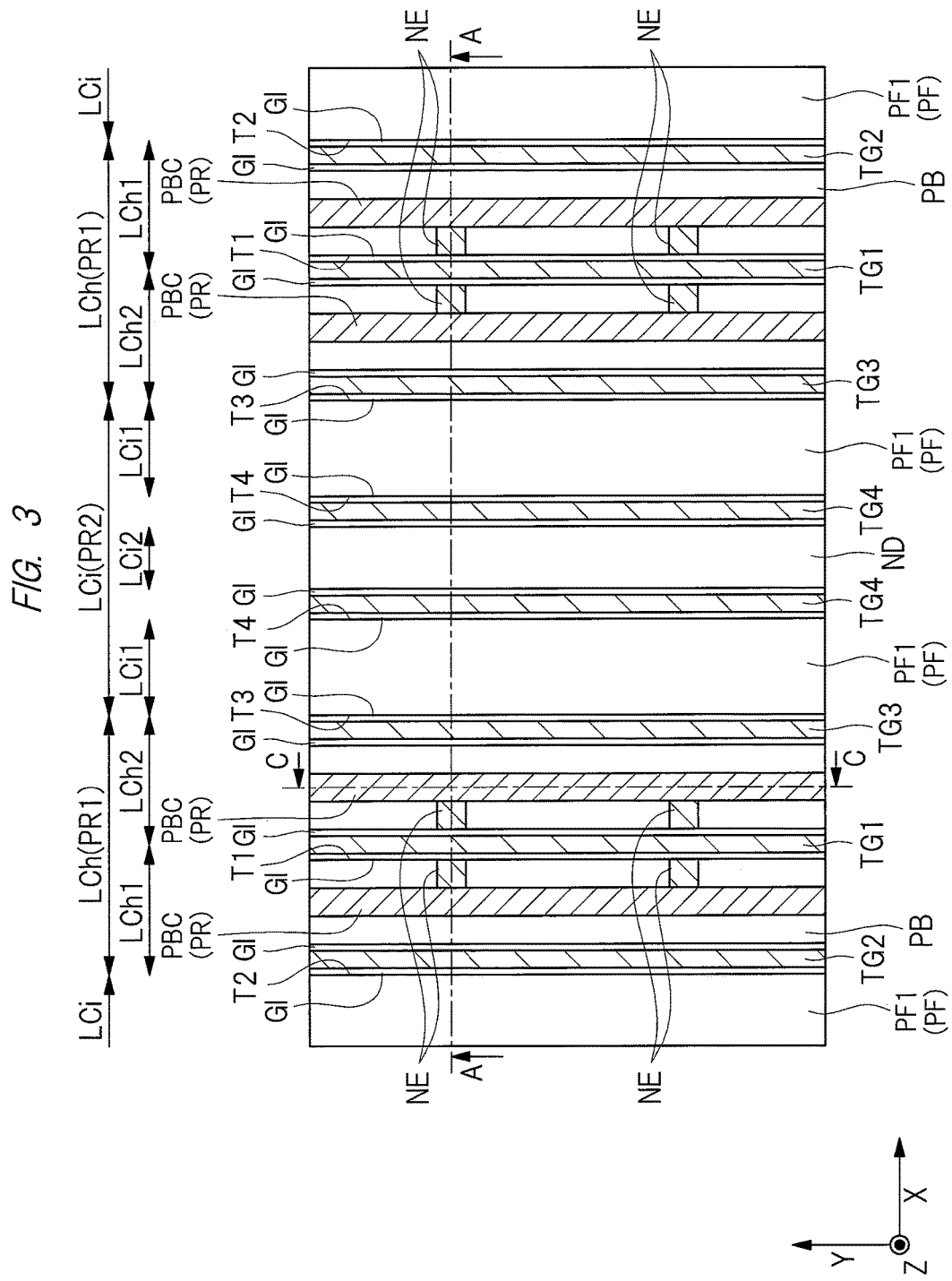
FIG. 3 is a plan view of a principal part of the semiconductor device according to the first embodiment.
Figure 4:
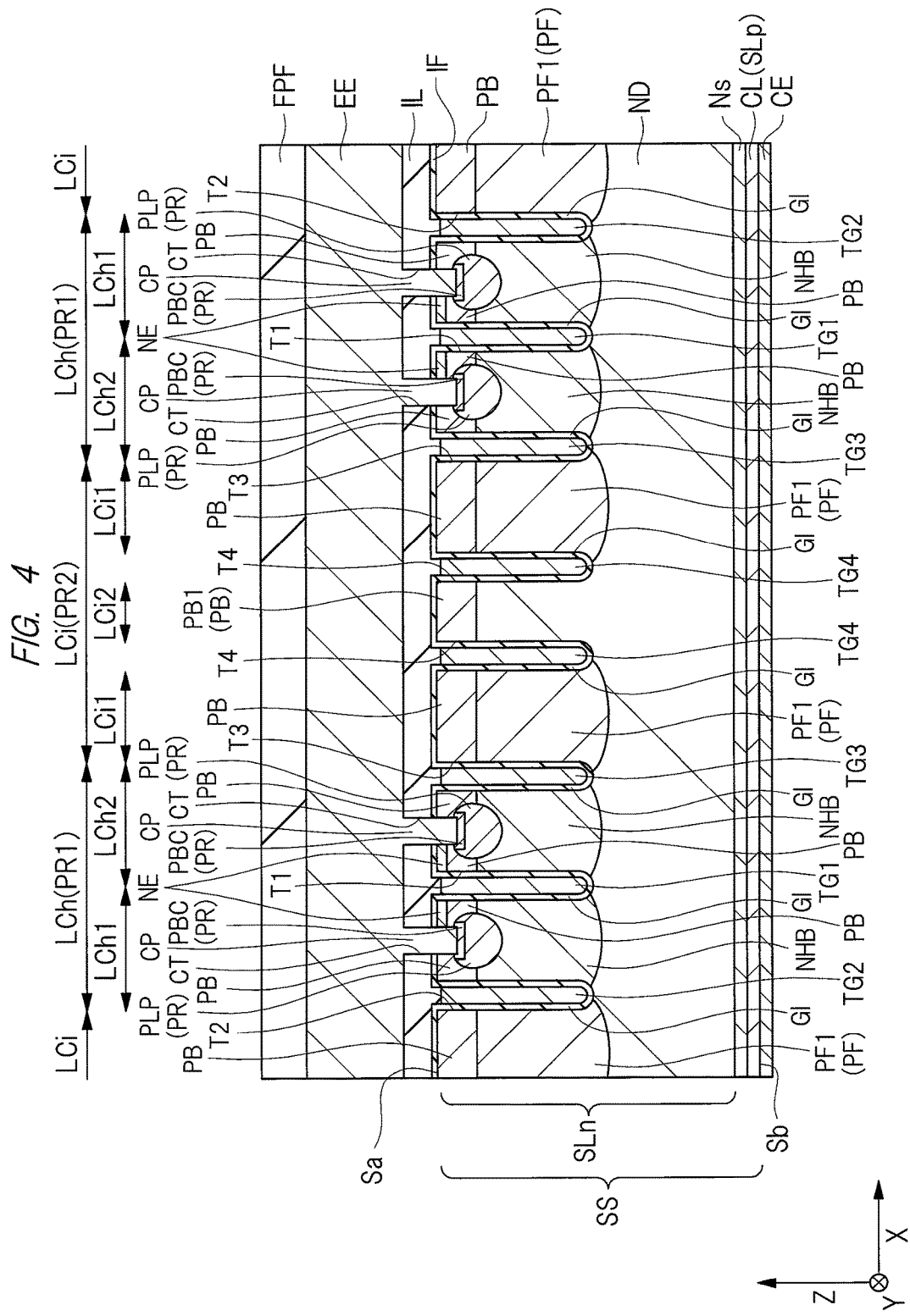
FIG. 4 is a cross-sectional view of a principal part of the semiconductor device according to the first embodiment.

FIG. 1 is a plan view of a semiconductor chip as the semiconductor device according to the first embodiment. Each of FIGS. 2 and 3 is a plan view of a principal part of the semiconductor device according to the first embodiment. FIG. 4 is a cross-sectional view of a principal part of the semiconductor device according to the first embodiment. FIG. 3 illustrates a region AR3 surrounded by a dashed-two dotted line in FIG. 2 to be enlarged. Also, FIG. 4 is a cross-sectional view taken along a line A-A in FIGS. 2 and 3.

Note that FIG. 1 illustrates a transparent-view state obtained by removing an insulating film FPF (see FIG. 4) in order to facilitate understanding, and illustrates outer circumferences of a cell formation region AR1, an emitter pad EP, and a gate pad GP by dashed-two dotted lines. Also, FIG. 2 illustrates a transparent-view state obtained by removing the insulating film FPF, a gate wiring GL, an emitter electrode EE, an interlayer insulating film IL, and a part of a p-type body region PB (see FIG. 4) formed in an inactive cell region LCi in order to facilitate understanding, and illustrates outer circumferences of the cell formation region AR1 and the gate wiring GL by dashed-two dotted lines.

As illustrated in FIG. 1, a semiconductor chip CHP as the semiconductor device according to the present first embodiment includes a semiconductor substrate SS. The semiconductor substrate SS includes an upper surface Sa (see FIG. 4) serving as one main surface and a lower surface Sb (see FIG. 4) serving as the other main surface on an opposite side of the upper surface. The semiconductor substrate SS also includes the cell formation region AR1 serving as a partial region of the upper surface Sa and a gate wiring extraction region AR2 serving as another partial region of the upper surface Sa. The gate wiring extraction region AR2 is provided, for example, on an outer circumferential side of the semiconductor substrate SS with reference to the cell formation region AR1. The emitter electrode EE is provided in the cell formation region AR1. A center part of the emitter electrode EE is the emitter pad EP configured to connect a bonding wire or others. The emitter pad EP is a part of the emitter electrode EE exposed from an opening portion OP1 formed in the insulating film FPF (see FIG. 4) formed to cover the emitter electrode EE. The emitter electrode EE is made of a metal film containing, for example, aluminum as a primarily component.

A gate wiring GL and a gate electrode GE are provided in the gate wiring extraction region AR2. The gate wiring GL is provided, for example, on the outer circumferential side of the semiconductor substrate SS with reference to the emitter electrode EE. The gate wiring GL is connected to the gate electrode GE. A center part of the gate electrode GE is the gate pad GP configured to connect a bonding wire or others. The gate pad GP is a part of the gate electrode GE exposed from an opening portion OP2 formed in the insulating film FPF (see FIG. 4) formed to cover the gate electrode GE. The gate wiring GL and the gate electrode GE are made of a metal film containing, for example, aluminum as a primarily component.

As illustrated in FIGS. 1 to 4, two directions intersecting with, preferably, orthogonal to each other in the upper surface Sa of the semiconductor substrate SS are set to an X axial direction and a Y axial direction, and a direction perpendicular to the upper surface Sa of the semiconductor substrate SS, that is, an up-down direction, is set to a Z axial direction. At this time, in the cell formation region AR1, a plurality of hybrid cell regions LCh serving as active cell regions and a plurality of inactive cell regions LCi are provided as illustrated in FIG. 2. Each of the plurality of hybrid cell regions LCh extends in the Y axial direction, and is periodically arranged in the X axial direction when seen in a plan view. Each of the plurality of inactive cell regions LCi extends in the Y axial direction, and is periodically arranged in the X axial direction when seen in a plan view. Also, the hybrid cell region LCh and the inactive cell region LCi are arranged alternately in the X axial direction.

In the present specification, note that a phrase "when seen in a plan view" means a case of view from a direction perpendicular to the upper surface Sa of the semiconductor substrate SS.

An element portion PR1 serving as a transistor of the IGBT is formed in the hybrid cell region LCh, and an interposition portion PR2 interposed between the two element portions PR1 adjacent to each other is formed in the inactive cell region LCi.

In the present specification, note that the explanation is made so that the respective components formed in the two respective hybrid cell regions LCh adjacent to each other are arranged to be symmetrical to each other across the inactive cell region LCi located between the two hybrid cell regions LCh for convenience of the explanation. That is, the explanation is made so that the respective components included in the two respective element portions PR1 adjacent to each other are arranged to be symmetrical to each other across the interposition portion PR2 interposed between the two element portions PR1. However, the respective components included in the two respective hybrid cell regions LCh adjacent to each other may not be arranged to be symmetrical to each other across the inactive cell region LCi located to be interposed between the two hybrid cell regions LCh. That is, the respective components included in the two respective element portions PR1 adjacent to each other may not be arranged to be symmetrical to each other across the interposition portion PR2 interposed between the two element portions PR1.

The hybrid cell region LCh includes a hybrid sub-cell region LCh1 and a hybrid sub-cell region LCh2. Also, in the hybrid cell region LCh, a trench electrode TG1 serving as a trench gate electrode is provided on a boundary surface between the hybrid sub-cell region LCh1 and the hybrid sub-cell region LCh2.

The trench electrode TG1 is provided at a center of the hybrid cell region LCh. This enables a width Wh1 of the hybrid sub-cell region LCh1 and a width Wh2 of the hybrid sub-cell region LCh2 to be equal to each other and enables the hybrid sub-cell region LCh1 and the hybrid sub-cell region LCh2 to be symmetrical to each other across the trench electrode TG1.

In the hybrid cell region LCh, a trench electrode TG2 and a trench electrode TG3 are provided. The trench electrode TG2 and the trench electrode TG3 are provided on both sides in the X axial direction so as to interpose the trench electrode TG1 therebetween. The trench electrode TG2 and the trench electrode TG3 are electrically connected to the emitter electrode EE.

In the hybrid sub-cell region LCh1, a plurality of $n^+$-type emitter regions NE are provided in a part of the p-type body region PB on the upper surface Sa side of the semiconductor substrate SS. The p-type body region PB is a p-conductivity type semiconductor region, and the $n^+$-type emitter region NE is an n-conductivity type semiconductor region whose conductivity type is different from the p-conductivity type. In the hybrid sub-cell region LCh1, the p-type body region PB is formed continuously along the Y axial direction when seen in a plan view. In the hybrid sub-cell region LCh1, the plurality of $n^+$-type emitter regions NE are arranged to be spaced from each other along the Y axial direction.

In the present specification, note that the p-conductivity type semiconductor may be a state in which only holes or both electrons and holes are charge carriers. However, it means that holes are main charge carriers so that the concentration of holes is higher than the concentration of electrons. Also, in the present specification, the n-conductivity type semiconductor may be a state in which only electrons or both electrons and holes are charge carriers. However, it means that electrons are main charge carriers so that the concentration of electrons is higher than the concentration of holes.

In the hybrid sub-cell region LCh2, the plurality of $n^+$-type emitter regions NE are provided in a part of the p-type body region PB on the s upper surface Sa ide of the semiconductor substrate SS. In the hybrid sub-cell region LCh2, the p-type body region PB is formed continuously along the Y axial direction when seen in a plan view. In the hybrid sub-cell region LCh2, the plurality of $n^+$-type emitter regions NE are arranged to be spaced from each other along the Y axial direction.

In the inactive cell region LCi, two trench electrodes TG4 are provided. The two trench electrodes TG4 are provided to be spaced from each other in the X axial direction. The two trench electrodes TG4 are electrically connected to the emitter electrode EE.

In the inactive cell region LCi, a p-type floating region PF is provided between the trench electrode TG3 and the trench electrode TG4 adjacent to each other. In the inactive cell region LCi, the p-type body region PB is provided between the two trench electrodes TG4, but no p-type floating region PF is provided between the two trench electrodes TG4.

Accordingly, as will be described below with reference to FIGS. 29, 30, and others, gate capacitance can be increased, and a rapid change or oscillation of current flowing in the IGBT at the time of turn-on can be prevented or suppressed.

Also, this manner can enhance an IE effect can be enhanced, and can decrease a switching loss of switching of the IGBT (hereinafter, referred to as "L load switching") caused at the time of turn-on when an inductor having an inductance L is connected as a load to the collector electrode or the emitter electrode of the IGBT.

In the present specification, note that a switching operation in which the state of the IGBT is switched from an off state to an on state is referred to as "turn-on" while a switching operation in which the state of the IGBT is switched from an on state to an off state is referred to as "turn-off."

Also, in the example illustrated in FIG. 2, the width Wh of the hybrid cell region LCh in the X axial direction is shorter than a width Wi of the inactive cell region LCi in the X axial direction. In this case, the IE effect of the IGBT can be enhanced.

The gate wiring extraction region AR2 has a part provided with, for example, a p-type floating region PFp, to surround the cell formation region AR1. This p-type floating region PFp is electrically connected to the emitter electrode EE via a part of a $p^+$-type body contact region PBCp exposed to a bottom surface of a contact trench CT.

The gate wiring GL is arranged in the gate wiring extraction region AR2, and the trench electrode TG1 extends from the inside of the cell formation region AR1 toward this gate wiring GL. In the gate wiring extraction region AR2, ends of the two adjacent trench electrodes TG1 are connected to each other by a trench electrode TGz. The trench electrode TGz is arranged in a region in which the gate wiring GL is arranged when seen in a plan view. The trench electrode TGz is electrically connected to the gate wiring GL via a connection electrode GTG. Note that an end portion of the inactive cell region LCi on the gate wiring extraction region AR2 side is partitioned by an end portion trench electrode TGp.

The two trench electrodes TG3 included in the two respective adjacent hybrid cell regions LCh are arranged on both sides across the inactive cell region LCi positioned between the two hybrid cell regions LCh. Also, the two trench electrodes TG4 are provided between the two trench electrodes TG3. The two trench electrodes TG3 and two trench electrodes TG4 are electrically connected by an emitter connection portion TGx made of, for example, a poly-silicon film in addition to the end portion trench electrode TGp. The emitter connection portion TGx is electrically connected to the emitter electrode EE via a connection electrode CTE. By such a structure, reliability of electric connection between the emitter electrode EE and the two trench electrodes TG3, two trench electrodes TG4, can be improved.

In the hybrid sub-cell region LCh1, a $p^+$-type semiconductor region PR including a $p^+$-type body contact region PBC and a $p^+$-type latch-up prevention region PLP is formed. The $p^+$-type semiconductor region PR is formed continuously along the Y axial direction. Also, in the hybrid sub-cell region LCh1, the contact trench CT serving as an opening portion is formed continuously along the Y axial direction in the p-type body region PB. The contact trench CT reaches the p$^+$-type body contact region PBC arranged in the hybrid sub-cell region LCh1.

Also, in the hybrid sub-cell region LCh2, the p$^+$-type semiconductor region PR including the p$^+$-type body contact region PBC and the p$^+$-type latch-up prevention region PLP is formed. The p$^+$-type semiconductor region PR is formed continuously along the Y axial direction. Also, in the hybrid sub-cell region LCh2, the contact trench CT serving as an opening portion is formed continuously along the Y axial direction in the p-type body region PB. The contact trench CT reaches the p$^+$-type body contact region PBC arranged in the hybrid sub-cell region LCh2.

Next, configurations of the two element portions PR1 and the interposition portion PR2 in the semiconductor device according to the first embodiment will be described, the two element portions PR1 being provided in the two adjacent hybrid cell regions LCh, respectively, and the interposition portion PR2 being provided in the inactive cell region LCi located between the two hybrid cell regions LCh and being interposed between the two element portions PR1. Specifically, a cross-sectional structure taken along a line A-A in FIGS. 2 and 3 will be described with reference to FIG. 4.

As illustrated in FIG. 4, the semiconductor substrate SS includes the upper surface Sa serving as a first main surface and the lower surface Sb serving as a second main surface on the opposite side of the upper surface Sa. An n-type semiconductor layer SLn is formed inside the semiconductor substrate SS, and a semiconductor layer SLp is formed inside a part of the semiconductor substrate SS located on the lower surface Sb side with reference to the semiconductor layer SLn.

An n$^-$-type drift region ND serving as an n-type semiconductor region is formed in a part of the semiconductor layer SLn except for an upper layer portion thereof. Between the semiconductor layer SLn and the semiconductor layer SLp, an n-type field stop region Ns serving as an n-type semiconductor region is formed. Also, a p$^+$-type collector region CL serving as a p-type semiconductor region is formed of the semiconductor layer SLp. Also, on the lower surface Sb of the semiconductor substrate SS, a collector electrode CE electrically connected to the p$^+$-type collector region CL, that is, the semiconductor layer SLp, is formed. On the other hand, the p-type body region PB is provided on the upper surface Sa side of the semiconductor substrate SS, that is, in the upper layer portion of the semiconductor layer SLn.

In the upper surface Sa of the semiconductor substrate SS, the element portion PR1 is formed in the semiconductor layer SLn in each of the two hybrid cell regions LCh arranged to be spaced from each other in the X axial direction when seen in a plan view. In the upper surface Sa of the semiconductor substrate SS, the interposition portion PR2 is formed in the inactive cell region LCi located between the two hybrid cell regions LCh when seen in a plan view, the interposition portion PR2 being interposed between the two element portions PR1 formed in the two hybrid cell regions LCh, respectively. The gate electrode GE is electrically connected to the two element portions PR1, and the emitter electrode EE is electrically connected to the two element portions PR1.

Each of the two element portions PR1 formed in each of the two hybrid cell regions LCh arranged to be spaced from each other in the X axial direction includes trenches T1, T2, and T3, the trench electrodes TG1, TG2, and TG3, the two p-type body regions PB, and the plurality of n$^+$-type emitter regions NE.

As described above, each of the two hybrid cell regions LCh includes the hybrid sub-cell region LCh1 and the hybrid sub-cell region LCh2.

The trench T1 serving as a trench portion is formed on the upper surface Sa side of the semiconductor substrate SS in a boundary portion between the hybrid sub-cell region LCh1 and the hybrid sub-cell region LCh2. The trench T1 reaches the middle of the semiconductor layer SLn from the upper surface Sa, and extends in the Y axial direction when seen in a plan view.

On an inner wall of the trench T1, a gate insulating film GI is formed. In the trench T1, the trench electrode TG1 is formed on the gate insulating film GI to fill the trench T1. That is, the trench electrode TG1 included in each of the two element portions PR1 is buried inside the trench T1 via the gate insulating film GI. The trench electrode TG1 is electrically connected to the gate electrode GE (see FIG. 1). Note that the trench electrode TG1 is formed continuously along the Y axial direction when seen in a plan view.

In the hybrid sub-cell regions LCh1, the trench T2 serving as a trench portion is formed on the upper surface Sa side of the semiconductor substrate SS. The trench T2 reaches the middle of the semiconductor layer SLn from the upper surface Sa, extends in the Y axial direction when seen in a plan view, and is arranged on an opposite side of the inactive cell region LCi side located between the two hybrid cell regions LCh with reference to the trench T1.

On an inner wall of the trench T2, a gate insulating film GI is formed. In the trench T2, the trench electrode TG2 is formed on the gate insulating film GI to fill the trench T2. That is, the trench electrode TG2 is buried inside the trench T2 via the gate insulating film GI. The trench electrode TG2 is electrically connected to the emitter electrode EE. That is, the trench electrode TG2 included in each of the two element portions PR1 is electrically connected to the emitter electrode EE. Note that the trench electrode TG2 is formed continuously along the Y axial direction when seen in a plan view.

In the hybrid sub-cell regions LCh2, the trench T3 serving as a trench portion is formed on the upper surface Sa side of the semiconductor substrate SS. The trench T3 reaches the middle of the semiconductor layer SLn from the upper surface Sa, extends in the Y axial direction when seen in a plan view, and is arranged on the inactive cell region LCi side located between the two hybrid cell regions LCh with reference to the trench T1.

On an inner wall of the trench T3, a gate insulating film GI is formed. In the trench T3, the trench electrode TG3 is formed on the gate insulating film GI to fill the trench T3. That is, the trench electrode TG3 is buried inside the trench T3 via the gate insulating film GI. The trench electrode TG3 is electrically connected to the emitter electrode EE. That is, the trench electrode TG3 included in each of the two element portions PR1 is electrically connected to the emitter electrode EE. Note that the trench electrode TG3 is formed continuously along the Y axial direction when seen in a plan view.

In the hybrid sub-cell region LCh1, the p-type body region PB is formed in a part of the semiconductor layer SLn on the upper surface Sa side, the part being located between the trench T1 and the trench T2, and contacts the gate insulating film GI formed on the inner wall of the trench T1 and the gate insulating film GI formed on the inner wall of the trench T2. Also, in the hybrid sub-cell region LCh2, the p-type body region PB is formed in a part of the semiconductor layer SLn on the upper surface Sa side, the part being located between the trench T1 and the trench T3, and contacts the gate insulating film GI formed on the inner wall of the trench T1 and the gate insulating film GI formed on the inner wall of the trench T3.

As illustrated in FIG. 4, in each of the hybrid sub-cell regions LCh1 and LCh2 on a cross section taken along a line A-A in FIGS. 2 and 3, the plurality of $n^+$-type emitter regions NE are formed only on the trench electrode TG1 side on the upper surface Sa side of the semiconductor substrate SS.

As described above, in the hybrid sub-cell region LCh1, the plurality of $n^+$-type emitter regions NE are arranged to be spaced from each other along the Y axial direction when seen in a plan view. In the hybrid sub-cell region LCh2, the plurality of $n^+$-type emitter regions NE are arranged to be spaced from each other along the Y axial direction when seen in a plan view.

In the hybrid sub-cell region LCh1, each of the plurality of $n^+$-type emitter regions NE is formed in a part of the semiconductor layer SLn on the upper surface Sa side, the part being located between the trench T1 and the trench T2, and contacts the p-type body region PB and the gate insulating film GI formed on the inner wall of the trench T1. Also, in the hybrid sub-cell region LCh2, each of the plurality of $n^+$-type emitter regions NE is formed in a part of the semiconductor layer SLn on the upper surface Sa side, the part being located between the trench T1 and the trench T3, and contacts the p-type body region PB and the gate insulating film GI formed on the inner wall of the trench T1.

The plurality of $n^+$-type emitter regions NE formed in the hybrid sub-cell region LCh1 are electrically connected to the emitter electrode EE, and the plurality of $n^+$-type emitter regions NE formed in the hybrid sub-cell region LCh2 are electrically connected to the emitter electrode EE. That is, the plurality of $n^+$-type emitter regions NE each included in the two element portions PR1 are electrically connected to the emitter electrode EE.

Preferably, in the hybrid sub-cell region LCh1, an n-type hole barrier region NHB serving as an n-type semiconductor region is formed in a part of the semiconductor layer SLn, the part being located between the trench T1 and the trench T2 and being located on the lower surface Sb side with reference to the p-type body region PB. Also, in the hybrid sub-cell region LCh2, the n-type hole barrier region NHB serving as an n-type semiconductor region is formed in a part of the semiconductor layer SLn, the part being located between the trench T1 and the trench T3 and being located on the lower surface Sb side with reference to the p-type body region PB. That is, each of the two element portions PR1 includes the two n-type hole barrier regions NHB.

In the hybrid sub-cell region LCh1, the n-type impurity concentration in the n-type hole barrier region NHB is higher than the n-type impurity concentration in a part ($n^-$-type drift region ND) of the semiconductor layer SLn, the part being located on the lower surface Sb side with reference to the n-type hole barrier region NHB. Also, in the hybrid sub-cell region LCh2, the n-type impurity concentration in the n-type hole barrier region NHB is higher than the n-type impurity concentration in a part ($n^-$-type drift region ND) of the semiconductor layer SLn, the part being located on the lower surface Sb side with reference to the n-type hole barrier region NHB.

On the other hand, in the hybrid sub-cell region LCh1, the n-type impurity concentration in the n-type hole barrier region NHB is lower than the n-type impurity concentration in the $n^+$-type emitter region NE. Also, in the hybrid sub-cell region LCh2, the n-type impurity concentration in the n-type hole barrier region NHB is lower than the n-type impurity concentration in the $n^+$-type emitter region NE.

In the hybrid sub-cell region LCh1, note that the n-type hole barrier region NHB may contact the p-type body region PB, the gate insulating film GI formed on the inner wall of the trench T1, and the gate insulating film GI formed on the inner wall of the trench T2. Also, in the hybrid sub-cell region LCh2, the n-type hole barrier region NHB may contact the p-type body region PB, the gate insulating film GI formed on the inner wall of the trench T1, and the gate insulating film GI formed on the inner wall of the trench T3. This manner makes difficult to discharge the holes accumulated in the $n^-$-type drift region ND to the emitter electrode EE in the hybrid sub-cell regions LCh1 and LCh2, and therefore, the IE effect can be enhanced.

The interposition portion PR2 formed in the inactive cell region LCi and interposed between the two adjacent element portions PR1 includes two trenches T4, the two trench electrodes TG4, a p-type body region PB1 serving as the p-type body region PB, and two p-type floating regions PF1 serving as the p-type floating regions PF.

The two trenches T4 serving as trench portions are formed on the upper surface Sa side of the semiconductor substrate SS in the inactive cell region LCi. The two trenches T4 reach the middle of the semiconductor layer SLn from the upper surface Sa of the semiconductor substrate SS, extends in the Y axial direction when seen in a plan view, and are arranged to be spaced from each other in the X axial direction.

On each of inner walls of the two trenches T4, the gate insulating film GI is formed. In each of the two trenches T4, the trench electrode TG4 is formed on the gate insulating film GI to fill the trench T4. That is, each of the two trench electrodes TG4 is buried in each of the trenches T4 via the gate insulating film GI. The two trench electrodes TG4 are electrically connected to the emitter electrode EE. That is, the two trench electrodes TG4 included in the interposition portion PR2 are electrically connected to the emitter electrode EE. Note that each of the two trench electrodes TG4 is formed continuously along the Y axial direction when seen in a plan view.

In the inactive cell region LCi, the p-type body region PB is formed in a part of the semiconductor layer SLn on the upper surface Sa side, the part being located between the trench T3 and the trench T4 adjacent to each other. The p-type body region PB contacts the gate insulating film GI formed on the inner wall of the trench T3 and the gate insulating film GI formed on the inner wall of the trench T4 adjacent to the trench T3.

In the inactive cell region LCi, the p-type floating region PF1 serving as the p-type floating region PF which is a p-type semiconductor region is formed in a part of the semiconductor layer SLn, the part being located between the trench T3 and the trench T4 adjacent to each other and being located below the p-type body region PB.

Here, an object for providing the p-type floating region PF will be described.

A saturation voltage of a voltage VCE in a forward direction serving as a voltage between the collector and the emitter is referred to as voltage VCE (sat). At this time, in order to decrease the voltage VCE (sat), it is required to enhance the IE effect. On the other hand, when a load is short-circuited by an error operation or others in an inverter described below with reference to FIG. 46, a large voltage is applied to the IGBT, or a large short-circuit current flows in the IGBT. Therefore, the IGBT is required not to be broken until a protection circuit blocks. Here, when the short-circuit current flows in the IGBT because of the short-circuited state of the load, a period of time taken when the IGBT can be endured without being broken is called short circuit capacity.

In order to improve the short circuit capacity, it is required to decrease energy to be applied to the IGBT, that is, decrease the saturation current flowing in the IGBT. In order to decrease the saturation current, it is required to decrease an area of the $n^+$-type emitter region NE. And, in order to decrease the area of the $n^+$-type emitter region NE, two methods are considered.

A first method is to eliminate some of the $n^+$-type emitter regions NE in the Y axial direction. However, this method increases the voltage VCE (sat).

A second method is a method in the present first embodiment, and is a method of eliminating some of the $n^+$-type emitter regions NE in the X axial direction by providing the p-type floating region PF in the inactive cell region LCi. In this manner, a discharge path for the holes which are the carriers is narrowed, so that the IE effect is enhanced. That is, the p-type floating region PF is for improving the short circuit capacity by eliminating some of the $n^+$-type emitter regions NE in the X axial direction.

Also, in the inactive cell region LCi, the p-type body region PB1 serving as the p-type body region PB is provided in a part of the semiconductor layer SLn on the upper surface Sa side, the part being located between the two trenches T4. However, in the inactive cell region LCi, the p-type floating region PF is not formed in a part of the semiconductor layer SLn, the part being located between the two trenches T4 and being located below the p-type body region PB.

That is, the interposition portion PR2 provided in the inactive cell region LCi includes the p-type body region PB1 formed in the part of the semiconductor layer SLn, the part being located between the two trenches T4. In the inactive cell region LCi, the interposition portion PR2 also includes the two p-type floating regions PF1 formed in two parts of the semiconductor layer SLn, the parts being located on both sides of the p-type body region PB1 in the X axial direction via the two respective trenches T4.

Each of two parts of the inactive cell region LCi is referred to as a part LCi1, the part being located between the adjacent trench T3 and trench T4. Also, a part of the inactive cell region LCi is referred to as a part LCi2, the part being located between the two trenches T4.

At this time, in the inactive cell region LCi, an end portion (lower end), on the lower surface Sb side, of each of the two p-type floating regions PF1 formed in the two respective parts LCi1 is arranged on the lower surface Sb side (lower side) in the Z axial direction with reference to an end portion (lower end), on the lower surface Sb side, of the p-type body region PB1 formed in the part LCi2. In other words, the lower end of each of the two p-type floating regions PF1 is arranged to be lower in the Z axial direction than the lower end of the p-type body region PB1. In the inactive cell region LCi, an $n^-$-type drift region ND is formed in a part of the semiconductor layer SLn, the part being located between the two trenches T4 and being located below the p-type body region PB1.

That is, in the present first embodiment, in the inactive cell region LCi located between the two adjacent hybrid cell regions LCh, the p-type floating region PF is divided into two by the two trenches T4.

Accordingly, as described below with reference to FIGS. 29, 30 and others, the gate capacitance can be increased, and the rapid change or oscillation of current flowing in the IGBT at the time of turn-on can be prevented or suppressed.

Also, the IE effect can be enhanced, and the switching loss at the time of turn-on of the load L switching can be decreased.

Preferably, in each of the two parts LCi1 in the inactive cell region LCi, the end portion of the p-type floating region PF1 on the lower surface Sb side is arranged on the lower surface Sb side in the Z axial direction with reference to an end portion of the trench T3 on the lower surface Sb side. That is, the end portion of the p-type floating region PF1 on the lower surface Sb side is arranged on the lower surface Sb side in the Z axial direction with reference to the end portion of the trench T3 on the lower surface Sb side, the trench T3 being adjacent to the trench T4 via the p-type floating region PF1. In other words, in a set of the trench T3 and the p-type floating region PF1 adjacent to each other, the end portion of the p-type floating region PF on the lower surface Sb side is arranged on the lower surface Sb side in the Z axial direction with reference to the end portion of the trench T3 on the lower surface Sb side. Accordingly, an electric field can be prevented or suppressed from focusing on a part of the semiconductor layer SLn, the part being located in vicinity of the end portion of the trench T3 on the lower surface Sb side, and a breakdown voltage of the IGBT can be improved.

In each of the two parts LCi1 in the inactive cell region LCi, the p-type floating region PF may contact the gate insulating film GI formed on the inner wall of the trench T3. Also, in each of the two parts LCi1 in the inactive cell region LCi, the p-type floating region PF may contact the gate insulating film GI formed on the inner wall of the trench T4.

As illustrated in FIG. 4, in the hybrid cell regions LCh and the inactive cell regions LCi, the interlayer insulating film IL, made of, for example, silicon oxide, is formed on the upper surface Sa of the semiconductor substrate SS. In each of the hybrid sub-cell regions LCh1 and LCh2 and the inactive cell regions LCi, the interlayer insulating film IL is formed to cover the p-type body region PB. Note that an insulating film IF may be formed between the upper surface Sa of the semiconductor substrate SS and the interlayer insulating film IL.

In each of the hybrid sub-cell regions LCh1 and LCh2 in the present first embodiment, the interlayer insulating film IL and the semiconductor layer SLn have the contact trench CT formed as an opening portion which penetrates the interlayer insulating film IL and which reaches the middle of the semiconductor layer SLn. In each of the hybrid sub-cell regions LCh1 and LCh2, the contact trench CT is formed continuously along the Y axial direction when seen in a plan view.

In each of the hybrid sub-cell regions LCh1 and LCh2, the $p^+$-type body contact region PBC serving as a p-type semiconductor region is formed in a part of the p-type body region PB, the part being exposed to a bottom surface of the contact trench CT. Also, below the $p^+$-type body contact region PBC, the $p^+$-type latch-up prevention region PLP serving as a p-type semiconductor region is formed. The $p^+$-type semiconductor region PR is formed of the $p^+$-type body contact region PBC and the $p^+$-type latch-up prevention region PLP.

That is, in each of the hybrid sub-cell regions LCh1 and LCh2, the $p^+$-type semiconductor region PR includes the $p^+$-type body contact region PBC and the $p^+$-type latch-up prevention region PLP. In each of the hybrid sub-cell regions LCh1 and LCh2, the p-type impurity concentration in the $p^+$-type body contact region PBC is higher than the p-type impurity concentration in the $p^+$-type latch-up prevention region PLP. Also, in each of the hybrid sub-cell regions LCh1 and LCh2, the p-type impurity concentration in the p+-type latch-up prevention region PLP is higher than the p-type impurity concentration in the p-type body region. That is, in each of the hybrid sub-cell regions LCh1 and LCh2, the p-type impurity concentration in the p+-type semiconductor region PR is higher than the p-type impurity concentration in the p-type body region.

In each of the hybrid sub-cell regions LCh1 and LCh2, the p+-type semiconductor region PR is formed in a part of the p-type body region PB, the part being exposed to the contact trench CT. In the hybrid sub-cell region LCh1, the p+-type semiconductor region PR is formed in a part of the semiconductor layer SLn, the part being located between the trench T1 and the trench T2. Also, in the hybrid sub-cell region LCh2, the p+-type semiconductor region PR is formed in a part of the semiconductor layer SLn, the part being located between the trench T1 and the trench T3.

In the hybrid sub-cell region LCh1, a connection electrode CP buried in the contact trench CT is formed. Also, in the hybrid sub-cell region LCh2, the connection electrode CP buried in the contact trench CT is formed. That is, each of the two element portions PR1 includes the interlayer insulating film IL, the two contact trenches CT, the two p+-type semiconductor regions PR, and the two connection electrodes CP.

In each of the hybrid sub-cell regions LCh1 and LCh2, the connection electrode CP contacts the n+-type emitter region NE and the p+-type semiconductor region PR. Thus, in each of the hybrid sub-cell regions LCh1 and LCh2, the n+-type emitter region NE and the p+-type semiconductor region PR are electrically connected to the emitter electrode EE via the connection electrode CP. That is, the p-type body region PB included in each of the two element portions PR1 is electrically connected to the emitter electrode EE.

In a set of the connection electrode CP and the p+-type semiconductor region PR connected to each other in each of the hybrid sub-cell regions LCh1 and LCh2, the connection electrode CP contacts the p+-type body contact region PBC included in the p+-type semiconductor region PR. Accordingly, a contact resistance between the connection electrode CP and the p+-type semiconductor region PR can be decreased.

As illustrated in FIG. 4, the emitter electrode EE formed of a metal film mainly containing, for example, aluminum as a main component is provided on the interlayer insulating film IL, and the emitter electrode EE is connected to the n+-type emitter region NE and the p+-type body contact region PBC via the connection electrode CP formed in the contact trench CT. In the example illustrated in FIG. 4, the connection electrode CP and the emitter electrode EE are formed integrally. On the emitter electrode EE, the insulating film FPF serving as a passivation film made of, for example, a polyimide-based organic insulating film or others is further formed.

In the hybrid cell region LCh, the IGBT is formed of the collector electrode CE, the p+-type collector region CL, the n−-type drift region ND, the p-type body region PB, the p+-type semiconductor region PR, the n+-type emitter region NE, the trench electrode TG1, and the gate insulating film GI formed on the inner wall of the trench T1.

<Method of Manufacturing Semiconductor Device>

Next, a method of manufacturing the semiconductor device according to the first embodiment will be described. Each of FIGS. 5 to 20 is a cross-sectional view of a principal part illustrating a step of manufacturing the semiconductor device according to the first embodiment. Each of FIGS. 5 to 20 is a cross-sectional view taken along a line A-A in FIG. 3 as similar to FIG. 4.

Hereinafter, the cell formation region AR1 (see FIG. 2) will be mainly described, and the gate wiring extraction region AR2 (see FIG. 2) will be described with reference to FIG. 2 as needed. Also, hereinafter, description will be made about a case in which the two element portions PR1 are provided in the two adjacent hybrid cell regions LCh, respectively, and in which the interposition portion PR2 interposed between the two element portions PR1 is formed in the inactive cell region LCi located between the two hybrid cell regions LCh.

Note that each of the two adjacent hybrid cell regions LCh includes the hybrid sub-cell regions LCh1 and LCh2. Also, the inactive cell region LCi located between the two hybrid cell regions LCh includes two parts LCi1 each located between the trench T3 (see FIG. 9) and the trench T4 (see FIG. 9) adjacent to each other and one part LCi2 located between the two trenches T4.

Figure 5:
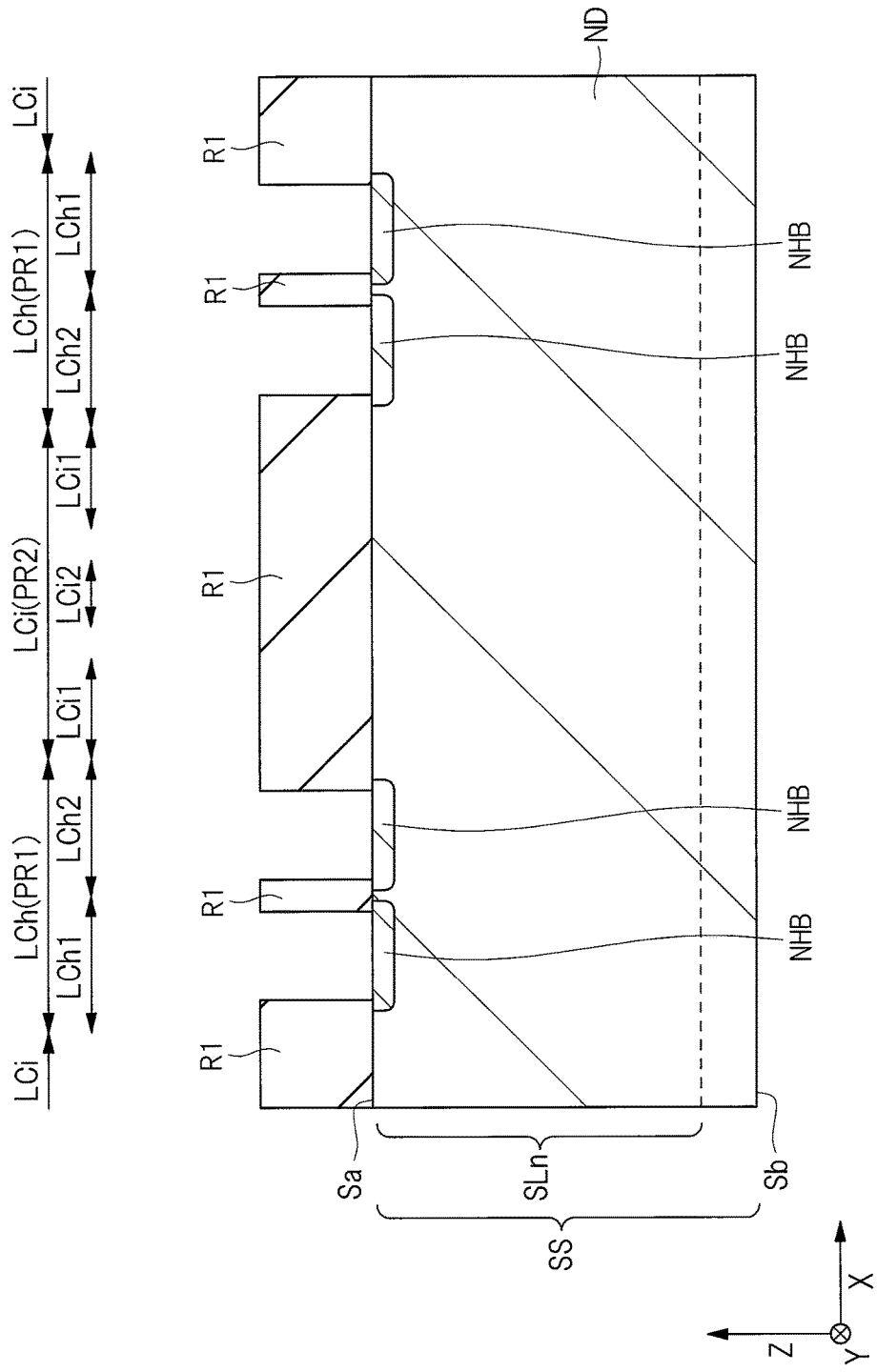
FIG. 5 is a cross-sectional view of a principal part illustrating a step of manufacturing the semiconductor device according to the first embodiment.

First, as illustrated in FIG. 5, the semiconductor substrate SS made of a silicon single crystal into which an n-type impurity such as phosphorus (P) has been doped is prepared. The semiconductor substrate SS includes the upper surface Sa serving as a first main surface and the lower surface Sb serving as a second main surface on the opposite side of the upper surface Sa.

The impurity concentration of the n-type impurity in the semiconductor substrate SS can be set to, for example, about $2 \times 10^{14}$ cm$^{-3}$. The semiconductor substrate SS is a flattened substantially circular semiconductor thin plate called a wafer at this stage. A thickness of the semiconductor substrate SS can be set to, for example, about 450 μm to 1000 μm.

Note that a semiconductor layer of the semiconductor substrate SS is set to the semiconductor layer SLn, the semiconductor layer being on the upper surface Sa side with reference to a semiconductor layer provided with the n-type field stop region Ns (see FIG. 4). The semiconductor layer SLn is an n-type semiconductor layer. Therefore, when the semiconductor substrate SS is prepared, the n-type semiconductor layer SLn is formed inside the semiconductor substrate SS.

Next, a resist film R1 for introducing the n-type hole barrier region is formed on the entire upper surface Sa of the semiconductor substrate SS by coating or others, and is patterned by normal lithography. While using the patterned resist film R1 as a mask, an n-type impurity is doped into the upper surface Sa of the semiconductor substrate SS by, for example, ion implantation, so that the n-type hole barrier region NHB is formed. As for the ion implantation conditions at this time, ion implantation conditions in which an ion species is phosphorus (P), in which the dose amount is about $6 \times 10^{12}$ cm$^{-2}$, and in which implantation energy is about 80 keV can be exemplified as preferable conditions. Then, an unnecessary resist film R1 is removed by ashing or others.

Note that the n-type hole barrier region NHB is formed in each of the hybrid sub-cell regions LCh1 and LCh2 included in each of the two adjacent hybrid cell regions LCh.

Figure 6:
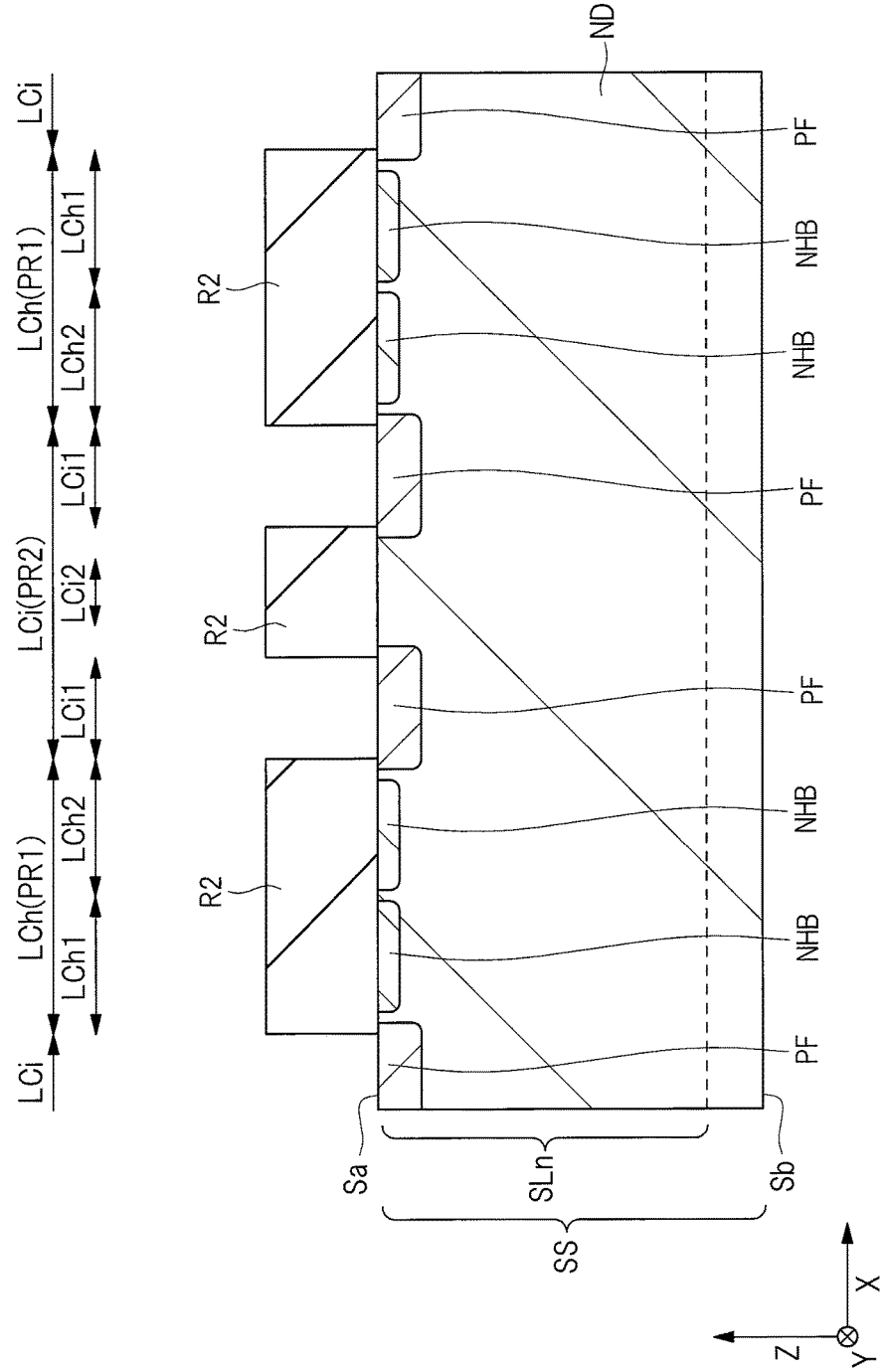
FIG. 6 is a cross-sectional view of a principal part illustrating a step of manufacturing the semiconductor device according to the first embodiment.

Next, as illustrated in FIG. 6, a resist film R2 for introducing the p-type floating region is formed on the upper surface Sa of the semiconductor substrate SS by coating or others, and is patterned by normal lithography. While using the patterned resist film R2 as a mask, a p-type impurity is doped into the upper surface Sa of the semiconductor substrate SS by, for example, ion implantation, so that the p-type floating region PF is formed. As for the ion implantation conditions at this time, ion implantation conditions in which an ion species is boron (B), in which the dose amount is about $3.5 \times 10^{13}$ cm$^{-2}$, and in which implantation energy is about 75 keV can be exemplified as preferable conditions. Then, an unnecessary resist film R2 is removed by ashing or others.

Note that the p-type floating region PF is formed in each of the two parts LCi1 included in the inactive cell region LCi. Also, when the p-type floating region PF is formed in the cell formation region AR1 (see FIG. 2), the p-type floating region PFp is formed in, for example, the gate wiring extraction region AR2 (see FIG. 2).

Figure 7:
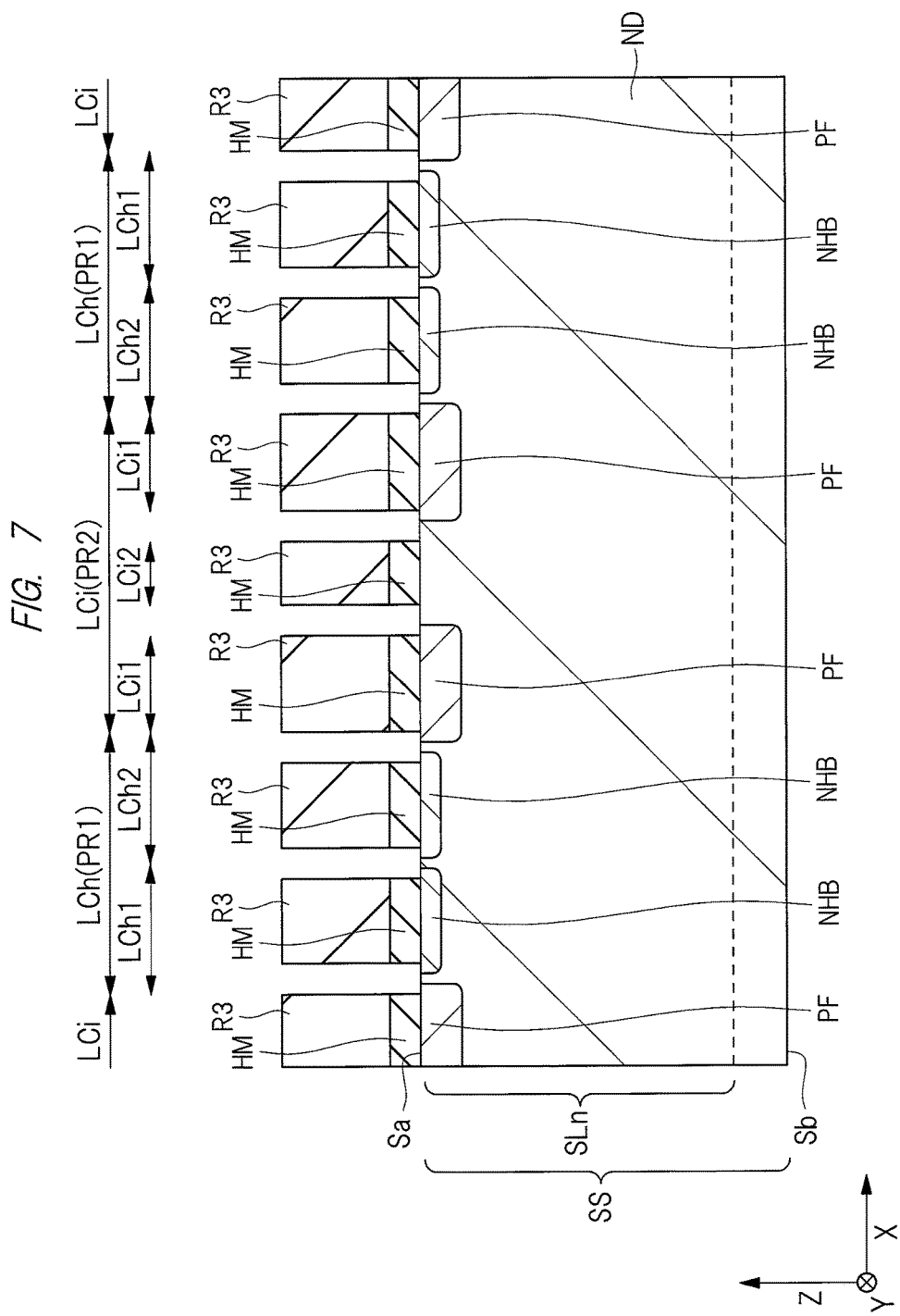
FIG. 7 is a cross-sectional view of a principal part illustrating a step of manufacturing the semiconductor device according to the first embodiment.

Next, as illustrated in FIG. 7, a hard mask film HM made of, for example, silicon oxide, is formed on the upper surface Sa of the semiconductor substrate SS by, for example, a CVD (chemical vapor deposition) method or others. A thickness of the hard mask film HM is, for example, about 450 nm.

Next, as illustrated in FIG. 7, a resist film R3 for processing the hard mask film is formed on the upper surface Sa of the semiconductor substrate SS by coating or others, and is patterned by normal lithography. While using the patterned resist film R3 as a mask, the hard mask film HM is patterned by, for example, dry etching.

Figure 8:
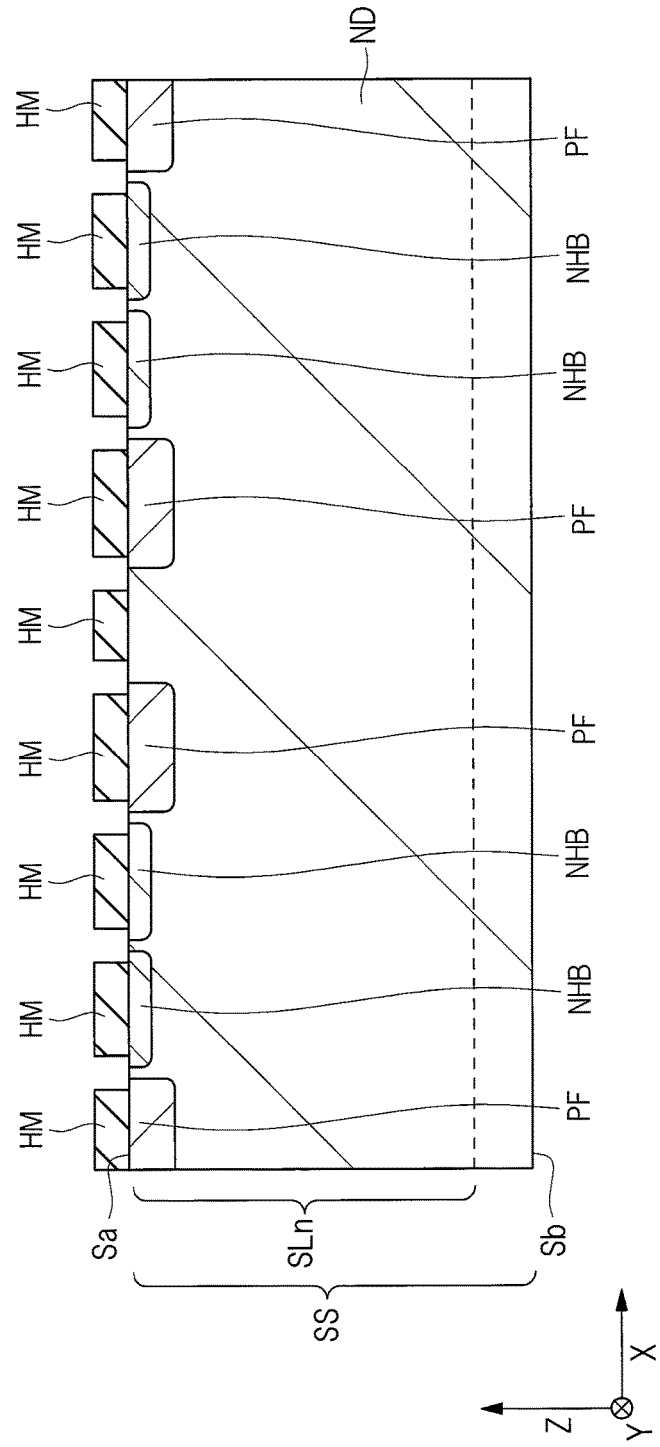
FIG. 8 is a cross-sectional view of a principal part illustrating a step of manufacturing the semiconductor device according to the first embodiment.

Then, as illustrated in FIG. 8, the unnecessary resist film R3 is removed by ashing or others.

Figure 9:
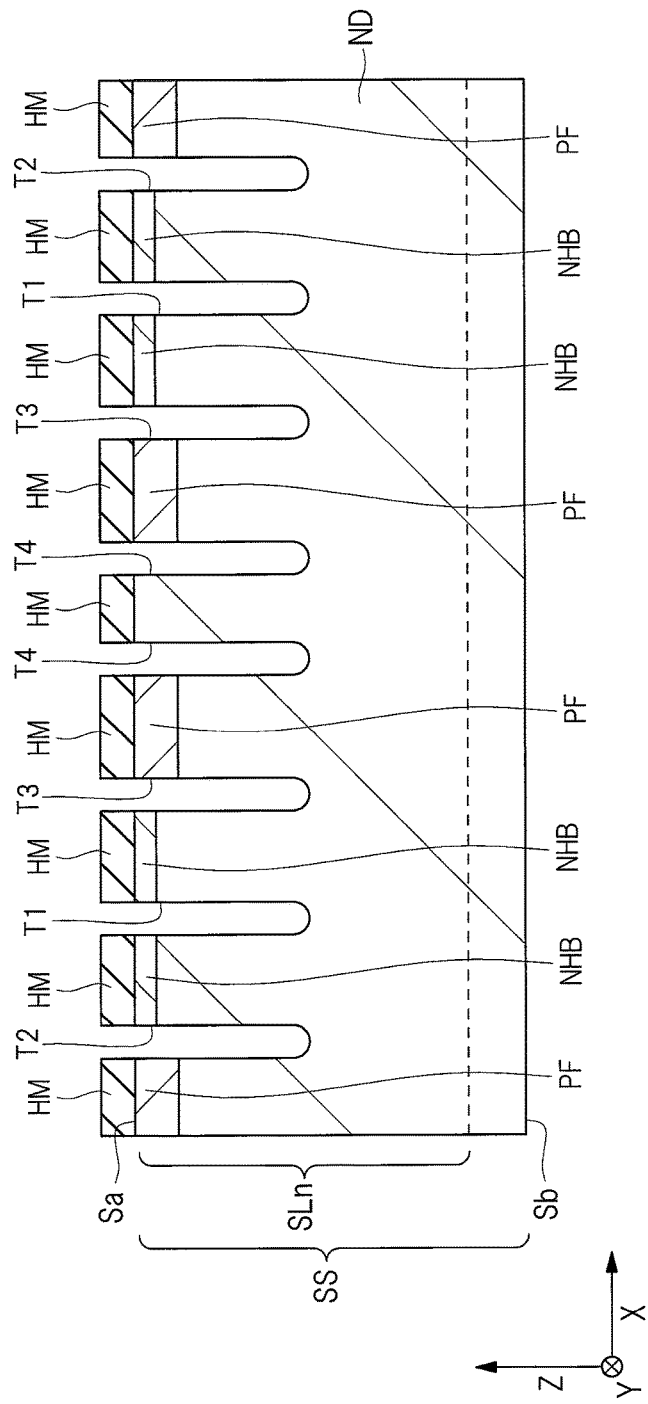
FIG. 9 is a cross-sectional view of a principal part illustrating a step of manufacturing the semiconductor device according to the first embodiment.

Next, as illustrated in FIG. 9, the trenches T1, T2, T3, and T4 are formed by, for example, anisotropic dry etching while using the patterned hard mask film HM. As for gas for this anisotropic dry etching, for example, $Cl_2/O_2$-based gas can be exemplified as a preferable gas.

At this time, in each of the two adjacent hybrid cell regions LCh, the trench T1 which reaches the middle of the semiconductor layer SLn from the upper surface Sa of the semiconductor substrate SS and which extends in the Y axial direction when seen in a plan view is formed. Also, in each of the two hybrid cell regions LCh, the trench T2 which reaches the middle of the semiconductor layer SLn from the upper surface Sa of the semiconductor substrate SS, which extends in the Y axial direction when seen in a plan view, and which is arranged on the side the opposite side of the inactive cell region LCi side located between the two hybrid cell regions LCh with respect to the trench T1 is formed. Also, in each of the two hybrid cell regions LCh, the trench T3 which reaches the middle of the semiconductor layer SLn from the upper surface Sa of the semiconductor substrate SS, which extends in the Y axial direction when seen in a plan view, and which is arranged on the inactive cell region LCi side located between the two hybrid cell regions LCh with respect to the trench T1 is formed.

Meanwhile, in the inactive cell region LCi, the two trenches T4 each of which reaches the middle of the semiconductor layer SLn from the upper surface Sa of the semiconductor substrate SS, each of which extends in the Y axial direction when seen in a plan view, and each of which is arranged to be spaced from each other in the X axial direction are formed.

Figure 10:
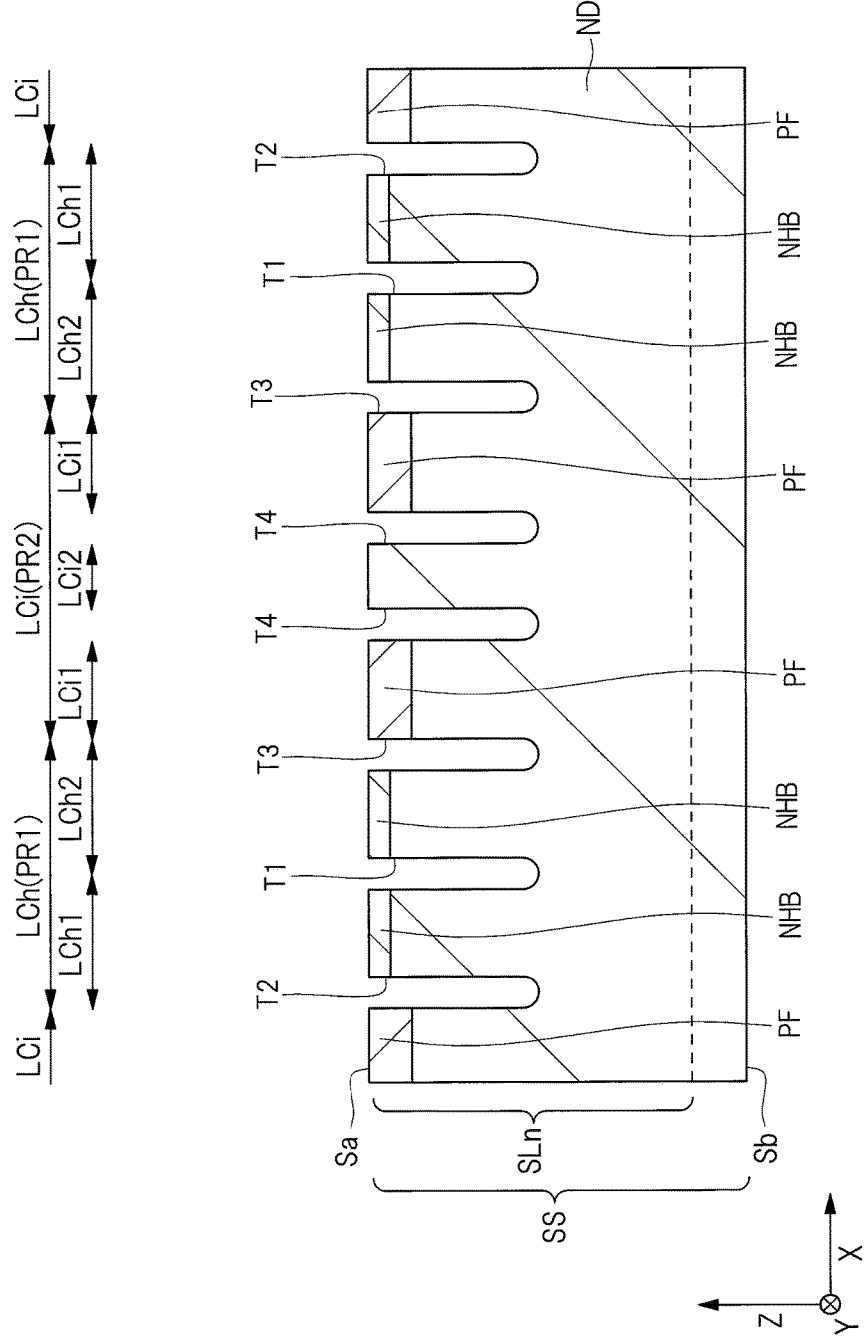
FIG. 10 is a cross-sectional view of a principal part illustrating a step of manufacturing the semiconductor device according to the first embodiment.

Then, as illustrated in FIG. 10, the unnecessary hard mask film HM is removed by wet etching using, for example, a hydrofluoric-acid-based etchant.

Figure 11:
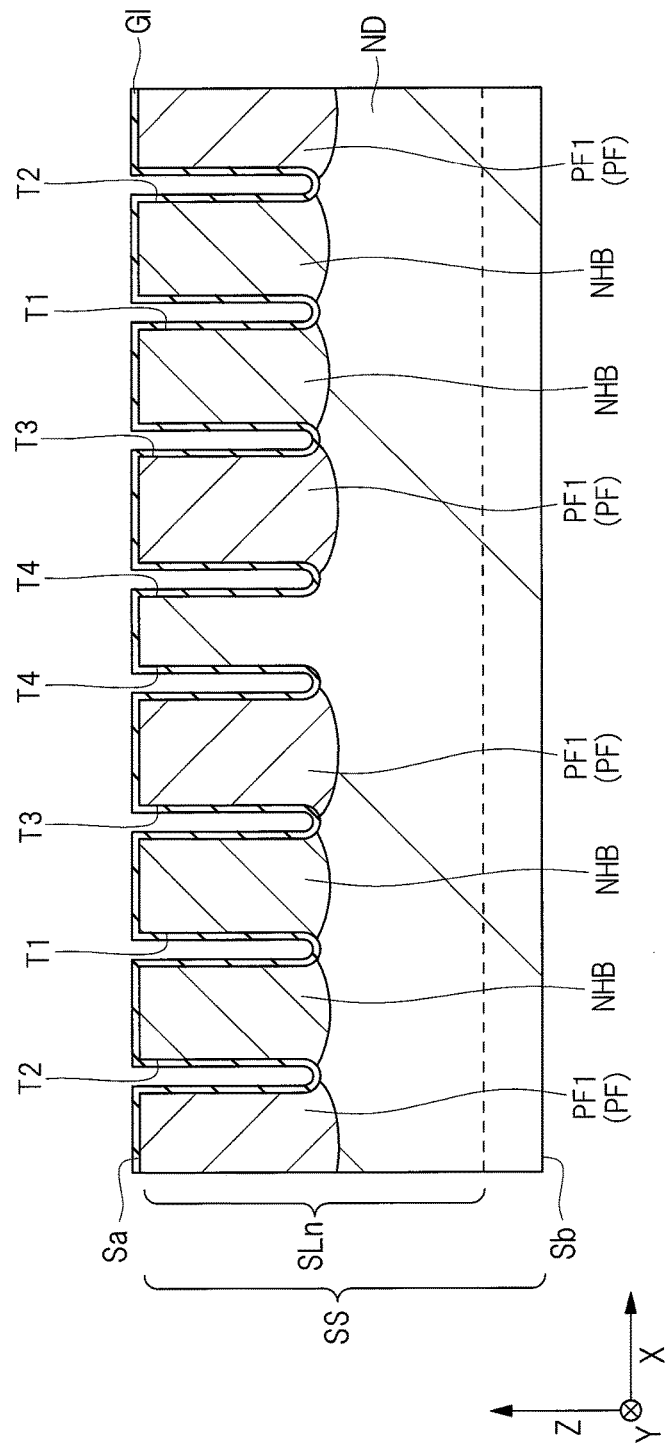
FIG. 11 is a cross-sectional view of a principal part illustrating a step of manufacturing the semiconductor device according to the first embodiment.

Next, as illustrated in FIG. 11, drive-in diffusion (for example, at 1200° C. for about 30 minutes) for the p-type floating regions PF and the n-type hole barrier regions NHB is performed. At this time, the drive-in diffusion is performed so that the end portion of the p-type floating region PF on the lower surface Sb side is arranged on the lower surface Sb side in the Z axial direction with reference to the end portion of the p-type body region PB on the lower surface Sb side, the p-type body region PB being formed in a step described below with reference to FIG. 15.

Preferably, the drive-in diffusion is performed so that the end portion of the p-type floating region PF on the lower surface Sb side is arranged on the lower surface Sb side in the Z axial direction with reference to all of the end portion of the trench T1 on the lower surface Sb side, the end portion of the trench T2 on the lower surface Sb side, the end portion of the trench T3 on the lower surface Sb side, and the end portion of the trench T4 on the lower surface Sb side.

Thus, in each of the two parts LCi1, the p-type floating region PF1 serving as the p-type floating region PF is formed in a part of the semiconductor layer SLn, the part being located between the trench T3 and the trench T4 adjacent to each other. On the other hand, the p-type floating region PF is not formed in a part of the semiconductor layer SLn, the part being located between the two trenches T4.

Preferably, the p-type floating region PF1 formed in each of the two parts LCi1 contacts the gate insulating film GI formed on the inner wall of the trench T3.

Also, the n-type hole barrier regions NHB are formed in parts of the semiconductor layer SLn, the parts being located between the trench T1 and the trench T2 and between the trench T1 and the trench T3. Preferably, the n-type hole barrier region NHB formed between the trench T1 and the trench T2 contacts the gate insulating film GI formed on the inner wall of the trench T1 and the gate insulating film GI formed on the inner wall of the trench T2. Also, preferably, the n-type hole barrier region NHB formed between the trench T1 and the trench T3 contacts the gate insulating film GI formed on the inner wall of the trench T1 and the gate insulating film GI formed on the inner wall of the trench T3.

Also, in the drive-in diffusion, a region of the n-type semiconductor substrate SS, the region not having the p-type floating region PF and the n-type hole barrier region NHB, becomes the $n^-$-type drift region ND.

Specifically, in each of the hybrid sub-cell regions LCh1 and LCh2 included in the hybrid cell region LCh, a region of the n-type semiconductor layer SLn, the region not having the p-type floating region PF and the n-type hole barrier region NHB, becomes the $n^-$-type drift region ND.

On the other hand, in the part LCi1 included in the inactive cell region LCi, a region of the n-type semiconductor layer SLn, the region not having the p-type floating region PF, becomes the $n^-$-type drift region ND. Also, in the part LCi2 included in the inactive cell region LCi, the entirety including a part of the semiconductor layer SLn, the part being located between the two trenches T4, becomes the $n^-$-type drift region ND.

In the step illustrated in FIG. 11, note that the $n^-$-type drift region ND is formed in a region from the inside of the semiconductor layer SLn to the lower surface Sb of the semiconductor substrate SS.

In the hybrid sub-cell region LCh1, the n-type impurity concentration in the n-type hole barrier region NHB formed between the trench T1 and the trench T2 is higher than the n-type impurity concentration in a part of the semiconductor layer SLn, the part being located on the lower surface Sb side with reference to the n-type hole barrier region NHB, that is, in the $n^-$-type drift region ND. Also, in the hybrid sub-cell region LCh1, the n-type impurity concentration in the n-type hole barrier region NHB formed between the trench T1 and the trench T2 is lower than the n-type impurity concentration in the $n^+$-type emitter region NE (see FIG. 15 described below).

In the hybrid sub-cell region LCh2, the n-type impurity concentration in the n-type hole barrier region NHB formed between the trench T1 and the trench T3 is higher than the n-type impurity concentration in a part of the semiconductor layer SLn, the part being located on the lower surface Sb side with reference to the n-type hole barrier region NHB, that is, in the n⁻-type drift region ND. Also, in the hybrid sub-cell region LCh2, the n-type impurity concentration in the n-type hole barrier region NHB formed between the trench T1 and the trench T3 is lower than the n-type impurity concentration in the n⁺-type emitter region NE (see FIG. 15 described below).

Next, as illustrated in FIG. 11, the gate insulating film GI made of, for example, silicon oxide is formed on the upper surface Sa of the semiconductor substrate SS and on each inner wall of the trenches T1, T2, T3, and T4 by, for example, a thermal oxidation method or others. A thickness of the gate insulating film GI is, for example, about 0.12 μm.

Figure 12:
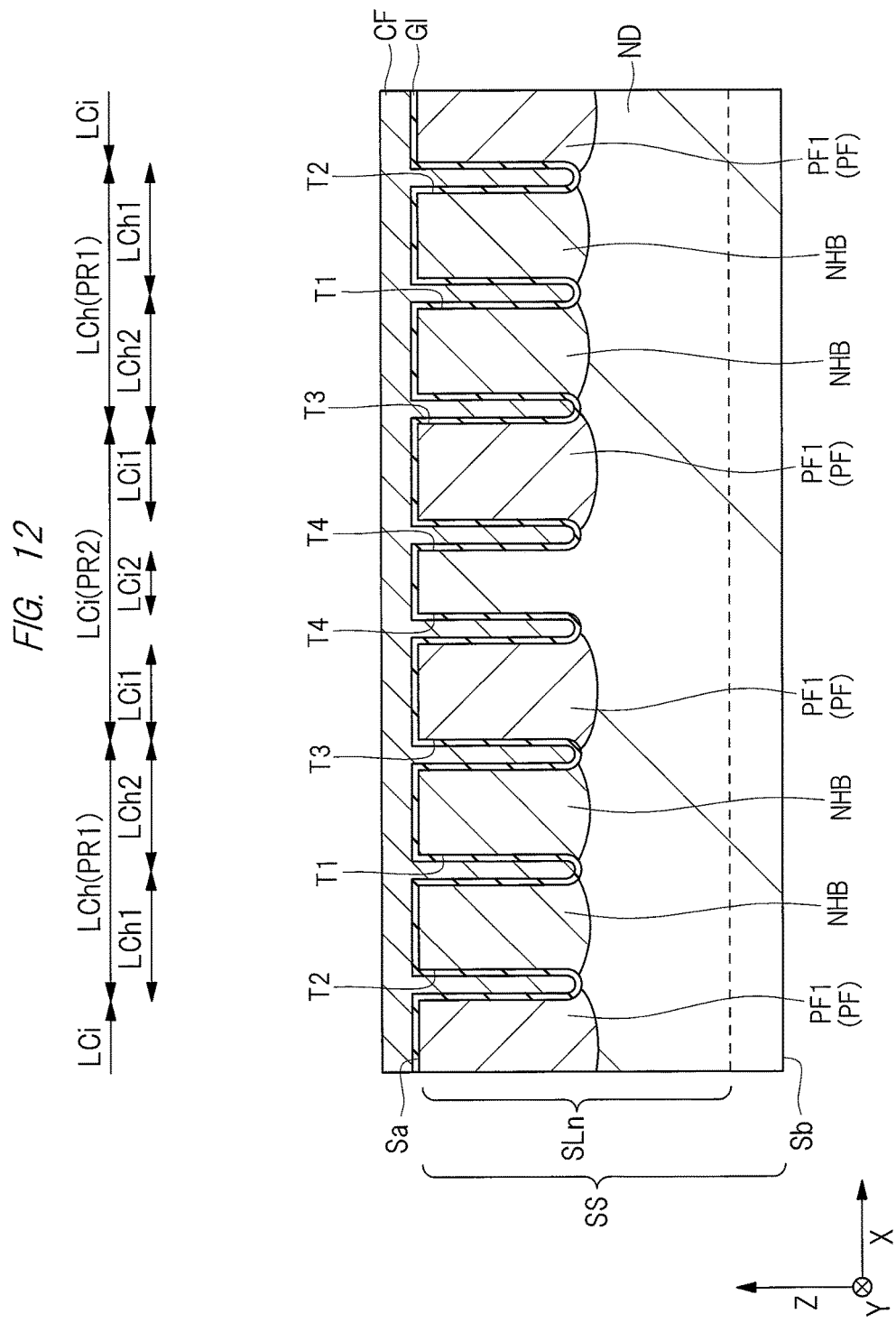
FIG. 12 is a cross-sectional view of a principal part illustrating a step of manufacturing the semiconductor device according to the first embodiment.

Next, as illustrated in FIG. 12, a conductive film CF made of, for example, phosphorus (P)-doped poly-silicon is formed on the upper surface Sa of the semiconductor substrate SS and each inside of the trenches T1, T2, T3, and T4 by, for example, a CVD method or others. A thickness of the conductive film CF is, for example, about 0.6 μm.

Figure 13:
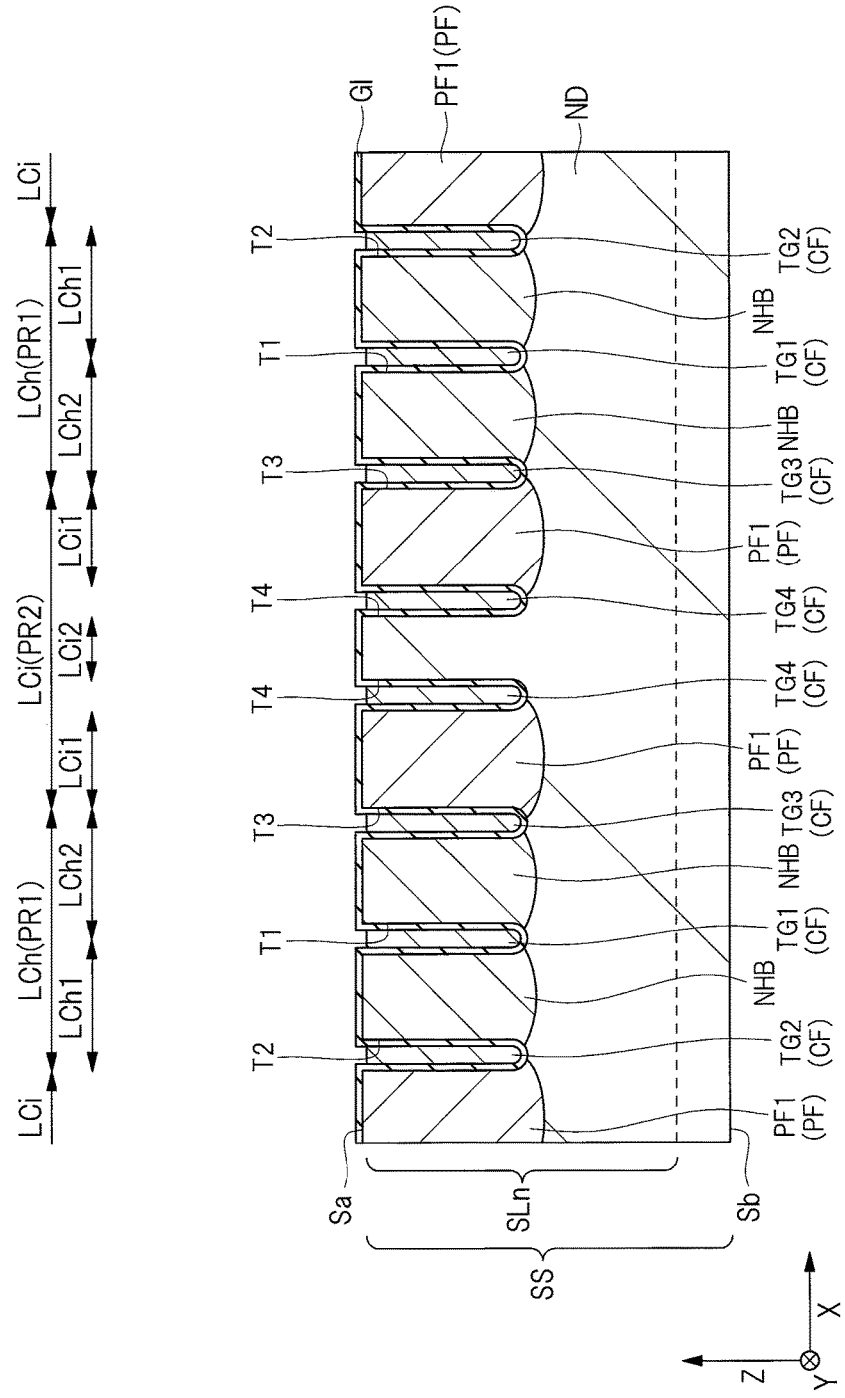
FIG. 13 is a cross-sectional view of a principal part illustrating a step of manufacturing the semiconductor device according to the first embodiment.

Next, as illustrated in FIG. 13, the conductive film CF is etched back by, for example, dry etching or others. Thus, the trench electrode TG1 made of the conductive film CF buried inside the trench T1 via the gate insulating film GI is formed. Also, the trench electrode TG2 made of the conductive film CF buried inside the trench T2 via the gate insulating film GI is formed, and the trench electrode TG3 made of the conductive film CF buried inside the trench T3 via the gate insulating film GI is formed. Also, the two trench electrodes TG4 made of the conductive films CF buried inside the two respective trenches T4 via the gate insulating film GI are formed. As for gas for this etching, for example, SF₆ gas can be exemplified as a preferable gas.

Figure 14:
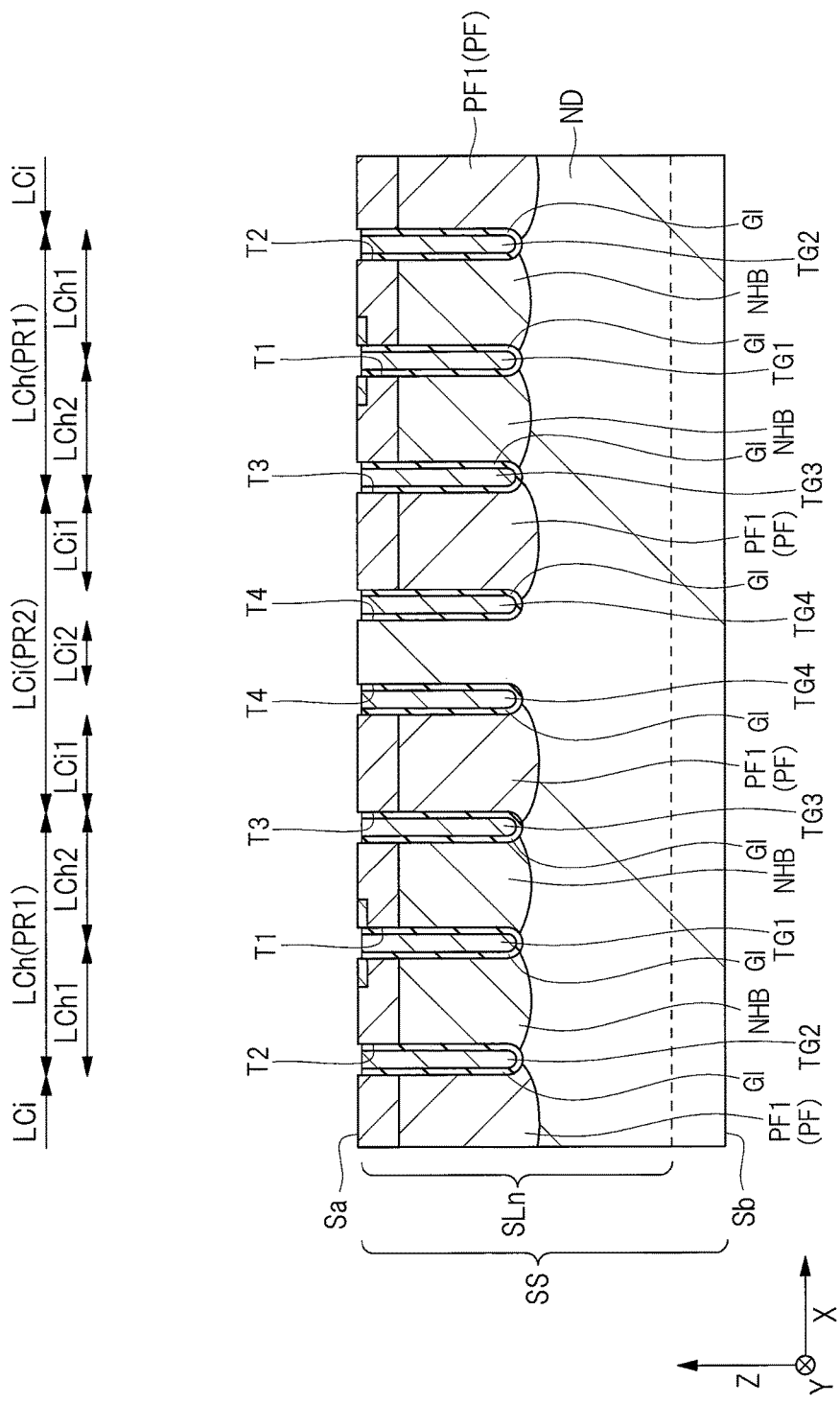
FIG. 14 is a cross-sectional view of a principal part illustrating a step of manufacturing the semiconductor device according to the first embodiment.

Next, as illustrated in FIG. 14, the gate insulating film GI except for each inside of the trenches T1, T2, T3, and T4 is removed by dry etching or others.

Figure 15:
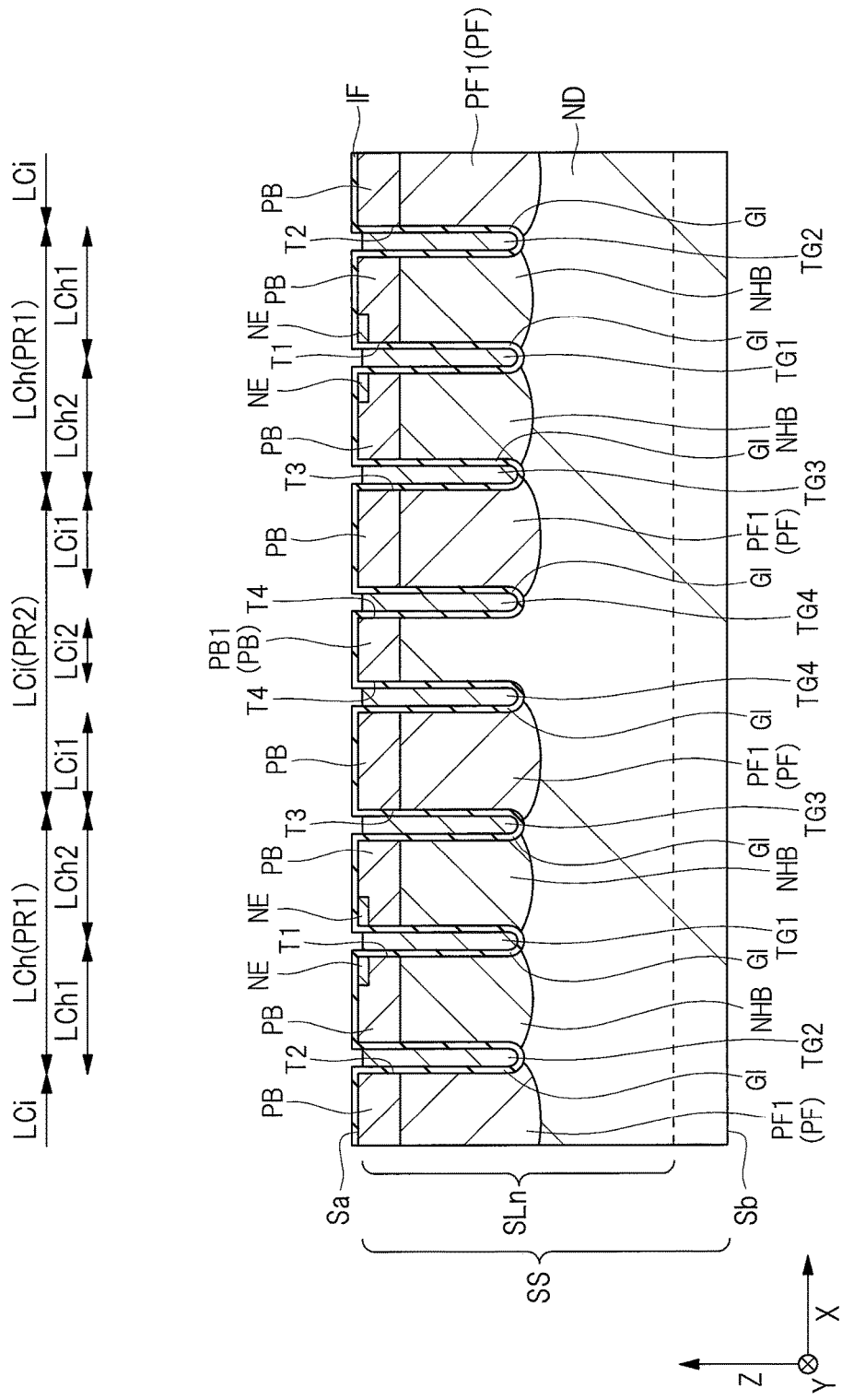
FIG. 15 is a cross-sectional view of a principal part illustrating a step of manufacturing the semiconductor device according to the first embodiment.

Next, as illustrated in FIG. 15, the insulating film IF made of a relatively thin silicon oxide film (as thin as, for example, the gate insulating film GI) for ion implantation performed later is formed on the upper surface Sa of the semiconductor substrate SS by, for example, a thermal oxidation method or a CVD method. Next, a resist film (illustration is omitted) for introducing the p-type body region is formed on the upper surface Sa of the semiconductor substrate SS by normal lithography. While using this resist film for introducing the p-type body region as a mask, a p-type impurity is doped into the entire cell formation region AR1 (see FIG. 2) and other necessary parts by, for example, ion implantation, so that the p-type body region PB is formed.

Specifically, in the hybrid sub-cell region LCh1, the p-type body region PB is formed in a part of the semiconductor layer SLn on the upper surface Sa side, the part being located between the trench T1 and the trench T2, so as to contact the gate insulating film GI formed on the inner wall of the trench T1 and the gate insulating film GI formed on the inner wall of the trench T2. At this time, in the hybrid sub-cell region LCh1, the n-type hole barrier region NHB is formed in a part of the semiconductor layer SLn, the part being located between the trench T1 and the trench T2 and being located on the lower surface Sb side with reference to the p-type body region PB.

Also, in the hybrid sub-cell region LCh2, the p-type body region PB is formed in a part of the semiconductor layer SLn on the upper surface Sa side, the part being located between the trench T1 and the trench T3, so as to contact the gate insulating film GI formed on the inner wall of the trench T1 and the gate insulating film GI formed on the inner wall of the trench T3. At this time, in the hybrid sub-cell region LCh2, the n-type hole barrier region NHB is formed in a part of the semiconductor layer SLn, the part being located between the trench T1 and the trench T3 and being located on the lower surface Sb side with reference to the p-type body region PB.

On the other hand, in the part LCi2 included in the inactive cell region LCi, the p-type body region PB1 serving as the p-type body region PB is formed in a part of the semiconductor layer SLn on the upper surface Sa side, the part being located between the two trenches T4, so as to contact the gate insulating film GI formed on each inner wall of the two trenches T4.

At this time, the p-type body region PB1 is formed so that an end portion of the p-type floating region PF1 on the lower surface Sb side, the end portion being formed in the part LCi1 included in the inactive cell region LCi, is arranged on the lower surface Sb side in the Z axial direction with reference to an end portion of the p-type body region PB1 on the lower surface Sb side, the part being formed in the part LCi2 included in the inactive cell region LCi.

Thus, in the parts LCi1 included in the inactive cell region LCi, the two p-type floating regions PF1 are formed in two parts of the semiconductor layer SLn, the two part being located on both sides of the p-type body region PB1 in the X axial direction via the two respective trenches T4. On the other hand, in the part LCi2 included in the inactive cell region LCi, the n⁻-type drift region ND is formed in a part of the semiconductor layer SLn, the part being located between the two trenches T4 and being located below the p-type body region PB.

In each of the two parts LCi1 of the inactive cell region LCi, note that the p-type body region PB may be formed in a part of the semiconductor layer SLn on the upper surface Sa side, the part being located between the trench T3 and the trench T4 adjacent to each other, so as to contact the gate insulating film GI formed on the inner wall of the trench T3 and the gate insulating film GI formed on the inner wall of the trench T4.

As for ion implantation conditions at this time, ion implantation conditions in which an ion species is boron (B), in which the dose amount is about $3 \times 10^{13}$ cm⁻², and in which implantation energy is about 75 keV can be exemplified as preferable conditions. Then, the unnecessary resist film for introducing the p-type body region is removed by ashing or others.

When the p-type body region PB is formed in each of the hybrid sub-cell regions LCh1 and LCh2 in the step of manufacturing the semiconductor device according to the present first embodiment, the p-type body region PB1 is formed in the part LCi2 included in the inactive cell region LCi. Thus, in the step of manufacturing the semiconductor device according to the present first embodiment, it is not required to prepare an additional mask for forming the p-type body region PB1, and it is not required to perform additional lithography for forming the p-type body region PB1.

Further, a resist film (illustration is omitted) for introducing the n⁺-type emitter region is formed on the upper surface Sa of the semiconductor substrate SS by normal lithography. While using this resist film for introducing the n⁺-type emitter region as a mask, an n-type impurity is doped into the upper layer portion of the p-type body region PB in the hybrid cell region LCh by, for example, ion implantation, so that the n⁺-type emitter region NE is formed.

Specifically, in the hybrid sub-cell region LCh1, the n⁺-type emitter region NE is formed in a part of the semiconductor layer SLn, the part being located between the trench T1 and the trench T2, so as to contact the gate insulating film GI formed on the inner wall of the trench T1 and the p-type body region PB. Also, in the hybrid sub-cell region LCh2, the n$^+$-type emitter region NE is formed in a part of the semiconductor layer SLn, the part being located between the trench T1 and the trench T3 so as to contact the gate insulating film GI formed on the inner wall of the trench T1 and the p-type body region PB.

As for ion implantation conditions at this time, ion implantation conditions in which an ion species is arsenic (As), in which the dose amount is about $5 \times 10^{15}$ cm$^{-2}$, and in which implantation energy is about 80 keV can be exemplified as preferable conditions. The, the unnecessary resist film for introducing the n$^+$-type emitter region is removed by ashing or others.

Figure 16:
FIG. 16 is a cross-sectional view of a principal part illustrating a step of manufacturing the semiconductor device according to the first embodiment.
Figure 16:
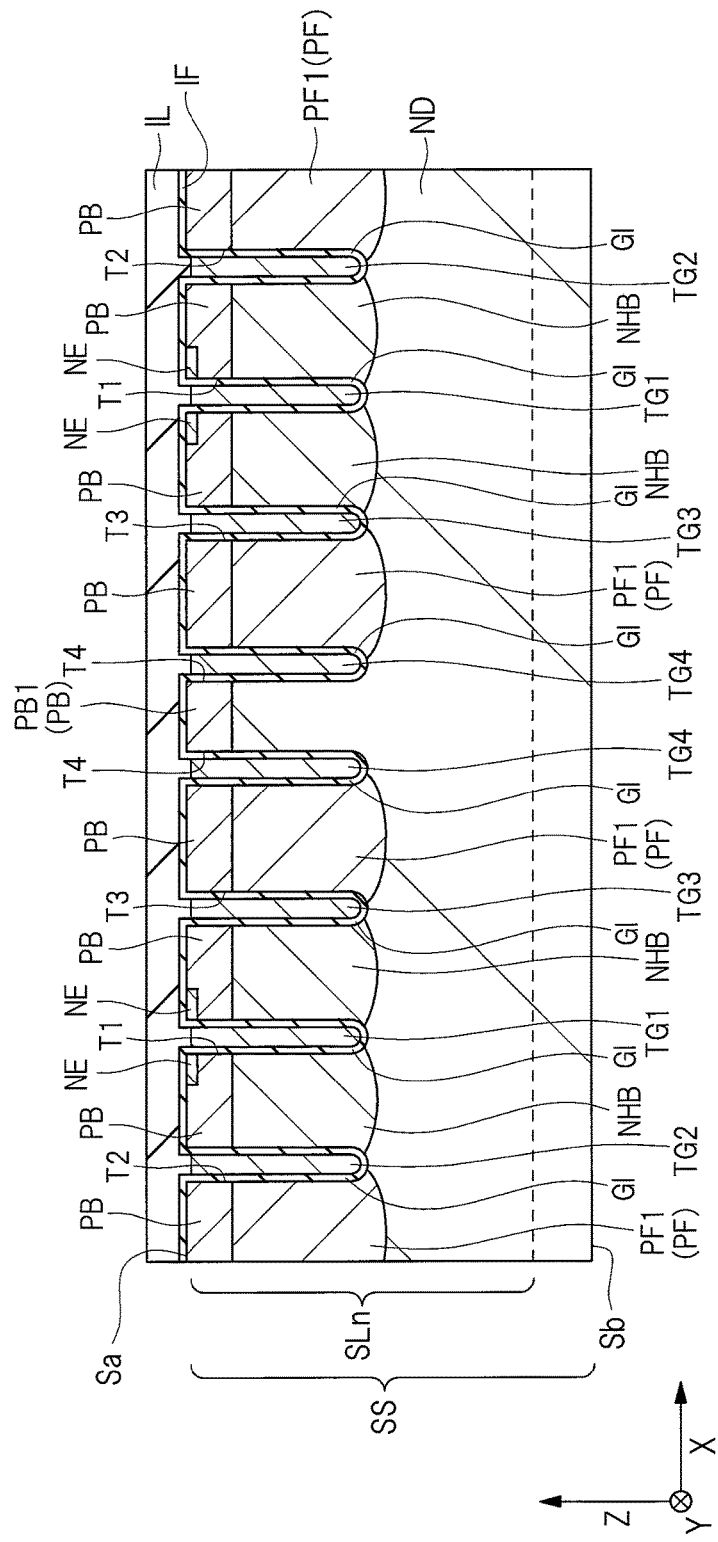

Next, as illustrated in FIG. 16, the interlayer insulating film IL made of, for example, a PSG (phosphosilicate glass) film is formed on the upper surface Sa of the semiconductor substrate SS by, for example, a CVD method. The interlayer insulating film IL is formed to cover, for example, the p-type body region PB via the insulating film IF in each of the hybrid sub-cell regions LCh1 and LCh2 and the inactive region LCi. A thickness of the interlayer insulating film IL is, for example, about 0.6 μm. As for a material for this interlayer insulating film IL, not only the PSG film but also a BPSG (boronphosphosilicate glass) film, an NSG (non-doped silicate glass) film, an SOG (spin-on-glass) film, and a composite film of them, can be exemplified as a preferable material.

Figure 17:
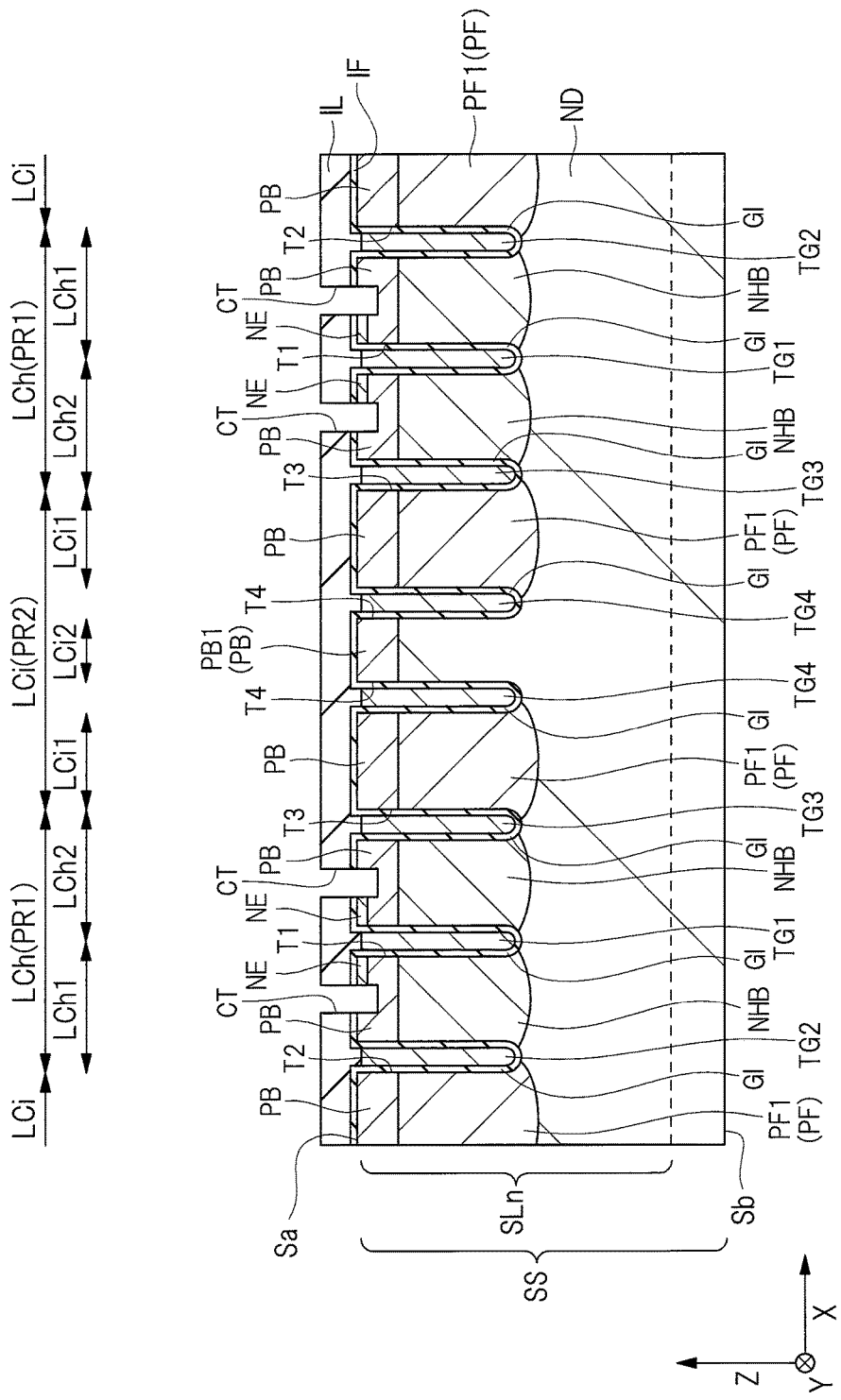
FIG. 17 is a cross-sectional view of a principal part illustrating a step of manufacturing the semiconductor device according to the first embodiment.

Next, as illustrated in FIG. 17, a resist film (illustration is omitted) for forming the contact trench is formed on the interlayer insulating film IL by normal lithography. Subsequently, the contact trench CT is formed by, for example, anisotropic dry etching or others. As for gas used for this anisotropic dry etching, for example, mixed gas containing Ar gas, CHF$_3$ gas, and CF$_4$ gas or others can be exemplified as a preferable gas. Then, the unnecessary resist film for forming the contact trench is removed by ashing or others.

Next, as illustrated in FIG. 17, the contact trench CT is extended into the semiconductor substrate SS by, for example, anisotropic dry etching. As for gas for this anisotropic dry etching, for example, 012/02 gas can be exemplified as a preferable gas.

By a step illustrated in FIG. 17, the contact trench CT serving as an opening portion is formed in each of the hybrid sub-cell regions LCh1 and LCh2 to penetrate the interlayer insulating film IL and reach the middle of the p-type body region PB. In each of the hybrid sub-cell regions LCh1 and LCh2, the contact trench CT is formed continuously along the Y axial direction when seen in a plan view.

Figure 18:
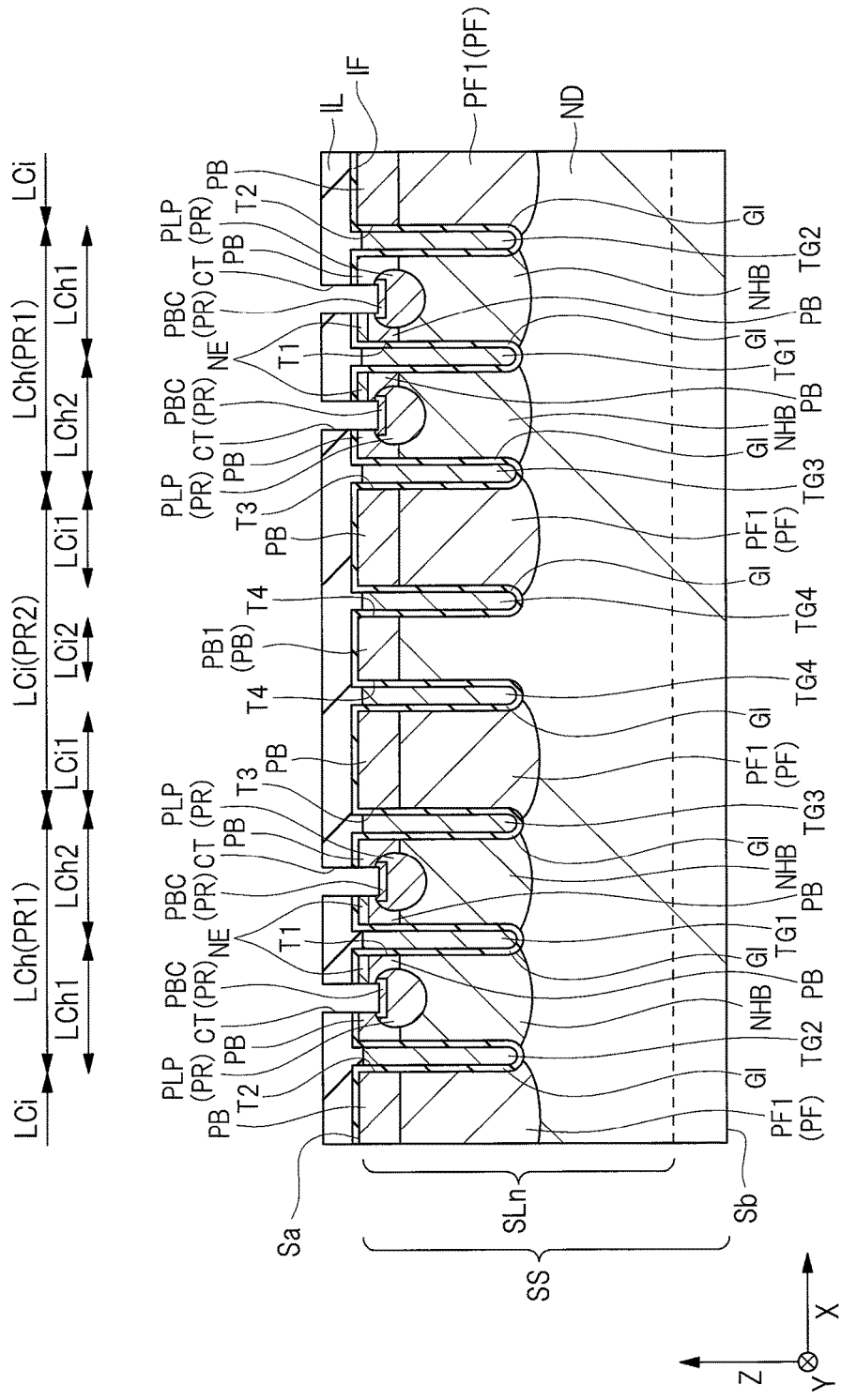
FIG. 18 is a cross-sectional view of a principal part illustrating a step of manufacturing the semiconductor device according to the first embodiment.

Next, as illustrated in FIG. 18, the p$^+$-type body contact region PBC is formed by, for example, ion-implanting a p-type impurity through the contact trench CT. Here, as for ion implantation conditions, ion implantation conditions in which an ion species is boron (B), in which the dose amount is about $5 \times 10^{15}$ cm$^{-2}$, and in which implantation energy is about 80 keV can be exemplified as preferable conditions.

Similarly, the p$^+$-type latch-up prevention region PLP is formed by, for example, ion-implanting a p-type impurity through the contact trench CT. Here, as for ion implantation conditions, ion implantation conditions in which an ion species is boron (B), in which the dose amount is about $5 \times 10^{15}$ cm$^{-2}$, and in which implantation energy is about 80 keV can be exemplified as preferable conditions. The p-type impurity concentration in the p$^+$-type body contact region PBC is higher than the p-type impurity concentration in the p$^+$-type latch-up prevention region PLP. Also, the p$^+$-type semiconductor region PR is formed of the p$^+$-type body contact region PBC and the p$^+$-type latch-up prevention region PLP.

By a step illustrated in FIG. 18, the p$^+$-type semiconductor region PR is formed in each of the hybrid sub-cell regions LCh1 and LCh2 in a part of the p-type body region PB, the part being exposed to the contact trench CT. In each of the hybrid sub-cell regions LCh1 and LCh2, the p$^+$-type semiconductor region PR is formed continuously along the Y axial direction when seen in a plan view.

That is, by the step illustrated in FIG. 18, the p$^+$-type semiconductor region PR contacting the p-type body region PB is formed in a part of the semiconductor layer SLn, the part being located between the trench T1 and the trench T2. Also, the p$^+$-type semiconductor region PR contacting the p-type body region PB is formed in a part of the semiconductor layer SLn, the part being located between the trench T1 and the trench T3. In each of the hybrid sub-cell regions LCh1 and LCh2, the p-type impurity concentration in the p$^+$-type semiconductor region PR is higher than the p-type impurity concentration in the p-type body region PB.

Figure 19:
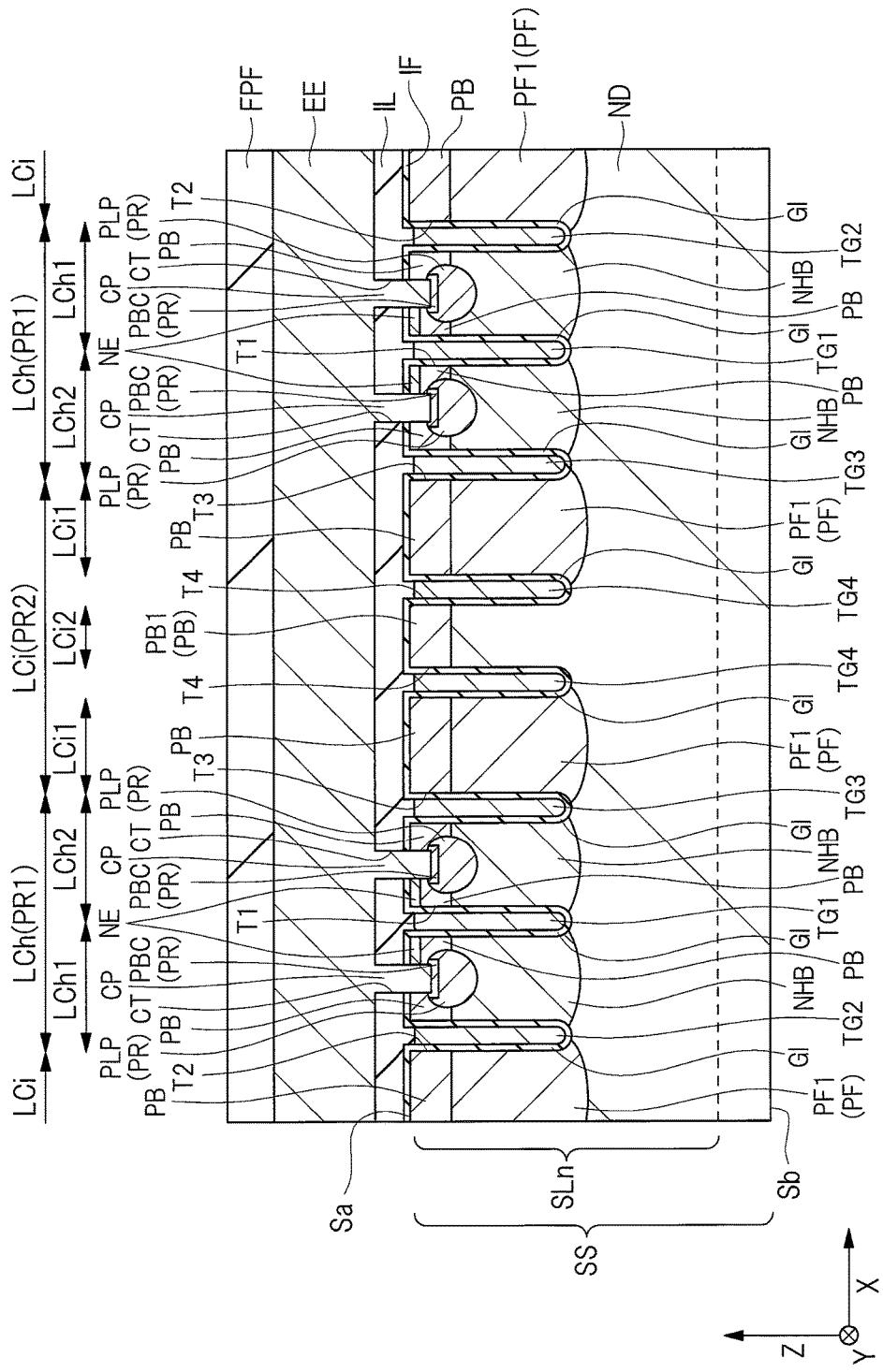
FIG. 19 is a cross-sectional view of a principal part illustrating a step of manufacturing the semiconductor device according to the first embodiment.

Next, as illustrated in FIG. 19, the emitter electrode EE is formed. Specifically, the formation is performed in, for example, the following procedure. First, a TiW film is formed on the upper surface Sa of the semiconductor substrate SS as a barrier metal film by, for example, sputtering. A thickness of the TiW film is, for example, about 0.2 μm. Titanium in the TiW film mostly moves to the silicon interface and forms silicide by a thermal treatment performed later, and contributes to improvement of contact characteristics. However, these processes are complicated, and therefore, are not shown in the drawing.

Next, after silicide annealing is performed, for example, at about 600° C. for about 10 minutes under a nitrogen atmosphere, an aluminum-based metal film (in which, for example, several % of silicon is added, and the rest is aluminum) is formed on the entire surface of the barrier metal film by, for example, sputtering to fill the contact trench CT. A thickness of the aluminum-based metal film is, for example, about 5 μm.

Next, a resist film (illustration is omitted) for forming the emitter electrode is formed by normal lithography. Subsequently, the emitter electrode EE made of the aluminum-based metal film and the barrier metal film is patterned by, for example, dry etching. As for gas for this dry etching, for example, Cl$_2$/BCl$_3$ gas can be exemplified as a preferable gas. Then, the unnecessary resist film for forming the emitter electrode is removed by ashing or others.

By a step illustrated in FIG. 19, the connection electrode CP buried inside the contact trench CT and the emitter electrode EE formed on the interlayer insulating film IL are formed in the hybrid sub-cell region LCh1. In the hybrid sub-cell region LCh1, the connection electrode CP is formed continuously along the Y axial direction when seen in a plan view. Also, by the step illustrated in FIG. 19, the connection electrode CP buried inside the contact trench CT and the emitter electrode EE formed on the interlayer insulating film IL are formed in the hybrid sub-cell region LCh2. In the hybrid sub-cell region LCh2, the connection electrode CP is formed continuously along the Y axial direction when seen in a plan view.

The emitter electrode EE is electrically connected to the n$^+$-type emitter region NE and the p$^+$-type semiconductor region PR formed in each of the hybrid sub-cell regions LCh1 and LCh2 via the connection electrode CP formed in the hybrid sub-cell region. When the emitter electrode EE is formed, note that the gate electrode GE (see FIG. 1) electrically connected to the trench electrode TG1 may be formed.

When the emitter electrode EE is formed in the cell formation region AR1 (see FIG. 2), note that the gate wiring GL and the gate electrode GE (see FIG. 1) can be formed in the gate wiring extraction region AR2 (see FIG. 2).

Next, as illustrated in FIG. 19, the insulating film FPF serving as a passivation film made of, for example, an organic film or others containing polyimide as a main component is formed on the emitter electrode EE. A thickness of the insulating film FPF is, for example, about 2.5 μm.

Next, a resist film (illustration is omitted) for forming the opening portion is formed by normal lithography. Next, by, for example, dry etching, the insulating film FPF is patterned to form the opening portion OP1 (see FIG. 1) penetrating the insulating film FPF and reaching the emitter electrode EE and to form the emitter pad EP (see FIG. 1) which is a part of the emitter electrode EE, the part being exposed from the opening portion OP1. Then, the unnecessary resist film for forming the opening portion is removed by ashing or others.

When the insulating film FPF is formed on the emitter electrode EE in the cell formation region AR1 (see FIG. 1), note that the insulating film FPF is formed on the gate electrode GE (see FIG. 1) in the gate wiring extraction region AR2 (see FIG. 1). Also, when the opening portion OP1 is formed in the cell formation region AR1 (see FIG. 1), the opening portion OP2 (see FIG. 1) penetrating the insulating film FPF and reaching the gate electrode GE is formed, and the gate pad GP which is a part of the gate electrode GE, the part being exposed from the opening portion OP2, is formed, in the gate wiring extraction region AR2 (see FIG. 1).

In this manner, by steps described with reference to FIGS. 5 to 19, the element portion PR1 is formed in the semiconductor layer SLn in each of the two respective hybrid cell regions LCh of the upper surface Sa of the semiconductor substrate SS, the two hybrid cell regions LCh being arranged to be spaced from each other in the X axial direction when seen in a plan view. Also, the interposition portion PR2 interposed between the two element portions PR1 each formed in the two hybrid cell regions LCh is formed in the semiconductor layer SLn in the inactive cell region LCi of the upper surface Sa of the semiconductor substrate SS, the inactive cell region being located between the two hybrid cell regions LCh when seen in a plan view. Also, by a step illustrated in FIG. 19, the two p-type body regions, the two $n^+$-type emitter regions NE, and the emitter electrode EE electrically connected to the trench electrodes TG2 and TG3 included in each of the two element portions PR1 are formed. As described above, when the emitter electrode EE is formed, note that the gate electrode GE electrically connected to the trench electrode TG1 included in each of the two element portions PR1 may be formed.

Figure 20:
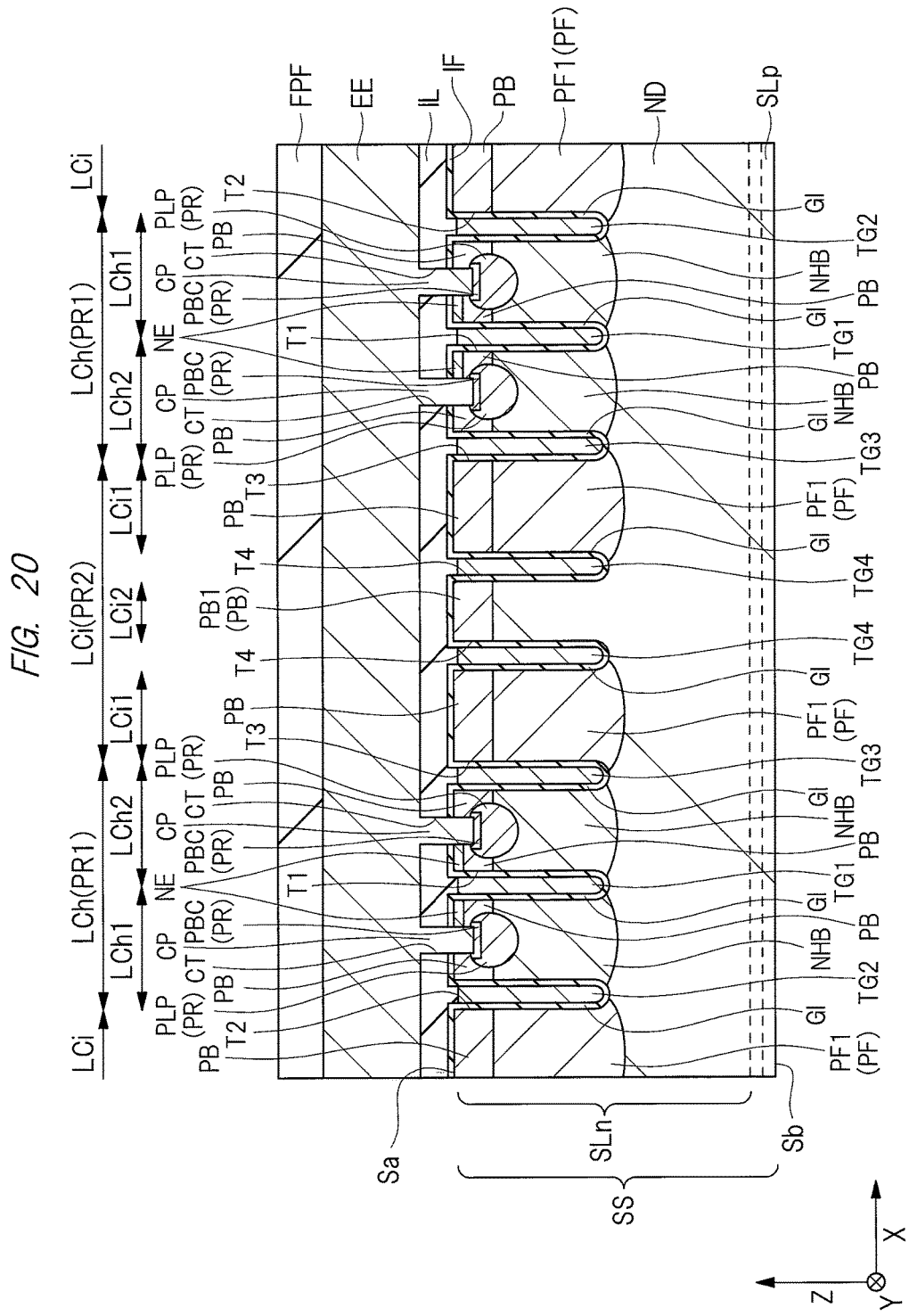
FIG. 20 is a cross-sectional view of a principal part illustrating a step of manufacturing the semiconductor device according to the first embodiment.

Next, as illustrated in FIG. 20, by performing a back grinding treatment to the lower surface Sb of the semiconductor substrate SS, A thickness of, for example, about 800 μm is made small to, for example, about 30 to 200 μm as needed. For example, when a breakdown voltage is about 600 V, the final thickness is about 70 μm. Thus, the semiconductor layer SLp is formed inside a part of the thinned semiconductor substrate SS, the part being located on the lower surface Sb side with reference to the semiconductor layer SLn. Also, chemical etching or others for elimination of damage on the lower surface Sb is performed as needed.

At this time, a semiconductor layer of the thinned semiconductor substrate SS is assumed to be a semiconductor layer SLp, the semiconductor layer being located on the lower surface Sb side with reference to the semiconductor layer provided with the n-type field stop region Ns (see FIG. 4) and being provided with the $p^+$-type collector region CL (see FIG. 4).

Next, as illustrated in FIG. 4, an n-type impurity is doped into the lower surface Sb of the semiconductor substrate SS by, for example, ion implantation, so that the n-type field stop region Ns is formed. Here, as for ion implantation conditions, ion implantation conditions in which an ion species is phosphorus (P), in which the dose amount is about $7 \times 10^{12}$ cm$^{-2}$, and in which implantation energy is about 350 keV can be exemplified as preferable conditions. Then, laser annealing or others is performed to the lower surface Sb of the semiconductor substrate SS for impurity activation as needed.

Next, a p-type impurity is doped into the lower surface Sb of the semiconductor substrate SS by, for example, ion implantation, so that the $p^+$-type collector region CL is formed. Here, as for ion implantation conditions, ion implantation conditions in which an ion species is boron (B), in which the dose amount is about $1 \times 10^{13}$ cm$^{-2}$, and in which implantation energy is about 40 keV can be exemplified as preferable conditions. Then, laser annealing or others is performed to the lower surface Sb of the semiconductor substrate SS for impurity activation as needed.

That is, in the step of forming the $p^+$-type collector region CL, the p-type semiconductor layer SLp is formed inside a part of the semiconductor substrate SS, the part being located on the lower surface Sb side with reference to the semiconductor layer SLn, and the $p^+$-type collector region CL is formed of the p-type semiconductor layer SLp.

Next, the collector electrode CE electrically connected to the semiconductor layer SLp, that is, the $p^+$-type collector region CL is formed on the lower surface Sb of the semiconductor substrate SS by, for example, sputtering. Then, the semiconductor substrate SS is divided into chip regions by dicing or others and is sealed into a package as needed, so that the semiconductor device according to the present first embodiment is completed.

<Semiconductor Device According to First Comparative Example>

Next, a semiconductor device according to a first comparative example will be described. The semiconductor device according to the first comparative example includes an IGBT having a GG-type (gate-gate-type) active cell region. Note that the IGBT having the GG-type active cell region means that each of two trench electrodes arranged in an active cell region to be spaced from each other is electrically connected to a gate electrode.

Figure 21:
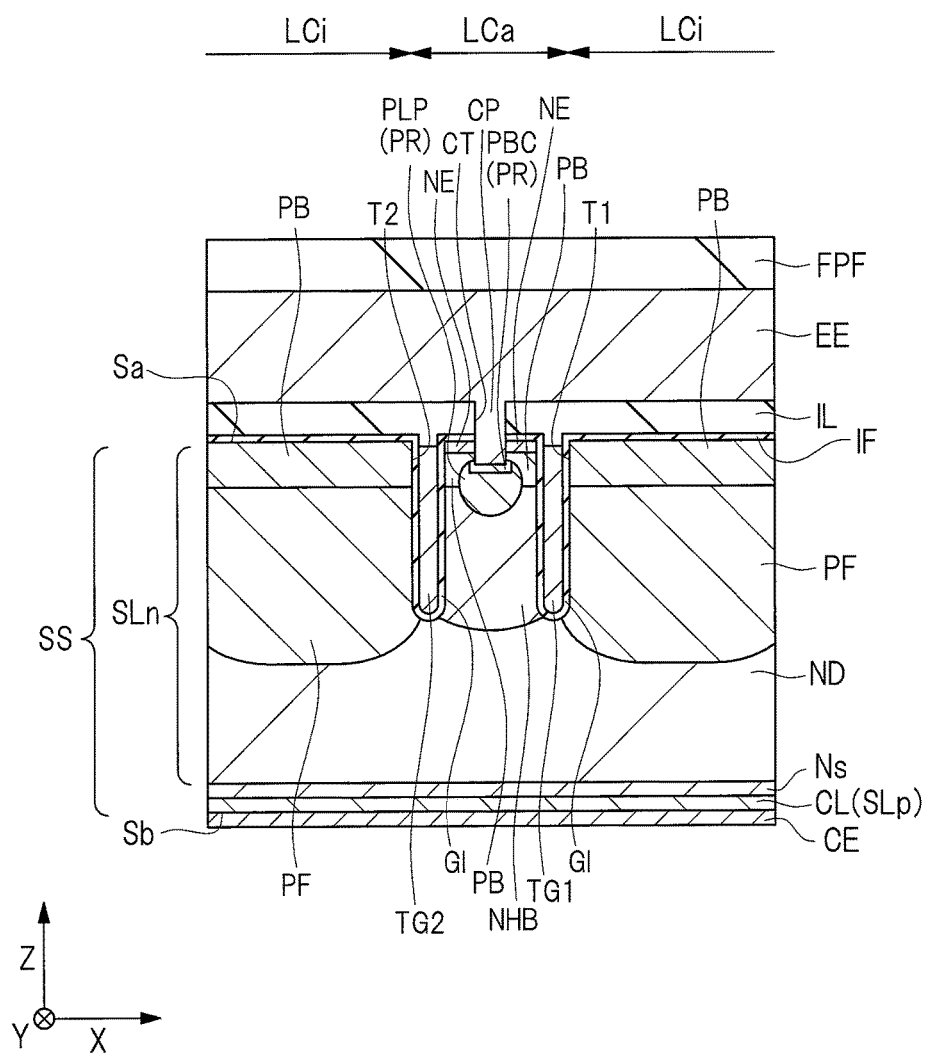
FIG. 21 is a cross-sectional view of a principal part of a semiconductor device according to a first comparative example.

FIG. 21 is a cross-sectional view of a principal part of the semiconductor device according to the first comparative example.

The semiconductor device according to the first comparative example includes a GG-type active cell region LCa and the inactive cell region LCi.

The active cell region LCa is similar to the hybrid sub-cell region LCh1 in the semiconductor device according to the first embodiment except that the $n^+$-type emitter regions NE are arranged on both sides across the connection electrode CP. In the active cell region LCa, the trench electrode TG1 and the trench electrode TG2 are formed. However, in the first comparative example, the trench electrode TG2 in addition to the trench electrode TG1 is also electrically connected to the gate electrode GE (see FIG. 1).

Also, the n+-type emitter regions NE are formed in a part of the semiconductor layer SLn, the part being located between the trench T1 and the trench T2, and are arranged on both sides across the connection electrode CP. That is, not only the n+-type emitter region NE contacting the p-type body region PB and the gate insulating film GI formed on the inner wall of the trench T1 but also the n+-type emitter region NE contacting the p-type body region PB and the gate insulating film GI formed on the inner wall of the trench T2 are formed.

<Semiconductor Device According to Second Comparative Example>

Next, a semiconductor device according to a second comparative example will be described. The semiconductor device according to the second comparative example includes an IGBT having an EGE-type active cell region.

Figure 22:
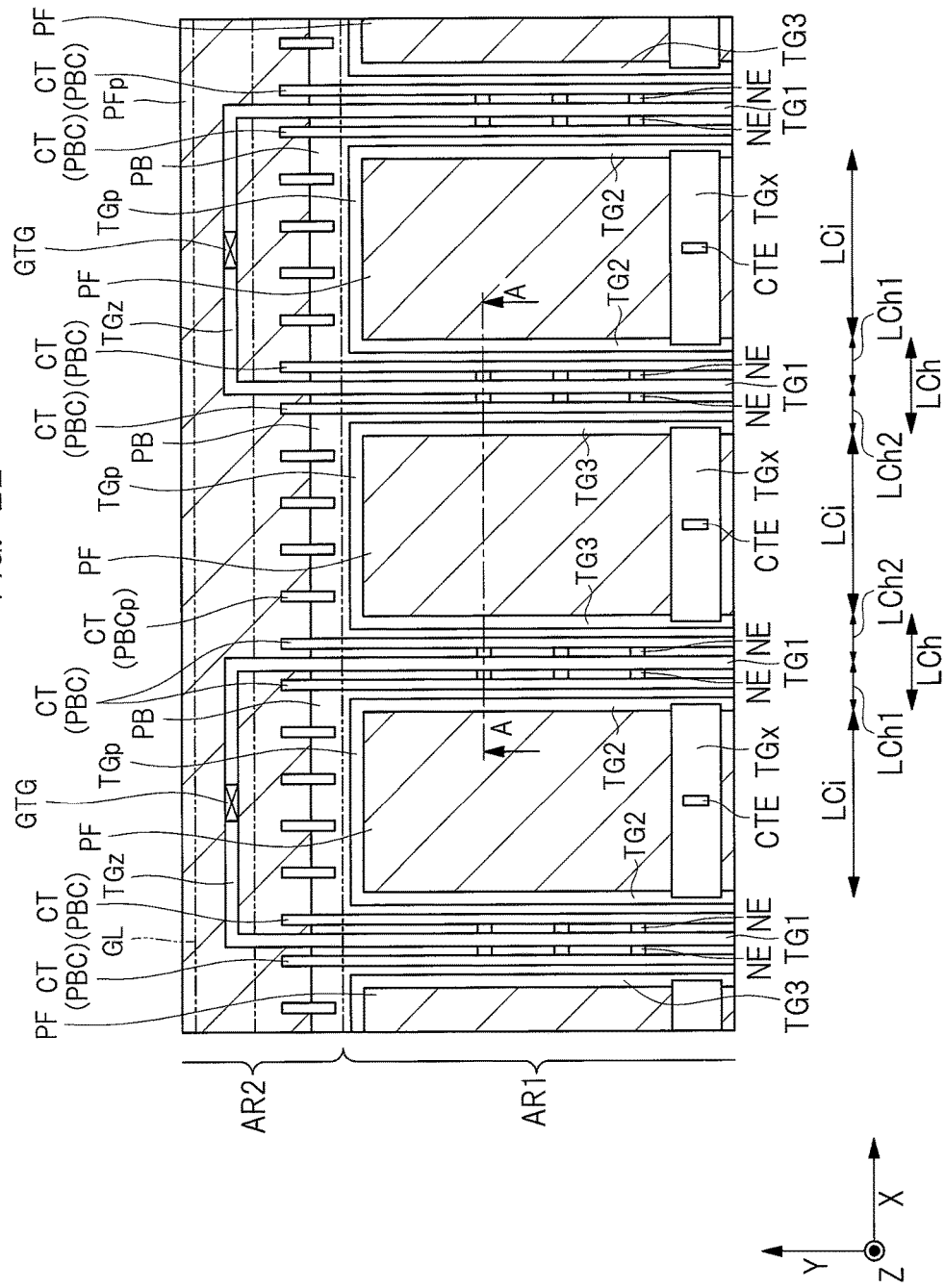
FIG. 22 is a plan view of a principal part of a semiconductor device according to a second comparative example.
Figure 23:
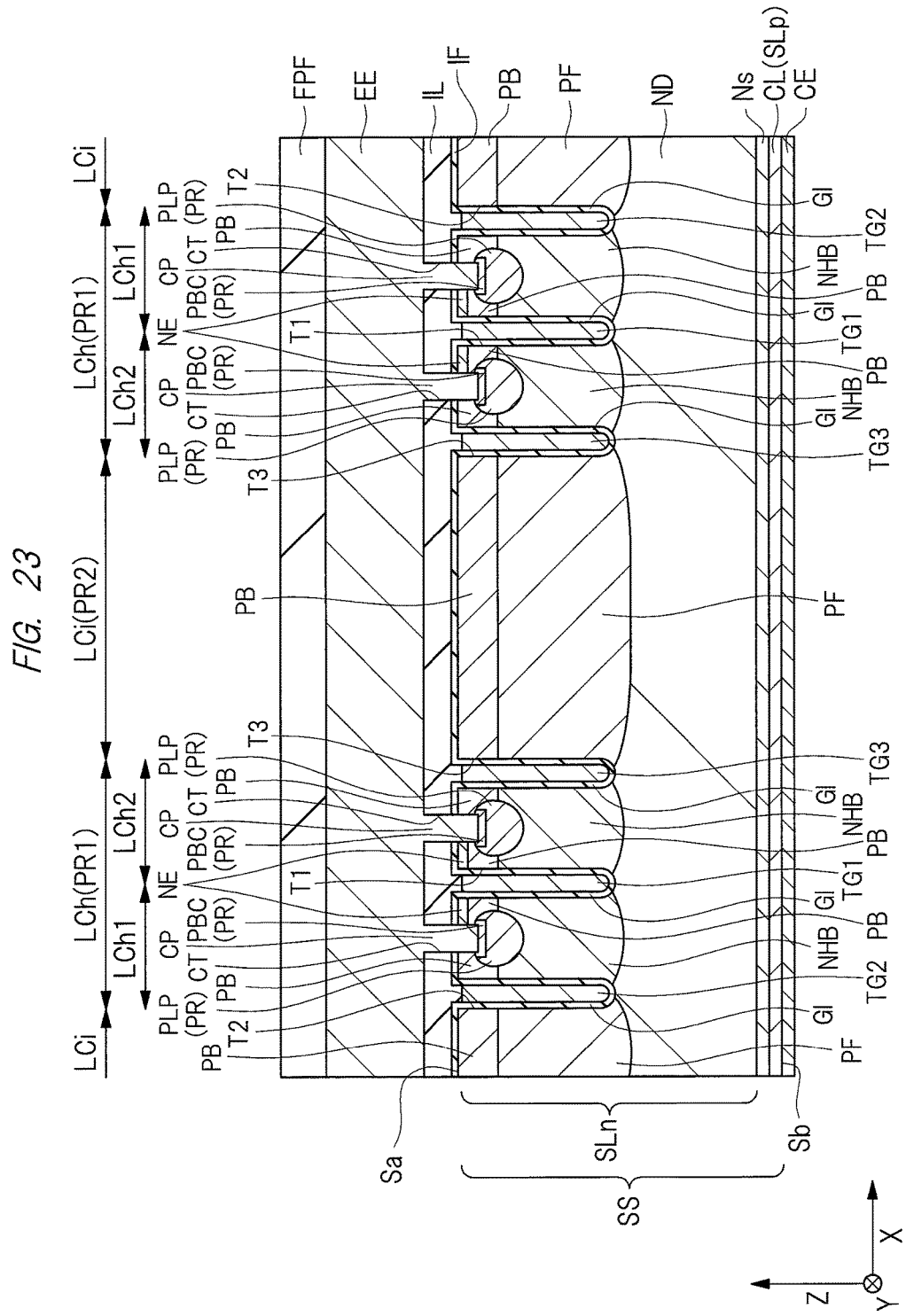
FIG. 23 is a cross-sectional view of a principal part of the semiconductor device according to the second comparative example.

FIG. 22 is a cross-sectional view of a principal part of the semiconductor device according to the second comparative example. FIG. 23 is a cross-sectional view of a principal part of the semiconductor device according to the second comparative example. FIG. 23 is a cross-sectional view taken along a line A-A in FIG. 22.

As similar to the semiconductor device according to the first embodiment, the semiconductor device according to the second comparative example is also provided with the plurality of hybrid cell regions LCh serving as active cell regions and the plurality of inactive cell regions LCi. Also, each component of the hybrid cell region LCh in the semiconductor device according to the second comparative example is similar to each component of the hybrid cell region LCh in the semiconductor device according to the first embodiment.

On the other hand, in the second comparative example, the two trenches T4 (see FIG. 4) are not formed in the inactive cell region LCi as different from the present first embodiment.

In the inactive cell region LCi in the second comparative example, the p-type body region PB is formed in an upper layer portion of a part of the semiconductor layer SLn, the part being located between the two adjacent trenches T3, that is, a part of the semiconductor substrate SS on the upper surface Sa side. The p-type body region PB contacts the gate insulating film GI formed on the respective inner walls of the two trenches T3. In the inactive cell region LCi, the p-type floating region PF is formed in a part being located between the two adjacent trenches T3 and being located on the lower surface Sb side with reference to the p-type body region PB.

That is, in the inactive cell region LCi in the second comparative example, the p-type floating region PF is not divided by the two trenches T4 (see FIG. 4).

<About Characteristics of Semiconductor Device According to Second Comparative Example>

Next, characteristics of the semiconductor device according to the second comparative example in comparison with those of the semiconductor device according to the first comparative example will be described.

Figure 24:
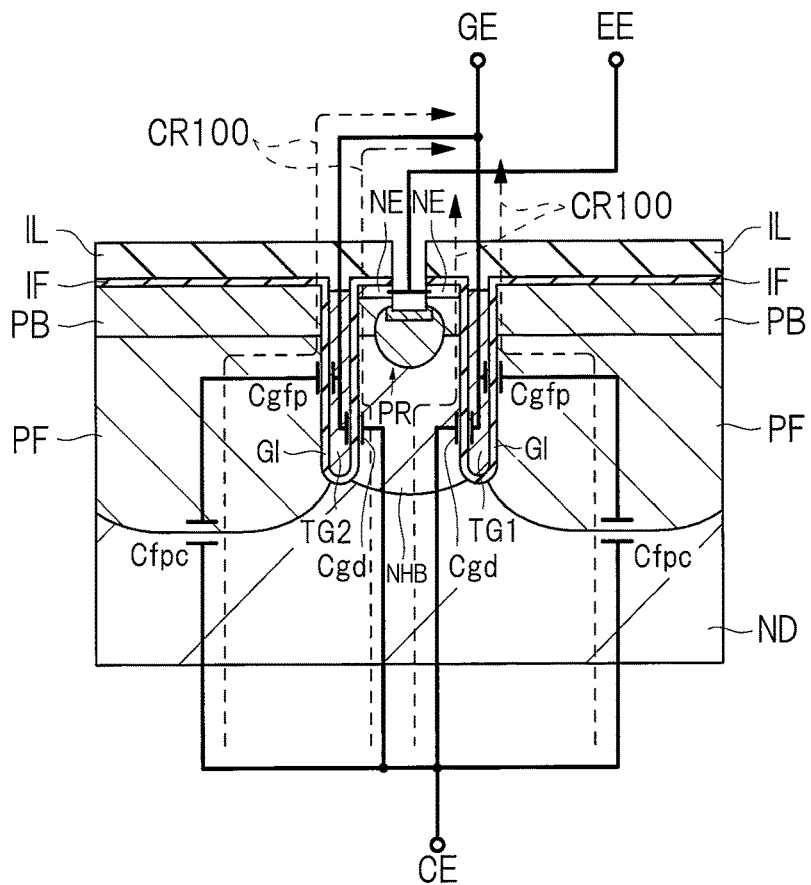
FIG. 24 is a cross-sectional view illustrating a displacement current path at the time of turn-on in the semiconductor device according to the first comparative example so as to be overlapped.
Figure 25:
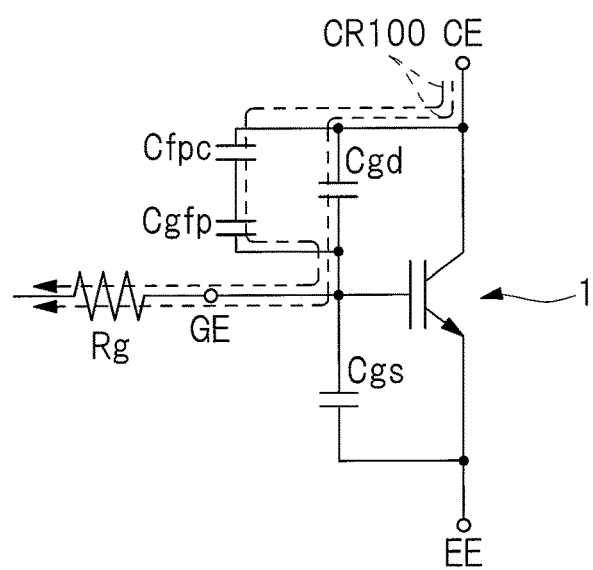
FIG. 25 is a circuit diagram illustrating a displacement current path at the time of turn-on in the semiconductor device according to the first comparative example.
Figure 26:
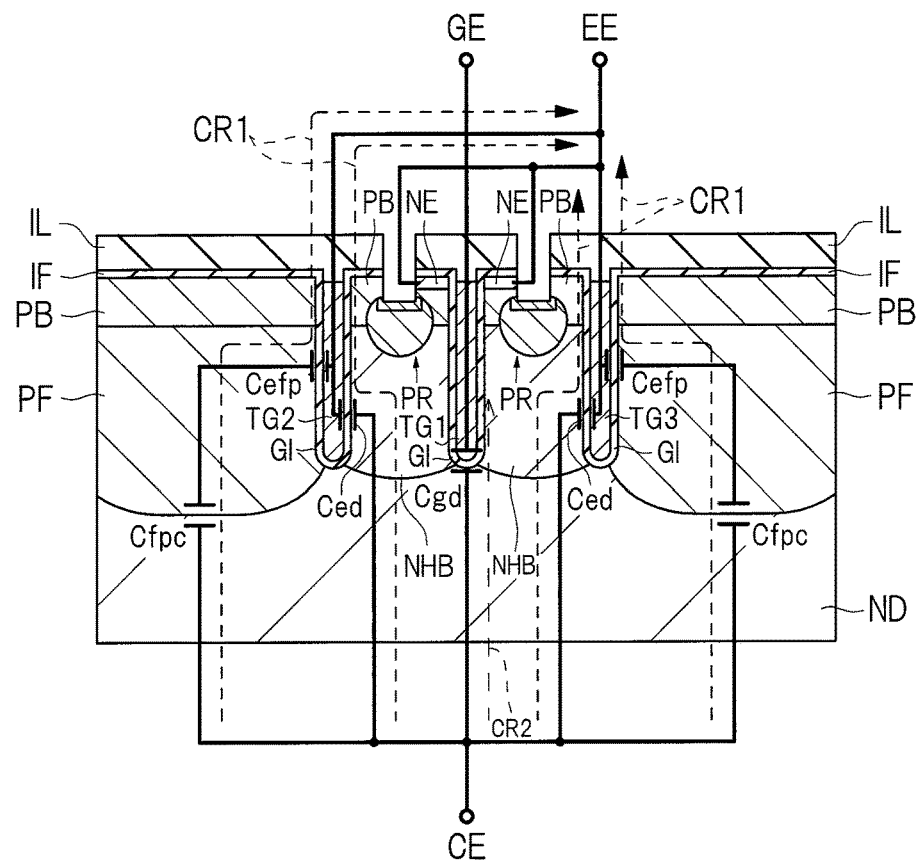
FIG. 26 is a cross-sectional view illustrating a displacement current path at the time of turn-on in the semiconductor device according to the second comparative example so as to be overlapped.
Figure 27:
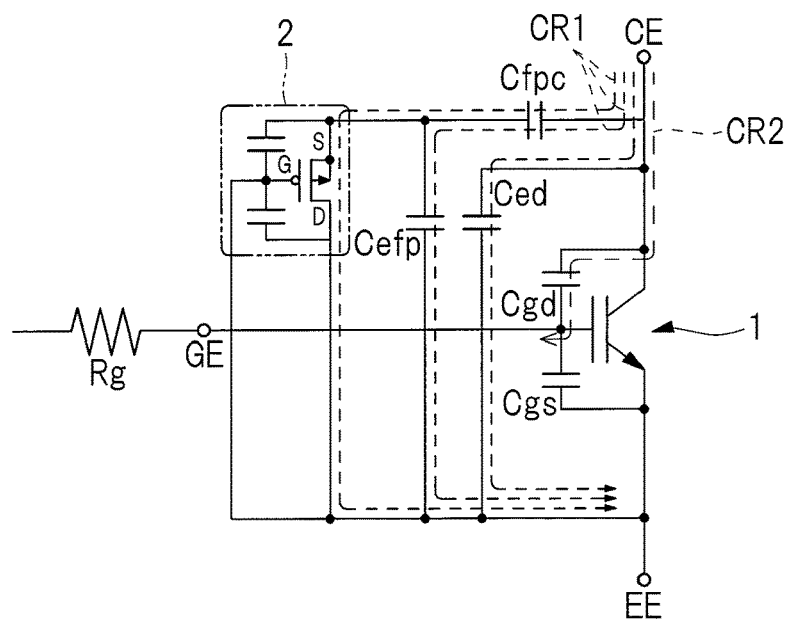
FIG. 27 is a circuit diagram illustrating a displacement current path at the time of turn-on in the semiconductor device according to the second comparative example.

FIG. 24 is a cross-sectional view illustrating a displacement current path at the time of turn-on in the semiconductor device according to the first comparative example to be overlapped. FIG. 25 is an equivalent circuit diagram illustrating the displacement current path at the time of turn-on in the semiconductor device according to the first comparative example. FIG. 26 is a cross-sectional view illustrating a displacement current path at the time of turn-on in the semiconductor device according to the second comparative example to be overlapped. FIG. 27 is an equivalent circuit diagram illustrating the displacement current path at the time of turn-on in the semiconductor device according to the second comparative example.

Note that a displacement current path at the time of turn-off along with an increase of collector voltage is similar to the displacement current path at the time of turn-on illustrated in FIGS. 24 to 27 and has an opposite arrow direction in the displacement current.

As illustrated in FIGS. 24 and 25, in the semiconductor device according to the first comparative example including the IGBT having the GG-type active cell region, the p-type floating region PF and each of the trench electrodes TG1 and TG2 connected to the gate electrode GE are adjacent to each other via the gate insulating film GI. Such a semiconductor device according to the first comparative example can be expressed by an equivalent circuit using an IGBT1 having the collector electrode CE, the emitter electrode EE, and the gate electrode GE, capacitances Cgd, Cgs, Cfpc, and Cgfp, and a resistance Rg connected to the gate electrode GE. Since displacement current CR100 generated in the active cell region LCa flows into the gate electrode GE in the semiconductor device according to the first comparative example, the displacement current CR100 has a large effect on a potential of the gate electrode GE or a gate potential.

On the other hand, as illustrated in FIGS. 26 and 27, in the semiconductor device according to the second comparative example including the IGBT having the EGE-type active cell region, the p-type floating region PF and the trench electrode TG1 connected to the gate electrode GE are isolated from each other by each of the trench electrodes TG2 and TG3 connected to the emitter electrode EE, and are not adjacent to each other. Such a semiconductor device according to the second comparative example can be expressed by an equivalent circuit using an IGBT1 having the collector electrode CE, the emitter electrode EE, and the gate electrode GE, capacitances Cgd, Cgs, Cfpc, Ced, and Cefp, and a resistance Rg connected to the gate electrode GE. Since displacement current CR1 generated in the hybrid cell region LCh flows into not the gate electrode GE but the emitter electrode EE in the semiconductor device according to the second comparative example, the displacement current CR1 has a small effect on the potential of the gate electrode GE or the gate potential.

Figure 28:
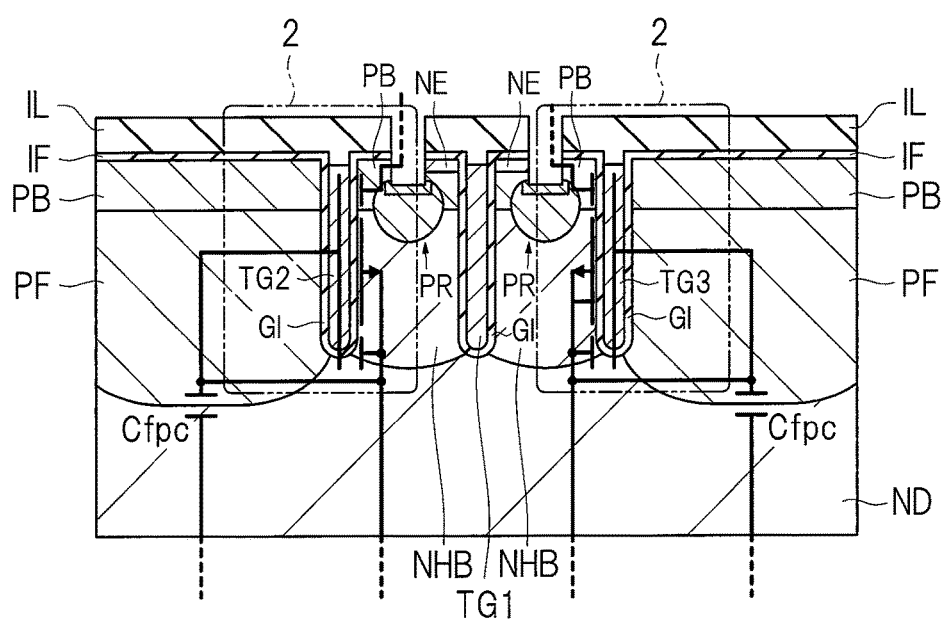
FIG. 28 is a cross-sectional view illustrating a p-channel parasitic MOSFET in the semiconductor device according to the second comparative example.

Next, operations of a p-channel parasitic MOSFET (Metal Oxide Semiconductor Field Effect Transistor) 2 formed in the IGBT1 will be described with reference to FIG. 28. FIG. 28 is a cross-sectional view illustrating a p-channel parasitic MOSFET in the semiconductor device according to the second comparative example.

Hereinafter, an example in which a parasitic MOSFET is formed inside the IGBT1 will be described. However, a parasitic MISFET (Metal Insulator Semiconductor Field Effect Transistor) formed of not a MOSFET but one of various MISFETs may be formed inside the IGBT1.

Also, hereinafter, operations at the time of turn-off in the L load switching will be considered. At the time of turn-off in the L load switching, a voltage VCE serving as a voltage between the collector and the emitter increases along with the turn-off first. At this time, the channel region of the p-channel parasitic MOSFET 2 is inverted into p-type. And, holes serving as carriers accumulated in the p-type floating region PF and the n−-type drift region ND are discharged via the p-channel parasitic MOSFET 2. Since the accumulated holes are promptly discharged by the above-described operations, the semiconductor device according to the second comparative example has characteristics in which the switching speed is higher than that of the semiconductor device according to the first comparative example.

<Regarding Problems of Semiconductor Device According to Second Comparative Example>

On the other hand, the semiconductor device including the IGBT having the EGE-type active cell region (semiconductor device according to the second comparative example) has problems. Hereinafter, problems of the semiconductor device according to the second comparative example will be described.

First, a rapid change or oscillation of current flowing in the IGBT at the time of turn-on will be described.

As described above, as a merit of the semiconductor device including the IGBT having the EGE-type active cell region, the semiconductor device has characteristics of the high switching speed. Meanwhile, depending on a field of an electronic system using the semiconductor device according to the second comparative example, the current flowing in the IGBT rapidly changes at the time of turn-on in a mismatch between the semiconductor device according to the second comparative example and a circuit connected to the semiconductor device according to the second comparative example, that is, when the switching speed of the semiconductor device according to the second comparative example is too high, and therefore, oscillation is observed in a switching waveform in some cases. In order to prevent or suppress such oscillation in the switching waveform, it is required to adjust a gate capacitance Qg so as to slightly increase.

For example, in a switching waveform obtained when the semiconductor device according to the second comparative example is turned on so that a rated current flows, no oscillation is observed at the time of turn-on. However, in a switching waveform obtained when the semiconductor device is turned on so that a current as low as about $1/10$ of the rated current flows, oscillation, that is, ringing is observed at the time of turn-on in some cases. That is, the lower the current flowing in the electronic system using the semiconductor device according to the second comparative example is, the more easily the oscillation, that is, the ringing is observed at the time of turn-on.

When the oscillation is observed at the time of turn-on as described above, there is a risk of occurrence of an EMI (Electro Magnetic Interference) noise or others. Thus, it is desired to increase the gate capacitance Qg to prevent or suppress the rapid change of the current flowing in the IGBT at the time of turn-on, that is, an increase of a change rate (di/dt) of the current "i" flowing in the IGBT with respect to the time "t". However, in the semiconductor device according to the second comparative example, it is difficult to easily increase the gate capacitance Qg, and therefore, it is difficult to prevent or suppress the rapid change of th current flowing in the IGBT at the time of turn-on.

Next, a switching loss at the time of turn-on will be described with reference to FIG. 29. FIG. 29 is a cross-sectional view of a principal part of the semiconductor device according to the second comparative example. FIG. 29 illustrates a current path PT101 of the hole current flowing in the p-type floating region PF, that is, the p-channel parasitic MOSFET, at the time of turn-on, to be schematically overlapped.

In the semiconductor device including the IGBT, the carriers can be accumulated early at the time of turn-on when the IE effect is large, and therefore, the switching loss at the time of turn-on can be decreased.

However, in the semiconductor device including the IGBT having the EGE-type active cell region, the holes serving as the carriers are discharged via the p-channel parasitic MOSFET at the time of turn-on, the IE effect is small, and the switching loss at the time of turn-on increases. This means that the potential of the channel region of the p-channel parasitic MOSFET rises at the time of turn-on of the IGBT included in the semiconductor device, which results in an ON state of the parasitic MOSFET to discharge the holes serving as the carriers. Specifically, as illustrated in FIG. 29, at the time of turn-on in the second comparative example, the hole current flows in the current path PT101 through the $n^-$-type drift region ND, the p-type floating region PF, and parts of the p-type floating region PF, the n-type hole barrier region NHB, and the p-type body region PB, the parts being close to each of the trench electrodes TG2 and TG3.

Although illustration is omitted, by calculation of a switching waveform at the time of turn-on by the use of TOAD (Technology Computer-Aided Design), it has been confirmed that the potential of the channel region of the p-channel parasitic MOSFET rises at the time of turn-on of the IGBT, which results in the discharge of the holes serving as the carriers. Also, by calculation of a hole concentration distribution in the semiconductor device at the time of turn-on by the use of the TOAD, it has been confirmed that the holes serving as the carriers are discharged via the p-channel parasitic MOSFET at the time of turn-on of the IGBT.

In this manner, in the semiconductor device including the IGBT having the EGE-type active cell region (semiconductor device according to the second comparative example), the holes serving as the carriers are discharged via the p-channel parasitic MOSFET at the time of turn-on, and therefore, it is difficult to decrease the switching loss at the time of turn-on.

As described above, in the semiconductor device including the IGBT having the EGE-type active cell region (semiconductor device according to the second comparative example), it is desired to prevent or suppress the rapid change of the current flowing in the IGBT at the time of turn-on and to decrease the switching loss at the time of turn-on.

<Main Characteristics and Effects of Present Embodiment>

The semiconductor device according to the present first embodiment includes the element portion PR1 provided in the hybrid cell region LCh serving as the EGE-type active cell region and the interposition portion PR2 provided in the inactive cell region LCi. The p-type floating region PF included in the interposition portion PR2 interposed between the two adjacent element portions PR1 is divided into two by the two trenches T4.

Specifically, the interposition portion PR2 provided in the inactive cell region LCi includes the p-type body region PB1 formed in a part of the semiconductor layer SLn, the part being located between the two trenches T4. The interposition portion PR2 provided in the inactive cell region LCi includes the two p-type floating regions PF1 formed in the two respective parts of the semiconductor layer SLn, the two parts being located on both sides of the p-type body region PB1 via the two respective trenches T4. The end portion of each of the two p-type floating regions PF1 on the lower surface Sb side is arranged on the lower surface Sb side in the Z axial direction with reference to the end portion of the p-type body region PB1 on the lower surface Sb side.

According to such a semiconductor device of the present first embodiment, the charge amount obtained when the gate voltage is saturated to the maximum value, that is, the gate charge amount in the switching waveform at the time of turn-on is larger than that in the semiconductor device of the second comparative example. That is, according to the semiconductor device of the present first embodiment, by newly providing the two trench electrodes TG4, the gate capacitance can be increased more than that of the semiconductor device of the second comparative example, so that the rapid change or the oscillation of the current flowing in the IGBT at the time of turn-on can be prevented or suppressed.

Also, according to such a semiconductor device of the present first embodiment, a width in the X axial direction of a part (p-type floating region PF1) of the p-type floating region PF, the part contacting the trench T3, can be shorter than that in the semiconductor device of the second comparative example without shortening the width Wi (see FIG. 2) of the inactive cell region LCi. Accordingly, according to the semiconductor device of the present first embodiment, a magnitude of the hole current flowing in the p-type floating region PF, that is, the p-channel parasitic MOSFET is smaller at the time of turn-on than that in the semiconductor device of the second comparative example. Further, according to such a semiconductor device of the present first embodiment, the hole concentration accumulated in the n-type hole barrier region NHB of the semiconductor layer SLn and a part (n⁻-type drift region ND) of the semiconductor layer SLn, the part being located on the lower surface Sb side with reference to the n-type hole barrier region NHB, is lower at the time of turn-on than that in the semiconductor device of the second comparative example. Accordingly, according to the semiconductor device of the present first embodiment, the IE effect can be enhanced further than that in the semiconductor device of the second comparative example, and the switching loss at the time of turn-on in the L load switching can be further decreased.

Figure 29:
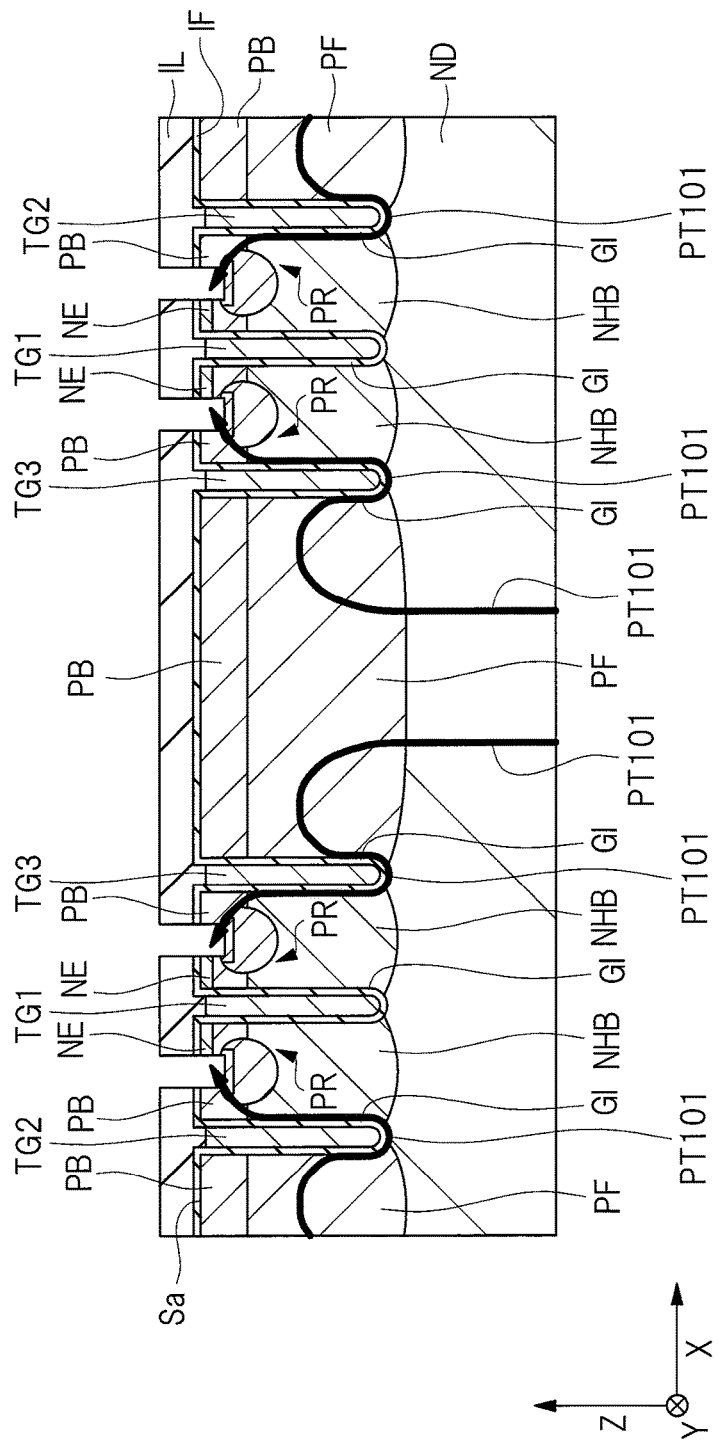
FIG. 29 is a cross-sectional view of a principal part of the semiconductor device according to the second comparative example.
Figure 30:
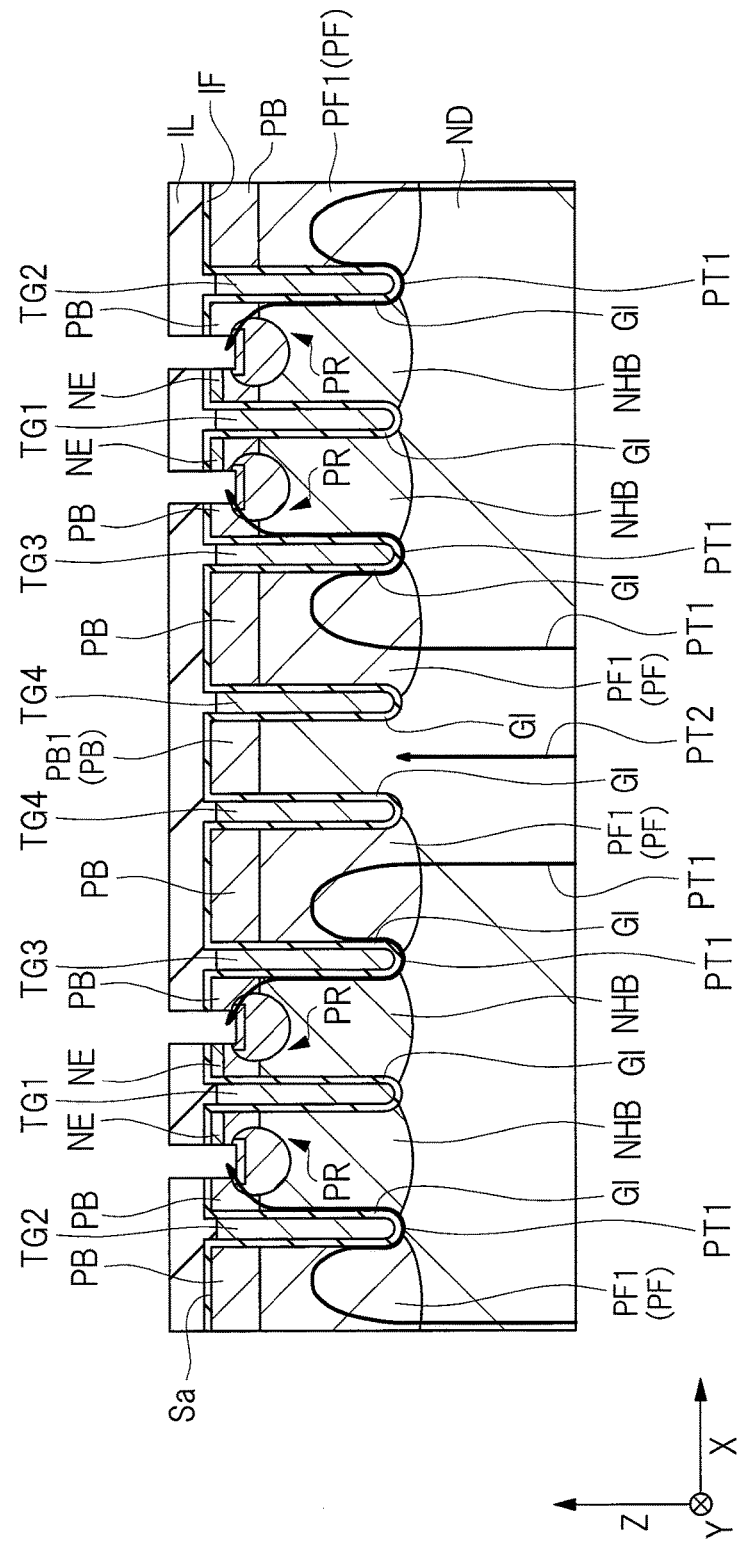
FIG. 30 is a cross-sectional view of a principal part of the semiconductor device according to the first embodiment.

FIG. 30 is a cross-sectional view of a principal part of the semiconductor device according to the first embodiment. FIG. 30 illustrates a current path PT1 of the hole current flowing in the p-type floating region PF1, that is, the p-channel parasitic MOSFET, at the time of turn-on, to be schematically overlapped. In FIGS. 29 and 30, note that the magnitude of the hole current in the second comparative example and the first embodiment is expressed by a magnitude of the width of the schematically-illustrated current path PT1.

As illustrated in FIG. 30, also in the present first embodiment, at the time of turn-on, the hole current flows in the current path PT1 passing from the n⁻-type drift region ND to the p-type floating region PF, and besides, passing through parts of the p-type floating region PF, the n-type hole barrier region NHB, and the p-type body region PB, the parts being close to each of the trench electrodes TG2 and TG3.

However, in comparison between FIG. 29 and FIG. 30, it has been found that the magnitude of the hole current flowing in the p-type floating region PF, that is, the p-channel parasitic MOSFET, is smaller in the present first embodiment than that in the second comparative example. It is considered that this is because the hole current expressed by a current path PT2 does not reach the emitter electrode EE in the part LCi2 included in the inactive cell region LCi.

In the semiconductor device according to the present first embodiment, note that the collector voltage VCE in the switching waveform at the time of turn-on decreases faster than that in the semiconductor device according to the second comparative example. Thus, according to the semiconductor device of the present first embodiment, the amount of the holes serving as the carriers to be discharged at the time of turn-on via the p-type floating region PF, that is, the p-channel parasitic MOSFET, can be suppressed further than that in the semiconductor device of the second comparative example, the IE effect can be improved, and an on-voltage can be decreased.

That is, in the semiconductor device according to the present first embodiment, a performance of a semiconductor device such as the IE effect can be improved more than that in the semiconductor device according to the second comparative example.

In the technique disclosed in the above-described Patent Document 3, note that the second trench having the buried first electrical conductor connected to an emitter electrode between two active cell regions. However, each of the active cell regions is not the EGE-type hybrid cell region but the GG-type active cell region described in the first comparative example. Also, in the technique disclosed in the above-described Patent Document 3, a lower surface of a floating p-type layer formed between the first trench and the second trench adjacent to each other is not arranged closer to a lower side than a lower surface of a floating p-type layer formed between the two second trenches.

Figure 31:
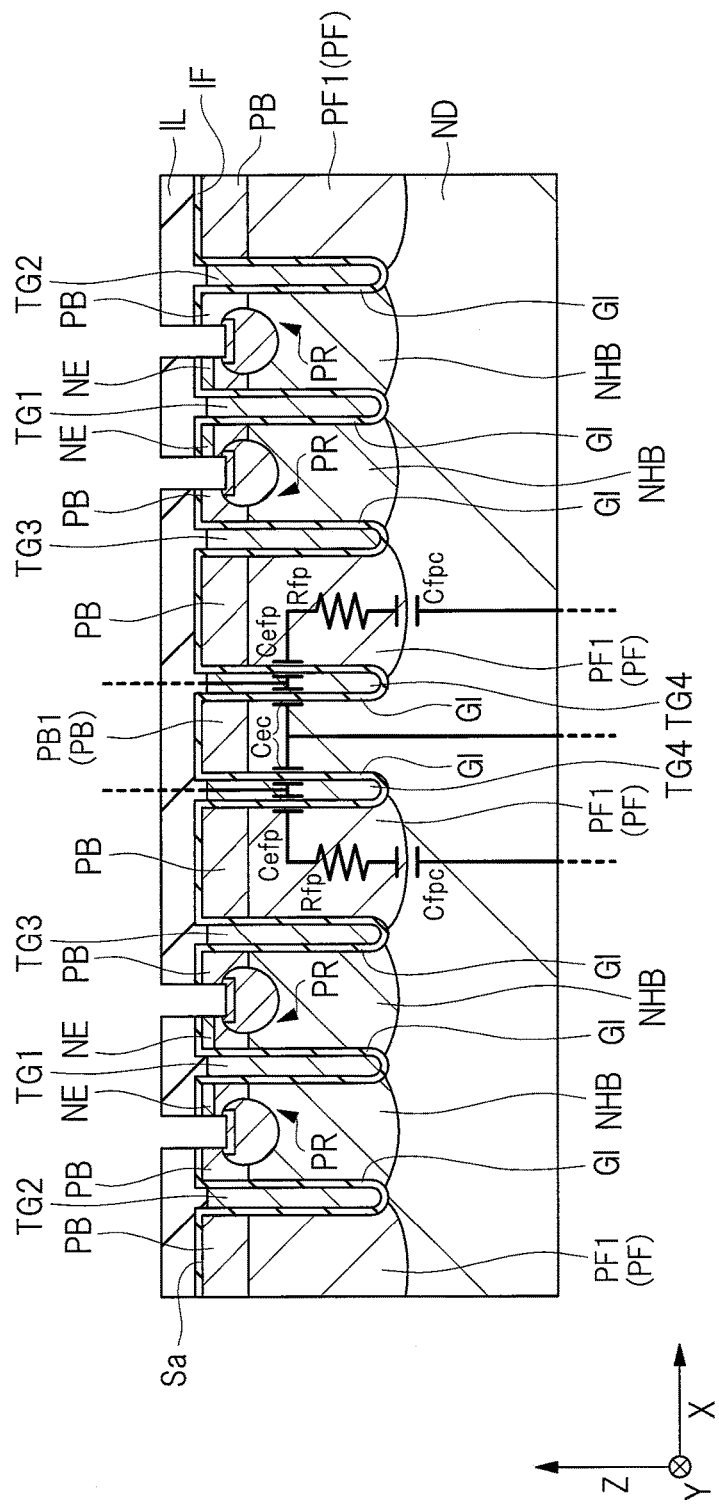
FIG. 31 is a cross-sectional view illustrating a snubber circuit formed in the semiconductor device according to the first embodiment to be overlapped.
Figure 32:
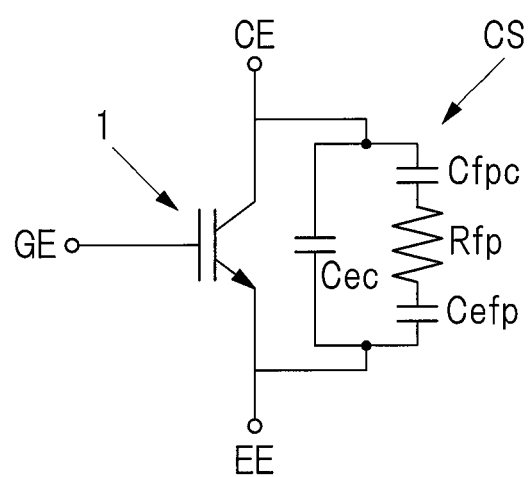
FIG. 32 is an equivalent circuit diagram of an IGBT to which the snubber circuit is connected.

FIG. 31 is a cross-sectional view illustrating a snubber circuit formed in the semiconductor device according to the first embodiment to be overlapped. FIG. 32 is an equivalent circuit diagram of the IGBT to which the snubber circuit is connected.

As illustrated in FIGS. 31 and 32, the two trench electrodes TG4 electrically connected to the emitter electrode EE are formed in the inactive cell region LCi, and the p-type floating region PF is divided by the two trench electrodes TG4, so that the IGBT1 is connected in parallel with a parasitic snubber portion CS serving as a snubber circuit. By the parallel connection of the IGBT1 with the parasitic snubber portion CS as described above, an effect of absorbing a rapid voltage change, that is, an effect of absorbing a large dv/dt even in a large change rate (dv/dt) of the voltage "v" with respect to the time "t", can be expected, and, for example, the EMI noise or others generated in the semiconductor device according to the present first embodiment can be decreased.

In the present first embodiment, note that the conductivity types of the respective semiconductor regions may be collectively changed to opposite conductivity types (the same goes for the following modification example and second embodiment).

<Modification Example of Semiconductor Device According to First Embodiment>

In the semiconductor device according to the first embodiment, in the part LCi2 included in the inactive cell region LCi, the n⁻-type drift region ND is formed in a part of the semiconductor layer SLn, the part being located between the two trenches T4 and being located on the lower surface Sb side with reference to the p-type body region PB1.

However, in the part LCi2 included in the inactive cell region LCi, an electron accumulation region EA serving as an n-type semiconductor region may be formed in a part of the semiconductor layer SLn, the part being located between the two trenches T4 and being located on the lower surface Sb side with reference to the p-type body region PB1. Such an example will be described as a modification example of the semiconductor device according to the first embodiment.

Figure 33:
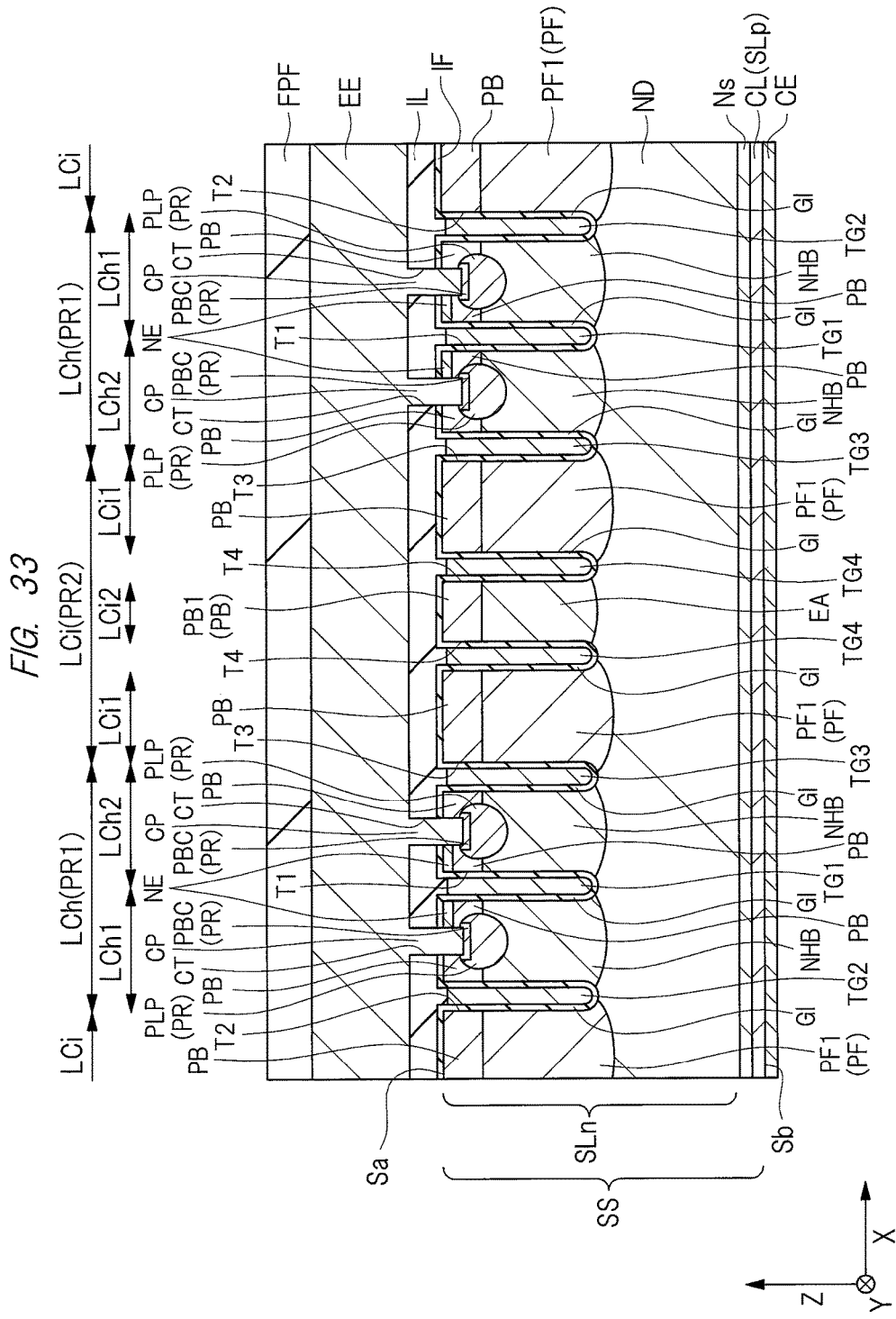
FIG. 33 is a cross-sectional view of a principal part of a semiconductor device according to a modification example of the first embodiment.

FIG. 33 is a cross-sectional view of a principal part of a semiconductor device according to a modification example of the first embodiment. Note that FIG. 33 corresponds to a cross-sectional view taken along a line A-A in FIGS. 2 and 3.

The semiconductor device according to the present modification example has a similar structure to that of the semiconductor device according to the first embodiment except that, in the part LCi2 included in the inactive cell region LCi, the electron accumulation region EA serving as an n-type semiconductor region is formed in a part of the semiconductor layer SLn, the part being located between the two trenches T4 and being located on the lower surface Sb side with reference to the p-type body region PB1. Thus, the semiconductor device according to the present modification example has a similar effect to that of the semiconductor device according to the first embodiment.

On the other hand, in the present modification example, as different from the first embodiment, in the part LCi2 included in the inactive cell region LCi, the electron accumulation region EA is formed in the part of the semiconductor layer SLn, the part being located between the two trenches T4 and being located on the lower surface Sb side with reference to the p-type body region PB1. That is, the interposition portion PR2 includes the electron accumulation region EA. The n-type impurity concentration in the electron accumulation region EA is higher than the n-type impurity concentration in a part (n⁻-type drift region ND) of the semiconductor layer SLn, the part being located on the lower surface Sb side with reference to the electron accumulation region EA.

In the present modification example, electrons are supplied from the electron accumulation region EA at the time of turn-on. In the present modification example, this manner can increase the amount of electrons to be supplied to a part (n⁻-type drift region ND) of the semiconductor layer SLn, the part being located below the p-type floating region PF1, more than the first embodiment, can more improve a function of a p/n/p bipolar transistor included in the IGBT, and can more improve the IE effect of the IGBT.

Also, in the present modification example, electrons are supplied from the electron accumulation region EA also at the time of turn-off. Thus, in the present modification example, the holes serving as the carriers which are accumulated in the n⁻-type drift region ND at the time of turn-on, that is, at the time of conduction, and which are discharged through the p-channel parasitic MOSFET at the time of turn-off are recombined with the electrons supplied from the electron accumulation region EA, and thus, can be eliminated rapidly, so that the operation speed at the time of turn-off can be increased.

Each of FIGS. 34 to 37 is a cross-sectional view of a principal part illustrating a step of manufacturing the semiconductor device according to the modification example of the first embodiment. Each of FIGS. 34 to 37 corresponds to a cross-sectional view taken along a line A-A in FIGS. 2 and 3 as similar to FIG. 33.

In the step of manufacturing the semiconductor device according to the present modification example, a similar step to, for example, a step described with reference to FIG. 5 in the step of manufacturing the semiconductor device according to the first embodiment is performed to prepare the semiconductor substrate SS.

Figure 34:
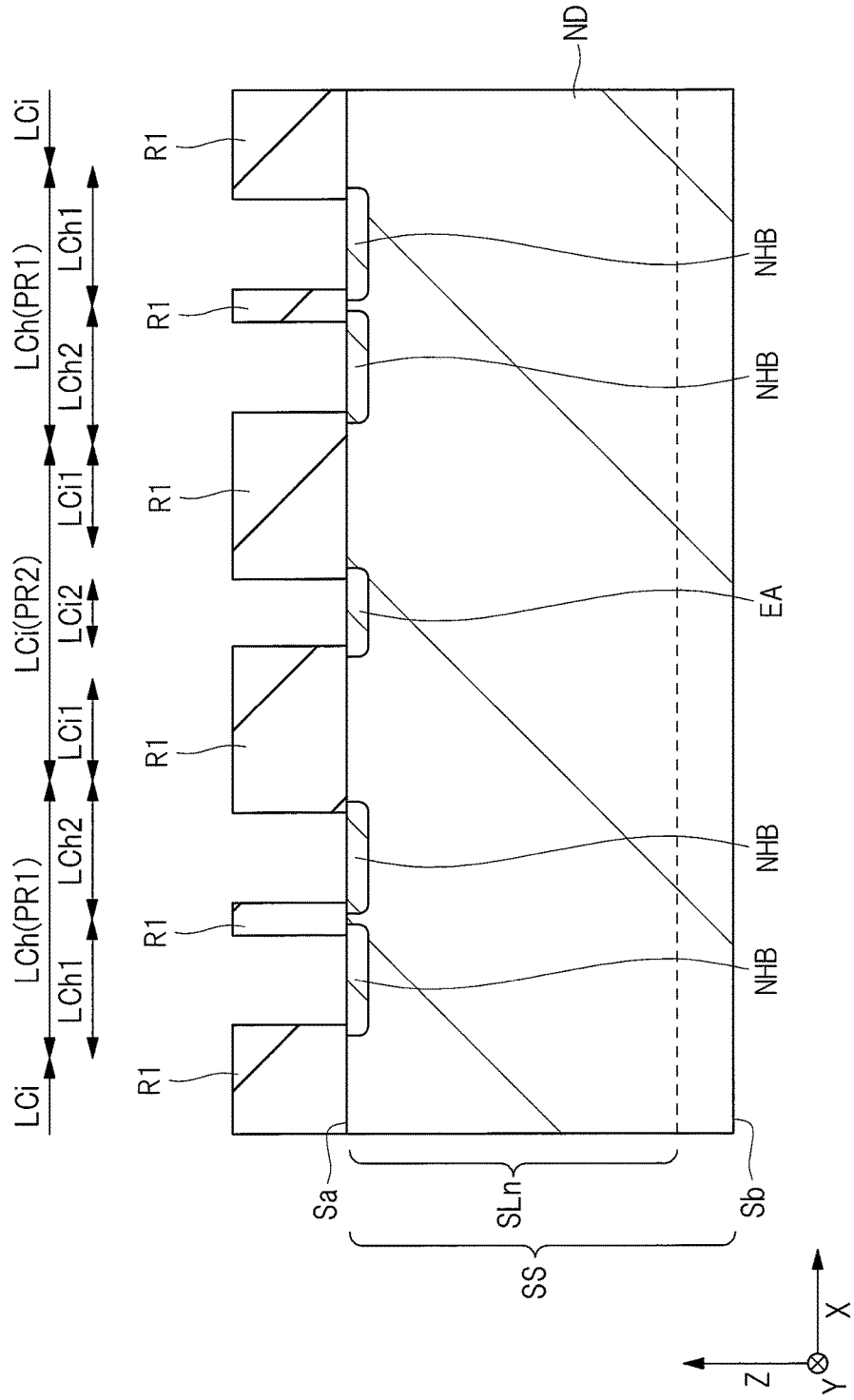
FIG. 34 is a cross-sectional view of a principal part illustrating a step of manufacturing the semiconductor device according to the modification example of the first embodiment.

Next, in the present modification example, the electron accumulation region EA is formed. For example, when a similar step to a step described with reference to FIG. 5 in the first embodiment is performed to form the n-type hole barrier region NHB, the electron accumulation region EA is formed in the part LCi2 included in the inactive cell region LCi by, for example, ion implantation while using the patterned resist film R1 as a mask as illustrated in FIG. 34. As for ion implantation conditions at this time, similar ion implantation conditions to those when the n-type hole barrier region NHB is formed can be used.

Figure 35:
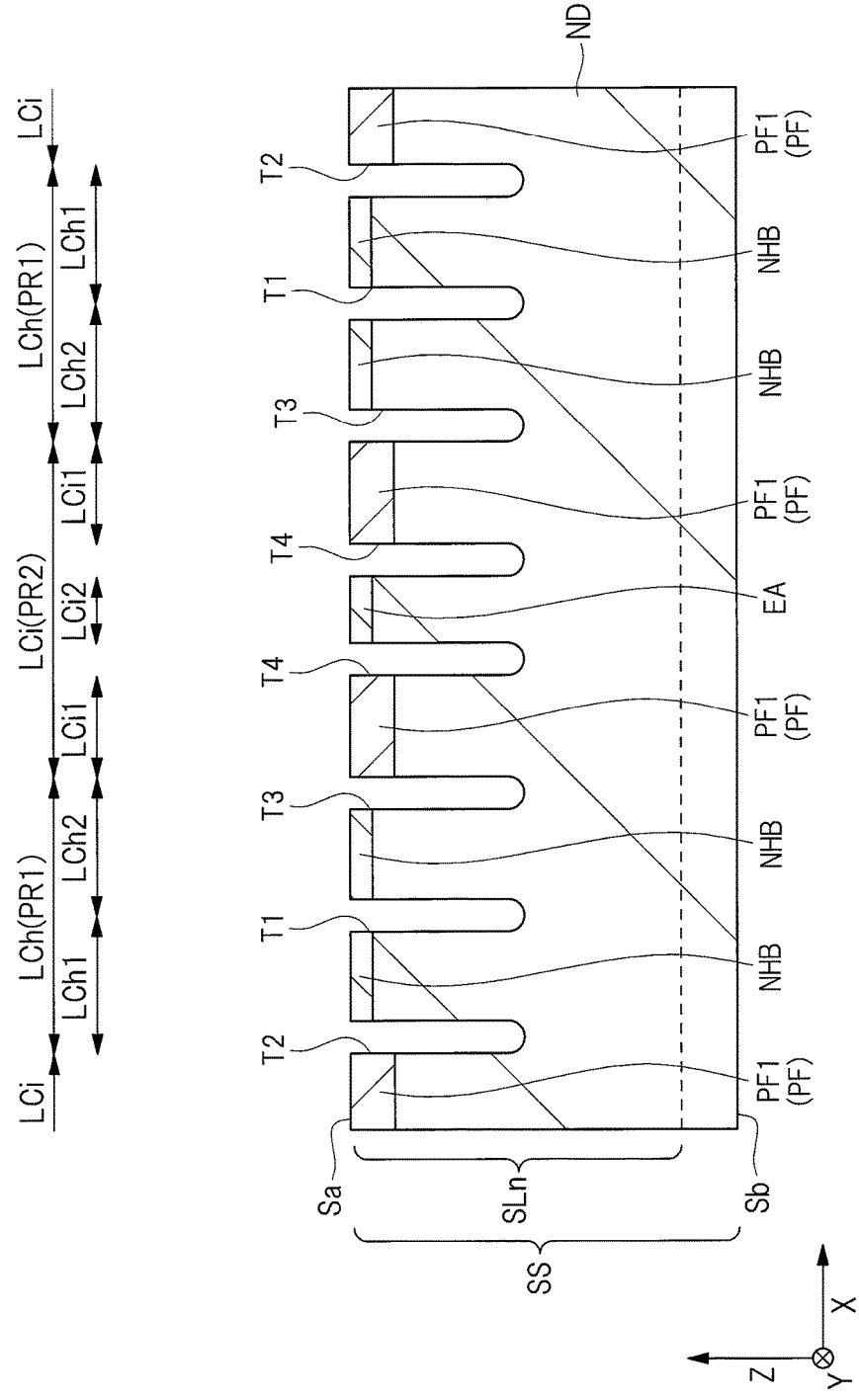
FIG. 35 is a cross-sectional view of a principal part illustrating a step of manufacturing the semiconductor device according to the modification example of the first embodiment.

Next, in the present modification example, similar steps to those described with reference to FIGS. 6 to 10 in the first embodiment are performed to form the trenches T1, T2, T3, and T4 as illustrated in FIG. 35. At this time, in the part LCi2 included in the inactive cell region LCi, the electron accumulation region EA is formed in a part of the semiconductor layer SLn on the upper surface Sa side, the part being located between the two trenches T4.

Figure 36:
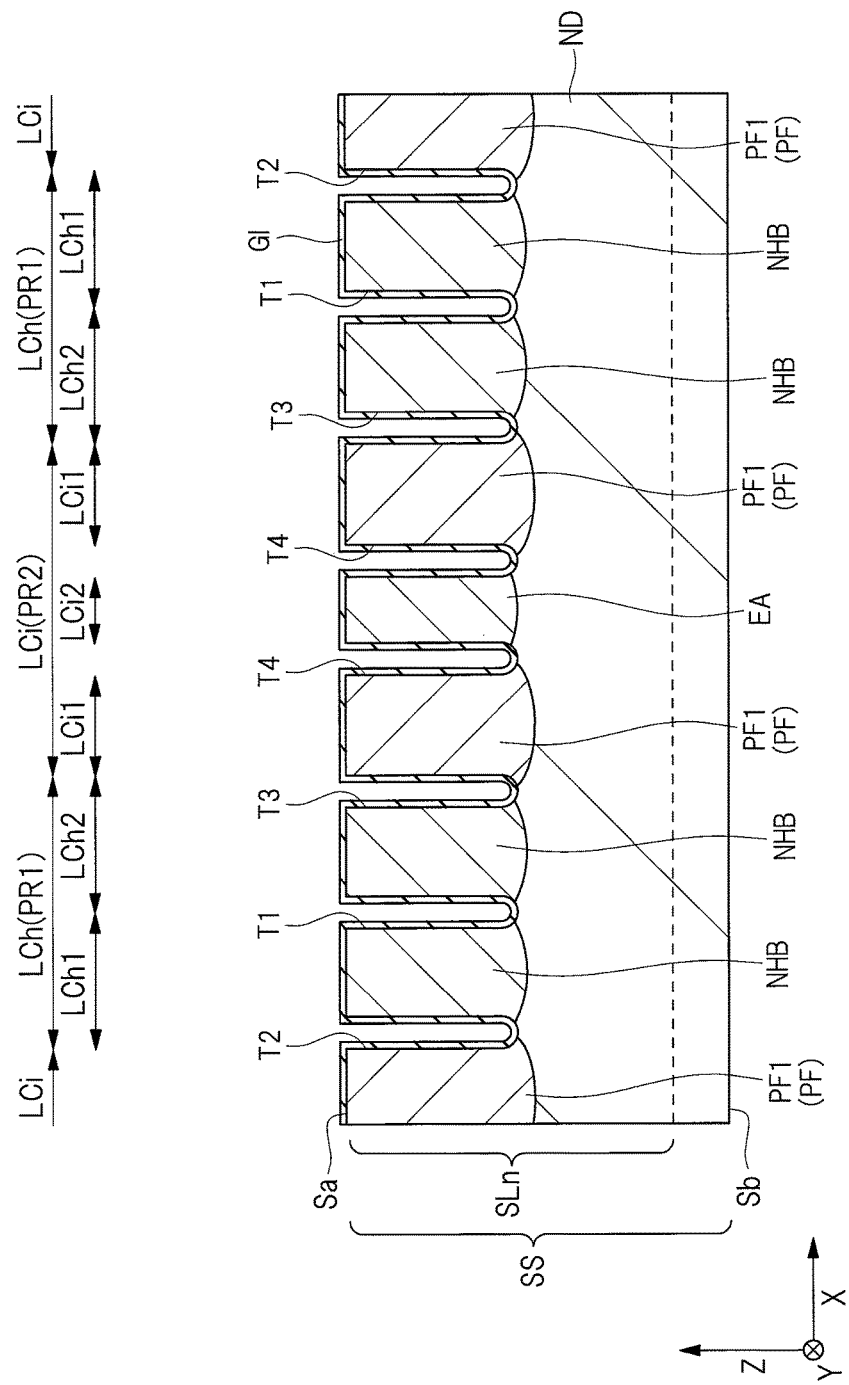
FIG. 36 is a cross-sectional view of a principal part illustrating a step of manufacturing the semiconductor device according to the modification example of the first embodiment.

Next, in the present modification example, drive-in diffusion (for example, at 1200° C. for about 30 minutes) is performed to the electron accumulation region EA. For example, when a similar step to a step described with reference to FIG. 11 in the first embodiment is performed to perform drive-in diffusion for the p-type floating regions PF and the n-type hole barrier regions NHB, drive-in diffusion is performed for the electron accumulation region EA as illustrated in FIG. 36. At this time, in the part LCi2 included in the inactive cell region LCi, the electron accumulation region EA is formed in a part of the semiconductor layer SLn, the part being located between the two trenches T4.

Figure 37:
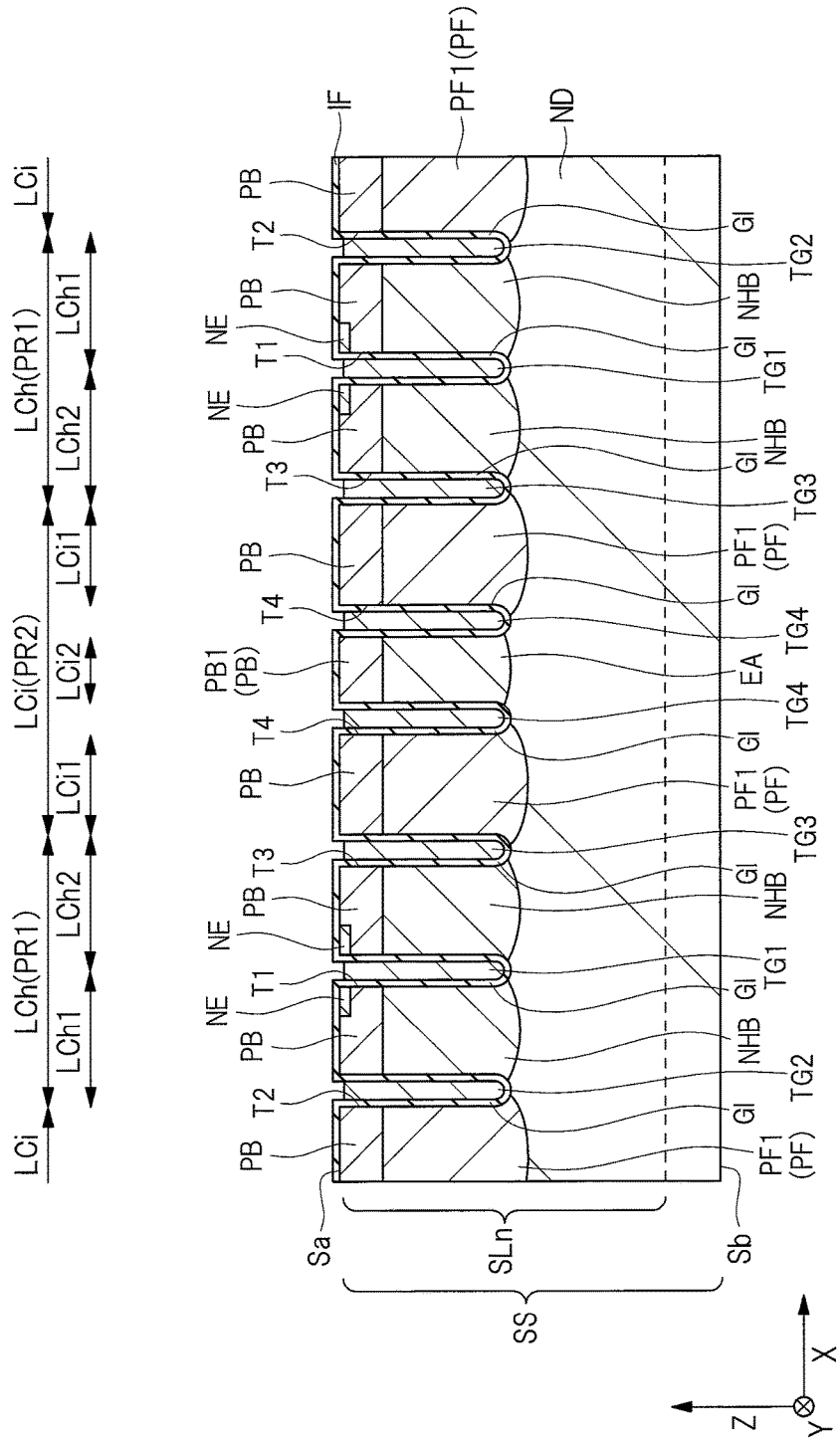
FIG. 37 is a cross-sectional view of a principal part illustrating a step of manufacturing the semiconductor device according to the modification example of the first embodiment.

Next, in the present modification example, similar steps to steps described with reference to FIGS. 12 to 15 in the first embodiment are performed to form the p-type body region PB as illustrated in FIG. 37. At this time, in the part LCi2 included in the inactive cell region LCi, the p-type body region PB1 serving as the p-type body region PB is formed in a part of the semiconductor layer SLn on the upper surface Sa side, the part being located between the two trenches T4, so as to contact the gate insulating film GI formed on each inner wall of the two trenches T4. The electron accumulation region EA is formed in a part of the semiconductor layer SLn, the part being located between the two trenches T4 and being located on the lower surface Sb side with reference to the p-type body region PB1.

In the step of manufacturing the semiconductor device according to the present modification example, when the n-type hole barrier regions NHB is formed in each of the hybrid sub-cell regions LCh1 and LCh2, the electron accumulation region EA can be formed in the inactive cell region LCi. Thus, in the step of manufacturing the semiconductor device according to the present modification example, it is not required to prepare an additional mask for forming the electron accumulation region EA, and it is not required to perform additional lithography for forming the electron accumulation region EA.

Then, similar steps to steps described with reference to FIGS. 16 to 20 and 4 in the first embodiment are performed, so that the semiconductor device according to the present modification example is completed.

Second Embodiment

In a second embodiment, the examination is made about division of the p-type floating region PF into three by the two trenches T4 and two trenches T5 in the inactive cell region LCi located between the two adjacent hybrid cell regions LCh.

<Configuration of Semiconductor Device>

Figure 38:
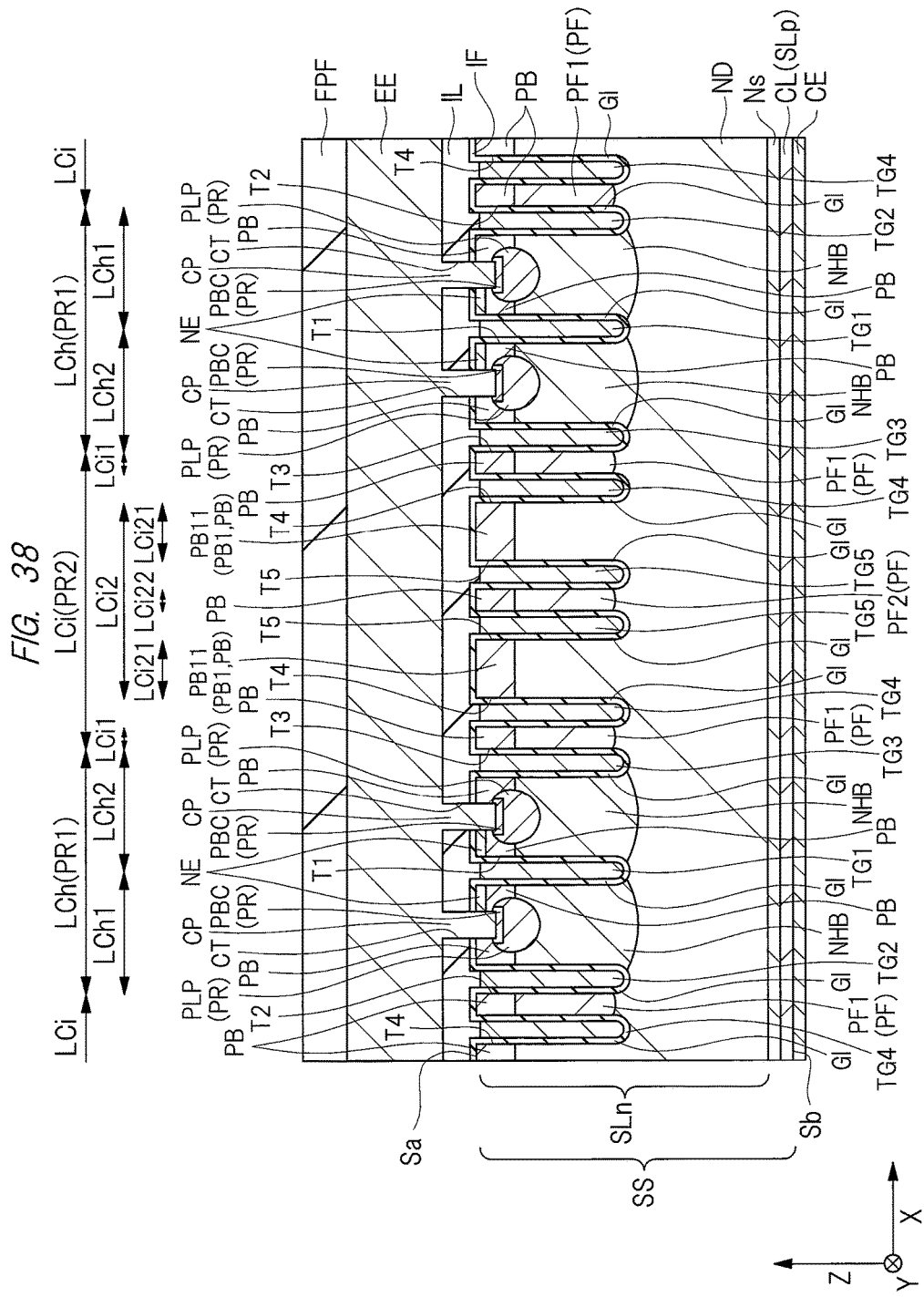
FIG. 38 is a cross-sectional view of a principal part of a semiconductor device according to a second embodiment.

FIG. 38 is a cross-sectional view of a principal part of a semiconductor device according to the second embodiment. Note that FIG. 38 corresponds to a cross-sectional view taken along a line A-A in FIGS. 2 and 3.

The semiconductor device according to the present second embodiment has a similar structure to that of the semiconductor device according to the first embodiment except that the p-type floating region PF is divided into three by the two trenches T4 and the two trenches T5 in the inactive cell region LCi located between the two adjacent hybrid cell regions LCh. Thus, the semiconductor device according to the present second embodiment has a similar effect to that of the semiconductor device according to the first embodiment.

In the present second embodiment, as similar to the first embodiment, the interposition portion PR2 formed in the inactive cell region LCi includes the two trenches T4, the two trench electrodes TG4, the two p-type floating regions PF1, and the p-type body region PB1.

On the other hand, in the present second embodiment, as different from the first embodiment, the interposition portion PR2 formed in the inactive cell region LCi includes the two trenches T5, two trench electrodes TG5, and a p-type floating region PF2 serving as the p-type floating region PF. Thus, in the present second embodiment, as different from the first embodiment, the p-type floating region PF is divided into two p-type floating regions PF1 and one p-type floating region PF2 by the two trenches T4 and the two trenches T5 in the inactive cell region LCi.

The two trenches T5 serving as trench portions are formed on the upper surface Sa side of the semiconductor substrate SS in the inactive cell region LCi. The two trenches T5 each reach the middle of the semiconductor layer SLn from the upper surface Sa of the semiconductor substrate SS, each extend in the Y axial direction when seen in a plan view, and are arranged to be spaced from each other in the X axial direction between the two trenches T4.

On each of inner walls of the two trenches T5, the gate insulating film GI is formed. Inside each of the two trenches T5, the trench electrode TG5 is formed on the gate insulating film GI so as to bury the trench T5. That is, each of the two trench electrodes TG5 is buried inside each of the trenches T5 via the gate insulating film GI. The trench electrodes TG5 are electrically connected to the emitter electrode EE. That is, the two trench electrodes TG5 included in the interposition portion PR2 are electrically connected to the emitter electrode EE. Note that each of the two trench electrodes TG5 is formed continuously along the Y axial direction when seen in a plan view.

In the inactive cell region LCi, the p-type body region PB is formed in a part of the semiconductor layer SLn on the upper surface Sa side, the part being located between the two trenches T5. The p-type body region PB contacts the gate insulating film GI formed on each of the inner walls of the two trenches T5.

In the inactive cell region LCi, the p-type floating region PF2 serving as the p-type floating region PF, which is a p-type semiconductor region, is formed in a part of the semiconductor layer SLn, the part being located between the two trenches T5 and being located below the p-type body region PB.

Also, in the inactive cell region LCi, the p-type body region PB11 serving as the p-type body region PB1 is formed in a part of the semiconductor layer SLn on the upper surface Sa side, the part being located between the trench T4 and the trench T5 adjacent to each other. However, in the inactive cell region LCi, the p-type floating region PF is not formed in a part of the semiconductor layer SLn, the part being located between the trench T4 and the trench T5 adjacent to each other and being located below the p-type body region PB.

That is, the interposition portion PR2 provided in the inactive cell region LCi includes the p-type floating region PF2 formed in a part of the semiconductor layer SLn, the part being located between the two trenches T5. The interposition portion PR2 provided in the inactive cell region LCi also includes the two p-type body regions PB11 each formed in two parts of the semiconductor layer SLn, the parts being located on both sides of the p-type floating region PF2 in the X axial direction via the two respective trenches T5.

The p-type body region PB1 is assumed to be formed of the two p-type body regions PB11. At this time, the p-type body region PB1 includes the two p-type body regions PB11, and the p-type body region PB1 including the two p-type body regions PB11 is formed in a part of the semiconductor layer SLn, the part being located between the two trenches T4, as similar to the first embodiment.

In the present second embodiment, as similar to the first embodiment, each of two parts of the inactive cell region LCi, each of the two parts being located between the trench T3 and trench T4 adjacent to each other, is referred to as the part LCi1. Also, a part of the inactive cell region LCi, the part being located between the two trenches T4, is referred to as the part LCi2.

On the other hand, in the present second embodiment, as different from the first embodiment, in the part LCi2, a part of located between the adjacent trench T4 and trench T5 is referred to as a part LCi21. Also, in the present second embodiment, as different from the first embodiment, a part of the part LCi2, the part being located between the two trenches T5 is referred to as a part LCi22.

At this time, an end portion (lower end), on the lower surface Sb side, of each of the two p-type floating regions PF1 formed in the two respective parts LCi1 is arranged on the lower surface Sb side (lower side) in the Z axial direction with reference to both end portions (lower ends), on the lower surface Sb side, of the two p-type body regions PB11 each formed in the two respective parts LCi21. Also, an end portion (lower end), on the lower surface Sb side, of the p-type floating region PF2 formed in the part LCi22 is arranged on the lower surface Sb side (lower side) in the Z axial direction with reference to both end portions (lower ends), on the lower surface Sb side, of the two p-type body regions PB11 formed in the two respective parts LCi21. In other words, the lower end of each of two p-type floating regions PF1 and one p-type floating region PF2 is arranged on the lower side in the Z axial direction with reference to both lower ends of the two respective p-type body regions PB11. In each of the two parts LCi21, the n$^-$-type drift region ND is formed in a part of the semiconductor layer SLn, the part being located below the p-type body region PB11.

<Method of Manufacturing Semiconductor Device>

In a method of manufacturing the semiconductor device according to the second embodiment, as different from the first embodiment, in the step of forming the two trenches T4, the two trenches T5 each of which reaches the middle of the semiconductor layer SLn from the upper surface Sa of the semiconductor substrate SS, each of which extends in the Y axial direction when seen in a plan view, and which are arranged to be spaced from each other between the two trenches T4 in the X axial direction are formed.

Also, in the method of manufacturing the semiconductor device according to the present second embodiment, as different from the method of manufacturing the semiconductor device according to the first embodiment, in the step of forming the two trench electrodes TG4, the two trench electrodes TG5 which are buried inside the two respective trenches T5 via the gate insulating film GI are formed.

Also, in the method of manufacturing the semiconductor device according to the present second embodiment, as different from the method of manufacturing the semiconductor device according to the first embodiment, in the step of forming the two p-type floating regions PF1, the p-type floating region PF2 is formed in a part of the semiconductor layer SLn, the part being located between the two trenches T5. And, in the inactive cell region LCi, the two p-type body regions PB11 are formed in two parts of the semiconductor layer SLn, the two parts being located on both sides of the p-type floating region PF2 in the X axial direction via the two respective trenches T5. The two p-type body regions PB11 are included in the p-type body region PB1.

At this time, the p-type floating region PF2 and the two p-type body regions PB11 are formed so that the end portion, on the lower surface Sb side, of each of two p-type floating regions PF1 and one p-type floating region PF2 is arranged on the lower surface Sb side in the Z axial direction with reference to both end portions, on the lower surface Sb side, of the two respective p-type body regions PB11.

Also, in the method of manufacturing the semiconductor device according to the present second embodiment, as different from the method of manufacturing the semiconductor device according to the first embodiment, the emitter electrode EE electrically connected to the two trench electrodes TG5 included in the interposition portion PR2 is formed as the emitter electrode EE.

Except the above-described points, the method of manufacturing the semiconductor device according to the present second embodiment can be similar to the method of manufacturing the semiconductor device according to the first embodiment.

<Main Characteristics and Effects of Present Embodiment>

As similar to the semiconductor device according to the first embodiment, the semiconductor device according to the present second embodiment includes the element portion PR1 provided in the hybrid cell region LCh serving as the EGE-type active cell region and the interposition portion PR2 provided in the inactive cell region LCi. On the other hand, in the second embodiment as different from the first embodiment in which the p-type floating region PF is divided into two, the p-type floating region PF included in the interposition portion PR2 interposed between the two adjacent element portions PR1 is divided into three by the two trenches T4 and the two trenches T5.

Specifically, the interposition portion PR2 provided in the inactive cell region LCi includes not only the two p-type floating regions PF1 but also the p-type floating region PF2 formed in a part of the semiconductor layer SLn, the part being located between the two trenches T5, and the two p-type body regions PB11 formed in two parts of the semiconductor layer SLn, the two parts being located on both sides of the p-type floating region PF2 via the two respective trenches T5. The end portion, on the lower surface Sb side, of each of two p-type floating regions PF1 and one p-type floating region PF2 is arranged on the lower surface Sb side in the Z axial direction with reference to both end portions, on the lower surface Sb side, of the two p-type body regions PB11.

According to such a semiconductor device of the present second embodiment, the charge amount obtained when the gate voltage is saturated to the maximum value, that is, the gate charge amount in the switching waveform at the time of turn-on is larger than that in the semiconductor device of the first embodiment. That is, according to the semiconductor device of the present second embodiment, by newly providing the two trench electrodes TG5 in addition to the two trench electrodes TG4, the gate capacitance can be increased more than that of the semiconductor device of the first embodiment, so that the rapid change or the oscillation of the current flowing in the IGBT at the time of turn-on can be further prevented or suppressed.

Also, according to such a semiconductor device of the present second embodiment, a width in the X axial direction of a part (p-type floating region PF1) of the p-type floating region PF, the part contacting the trench T3, can be shorter than that in the semiconductor device of the first embodiment without shortening the width Wi (see FIG. 2) of the inactive cell region LCi. Accordingly, according to the semiconductor device of the present second embodiment, a magnitude of the hole current flowing in the p-type floating region PF, that is, the p-channel parasitic MOSFET is further smaller at the time of turn-on than that in the semiconductor device of the first embodiment. Accordingly, according to the semiconductor device of the present second embodiment, the IE effect can be enhanced still further than that in the semiconductor device of the first embodiment, the on voltage can be further reduced, and the switching loss at the time of turn-on in the L load switching can be still further decreased.

Third Embodiment

In a third embodiment, the explanation will be made about the semiconductor device including the IGBT having the EGE-type active cell region in which the width of the active cell region is small, and in which the connection electrode and the trench electrode overlap when seen in a plan view.

<Configuration of Semiconductor Device>

First, a configuration of a semiconductor device according to the present third embodiment will be described.

A structure of the semiconductor device according to the present third embodiment is similar to the structure of the semiconductor device according to the first embodiment except that the connection electrode CP and each of the trench electrodes TG2 and TG3 overlap when seen in a plan view. Accordingly, hereinafter, different points from those in the structure of the semiconductor device according to the first embodiment will be described mainly.

Figure 39:
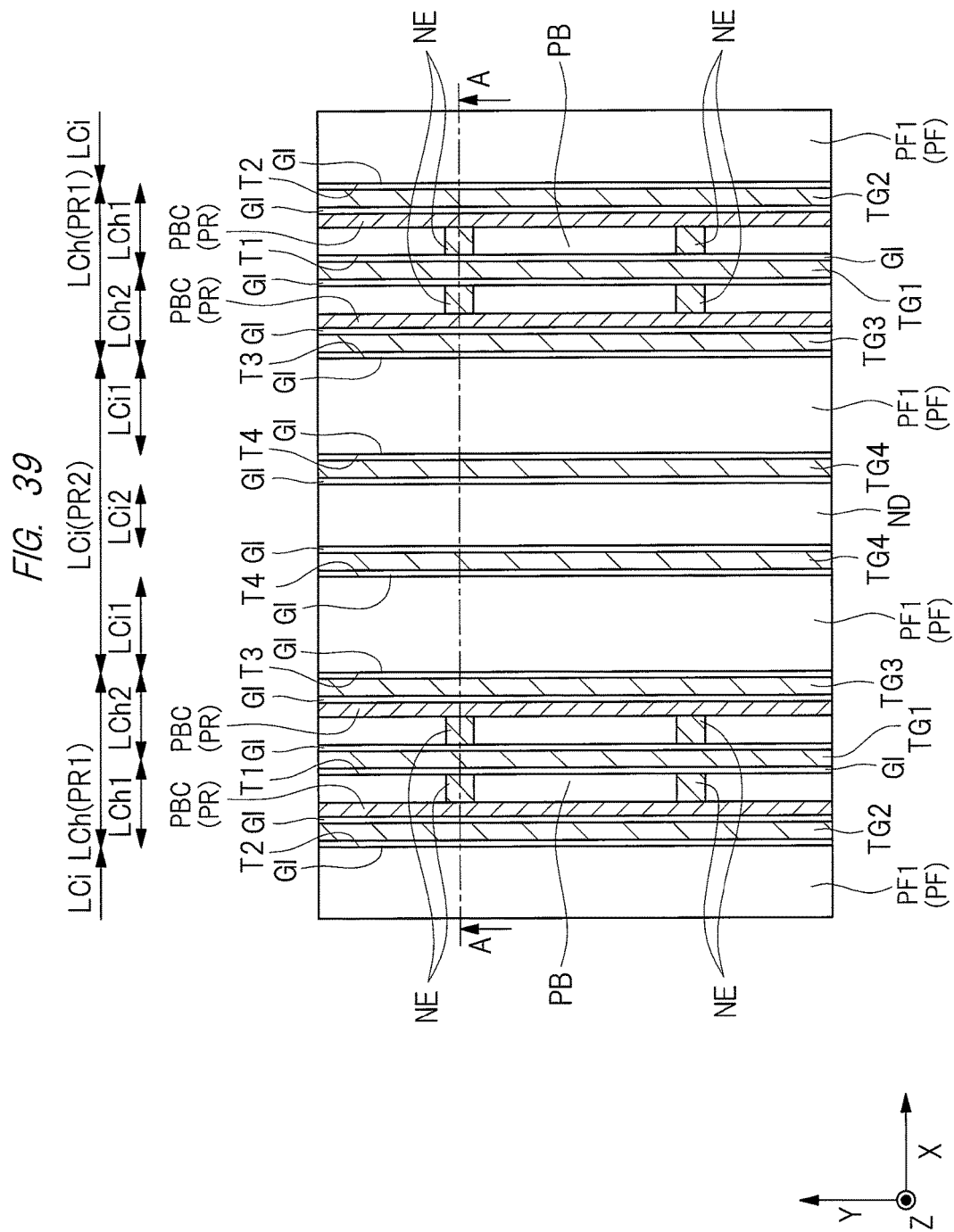
FIG. 39 is a plan view of a principal part of a semiconductor device according to a third embodiment.
Figure 40:
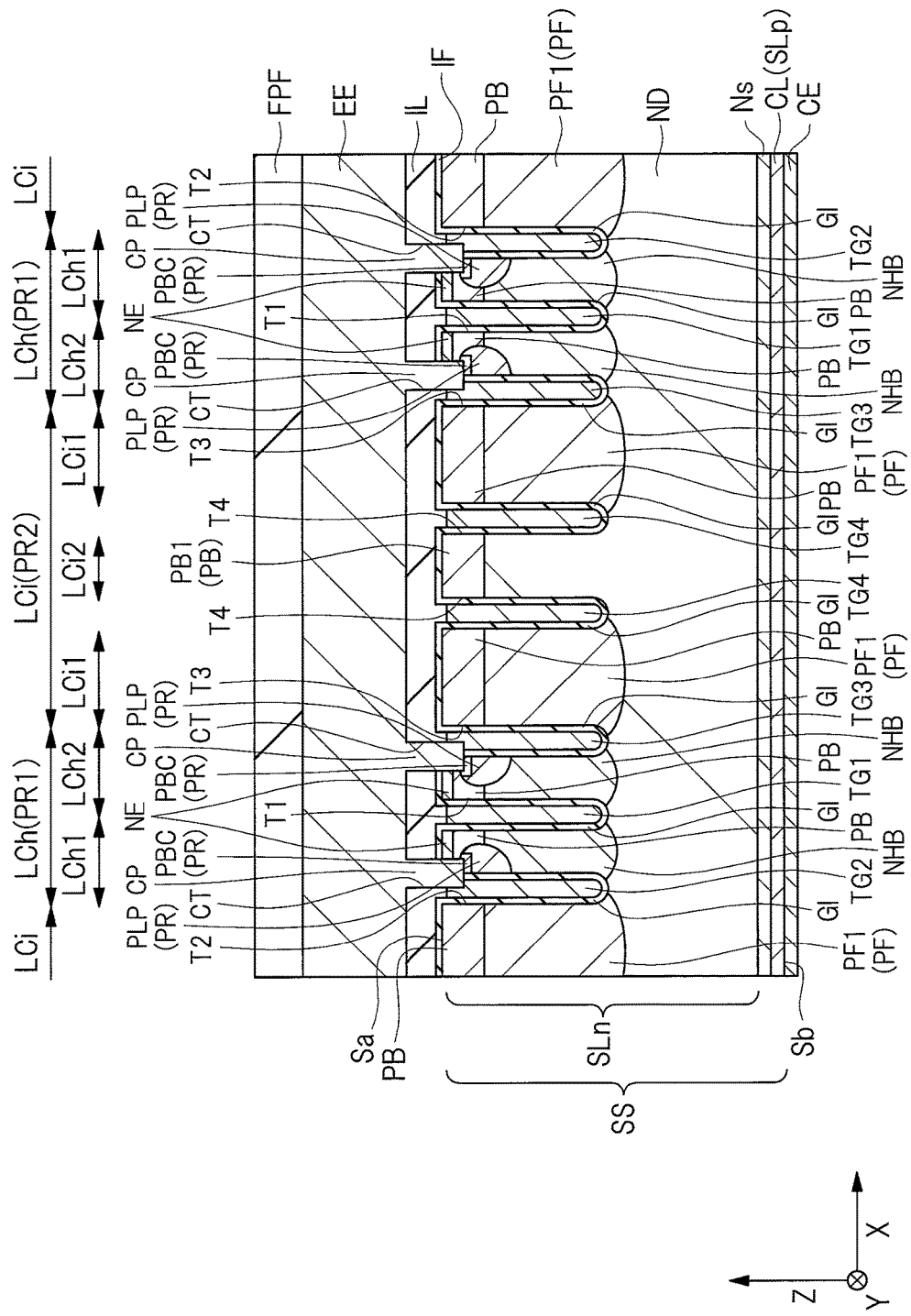
FIG. 40 is a cross-sectional view of a principal part of the semiconductor device according to the third embodiment.

FIG. 39 is a plan view of a principal part of the semiconductor device according to the third embodiment. FIG. 40 is a cross-sectional view of a principal part of the semiconductor device according to the third embodiment. FIG. 40 is a cross-sectional view taken along a line A-A in FIG. 39.

In the semiconductor device according to the present third embodiment, as similar to the semiconductor device according to the first embodiment, the plurality of $n^+$-type emitter regions NE are formed in each of the hybrid sub-cell regions LCh1 and LCh2.

Also, in the semiconductor device according to the present third embodiment, as similar to the semiconductor device according to the first embodiment, the $p^+$-type semiconductor region PR is formed continuously along the Y axial direction in the hybrid sub-cell region LCh1. Also, in the hybrid sub-cell region LCh1, the contact trench CT serving as an opening portion is formed continuously along the Y axial direction in the p-type body region PB. The contact trench CT reaches the $p^+$-type body contact region PBC arranged in the hybrid sub-cell region LCh1.

Also, in the semiconductor device according to the present third embodiment, as similar to the semiconductor device according to the first embodiment, the $p^+$-type semiconductor region PR is formed continuously along the Y axial direction in the hybrid sub-cell region LCh2. Also, in the hybrid sub-cell region LCh2, the contact trench CT serving as an opening portion is formed continuously along the Y axial direction in the p-type body region PB. The contact trench CT reaches the p$^+$-type body contact region PBC arranged in the hybrid sub-cell region LCh2.

On the other hand, in the semiconductor device according to the present third embodiment as different from the semiconductor device according to the first embodiment, the contact trench CT overlaps with the trench T2 in the hybrid sub-cell region LCh1 when seen in a plan view, and the contact trench CT overlaps with the trench T3 in the hybrid sub-cell region LCh2 when seen in a plan view.

Also, the p$^+$-type semiconductor region PR may contact the gate insulating film GI formed on the inner wall of the trench T2 in the hybrid sub-cell region LCh1, and the p$^+$-type semiconductor region PR may contact the gate insulating film GI formed on the inner wall of the trench T3 in the hybrid sub-cell region LCh2.

<Method of Manufacturing Semiconductor Device>

A method of manufacturing the semiconductor device according to the present third embodiment is similar to the method of manufacturing the semiconductor device according to the first embodiment explained with reference to FIGS. 5 to 20 except that the connection electrode CP and each of the trench electrodes TG2 and TG3 overlap when seen in a plan view. Accordingly, hereinafter, different points from those in the structure of the semiconductor device according to the first embodiment will be described mainly.

That is, in a step of manufacturing the semiconductor device according to the present third embodiment, the contact trench CT is formed so as to overlap with the trench T2 in the hybrid sub-cell region LCh1 when seen in a plan view, and the contact trench CT is formed so as to overlap with the trench T3 in the hybrid sub-cell region LCh2 when seen in a plan view.

In the present third embodiment as different from the first embodiment, note that, in each of the hybrid sub-cell regions LCh1 and LCh2, the contact trench CT is formed continuously along the Y axial direction when seen in a plan view, and the p$^+$-type semiconductor region PR is formed continuously along the Y axial direction when seen in a plan view.

<Main Characteristics and Effects of Present Embodiment>

In the semiconductor device according to the present third embodiment, as similar to the semiconductor device according to the first embodiment, the p-type floating region PF included in the interposition portion PR2 interposed between the two adjacent element portions PR1 is divided into two by the two trenches T4.

Accordingly, in the present third embodiment, as similar to the first embodiment, the gate capacitance can be increased, and the rapid change or oscillation of current flowing in the IGBT at the time of turn-on can be prevented or suppressed. Also, the IE effect can be enhanced, the on-voltage can be decreased, and the switching loss at the time of turn-on in the L load switching can be decreased.

On the other hand, in the present third embodiment, as different from the first embodiment, the connection electrode CP and the trench electrode TG2 formed in the hybrid sub-cell region LCh1 overlap when seen in a plan view, and the connection electrode CP and the trench electrode TG3 formed in the hybrid sub-cell region LCh2 overlap. That is, in the present third embodiment, each width of parts of the semiconductor layer SLn, the parts being between the trench T1 and the trench T2 and between the trench T1 and the trench T3, are shorter than those of the first embodiment.

Thus, in the present third embodiment, hole discharge resistance is higher than that in the first embodiment, the holes are easy to be accumulated in a part of the n$^-$-type drift region ND on the emitter electrode EE side, an implantation efficiency of the electrons from the emitter electrode EE can be increased, and the IE effect can be further enhanced. Accordingly, in the present third embodiment, performance of the semiconductor device can be further improved than that in the first embodiment.

Fourth Embodiment

The IGBT chip provided in the semiconductor device according to the first embodiment is a semiconductor device as an IGBT chip having an EGE-type active cell region, and the p$^+$-type semiconductor region PR is formed continuously along the Y axial direction in each of the hybrid cell regions LCh.

On the other hand, since the IGBT chip provided in the semiconductor device according to the first embodiment may be only required to be a semiconductor device as an IGBT chip having an EGE-type active cell region, a plurality of p$^+$-type semiconductor regions PR may be arranged to be spaced from each other in the Y axial direction in each of the hybrid cell regions LCh. Such an example will be described as a semiconductor device according to a fourth embodiment.

Figure 41:
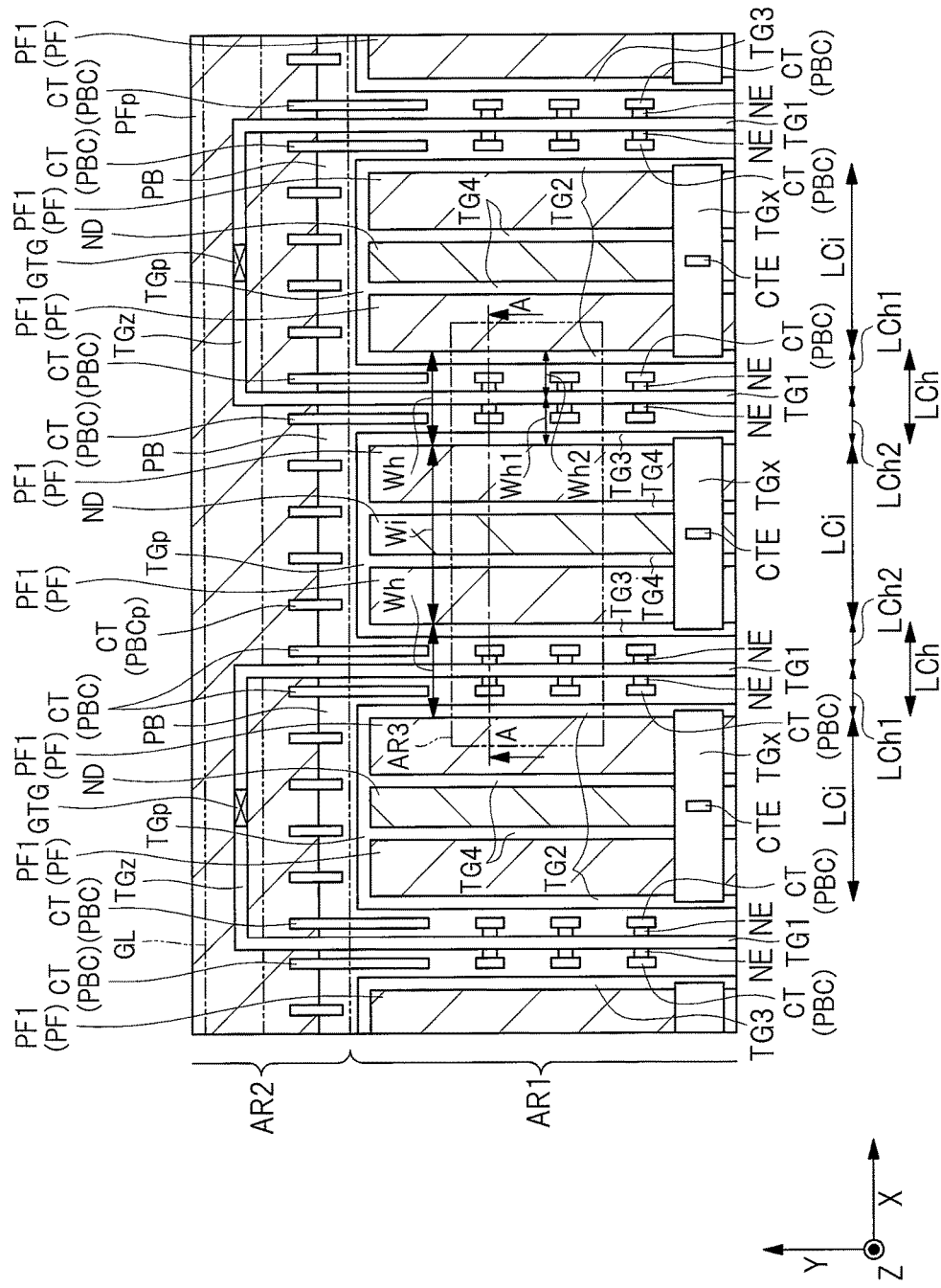
FIG. 41 is a plan view of a principal part of a semiconductor device according to a fourth embodiment.
Figure 42:
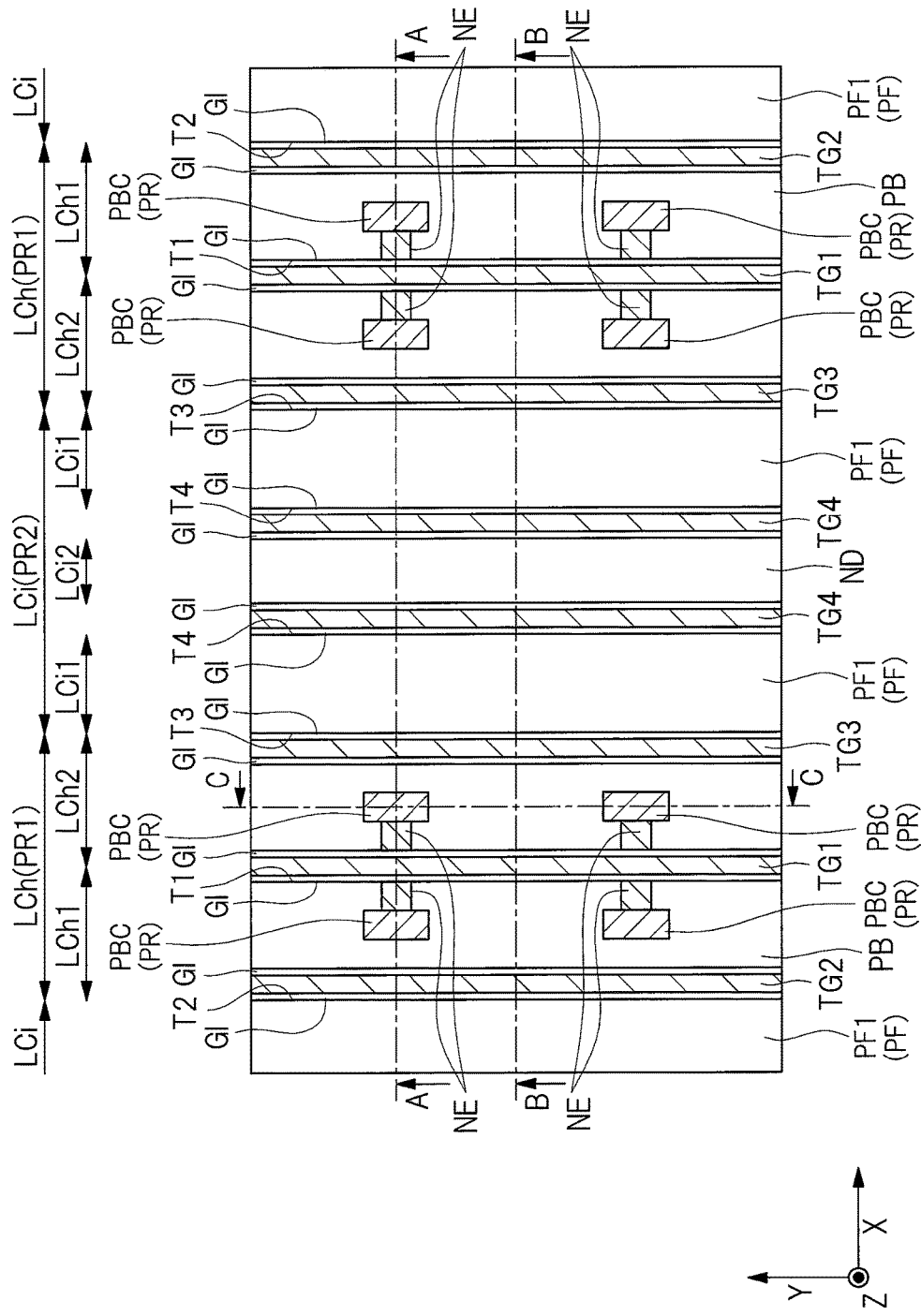
FIG. 42 is a plan view of a principal part of the semiconductor device according to the fourth embodiment.
Figure 43:
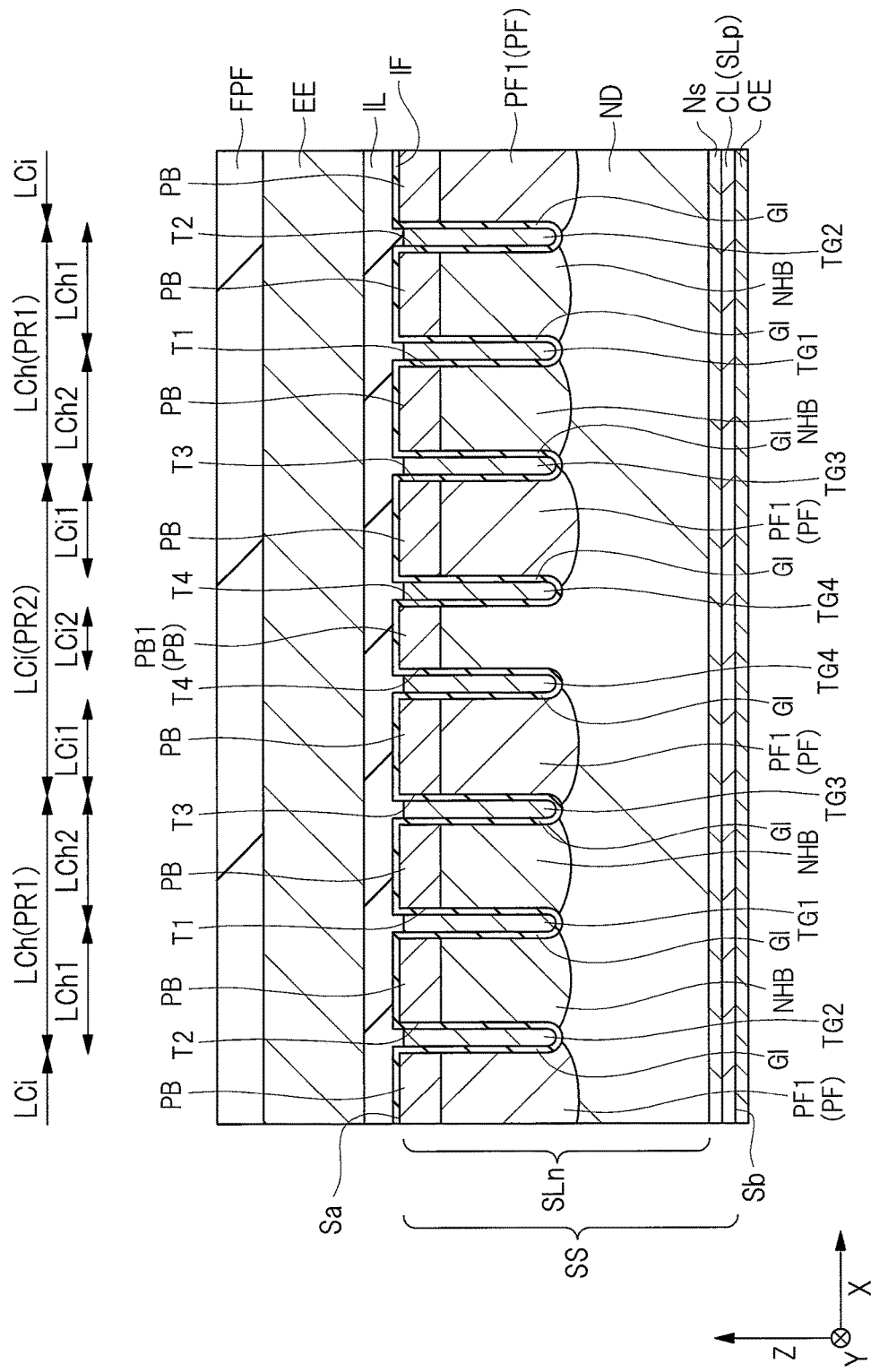
FIG. 43 is a cross-sectional view of a principal part of the semiconductor device according to the fourth embodiment.
Figure 44:
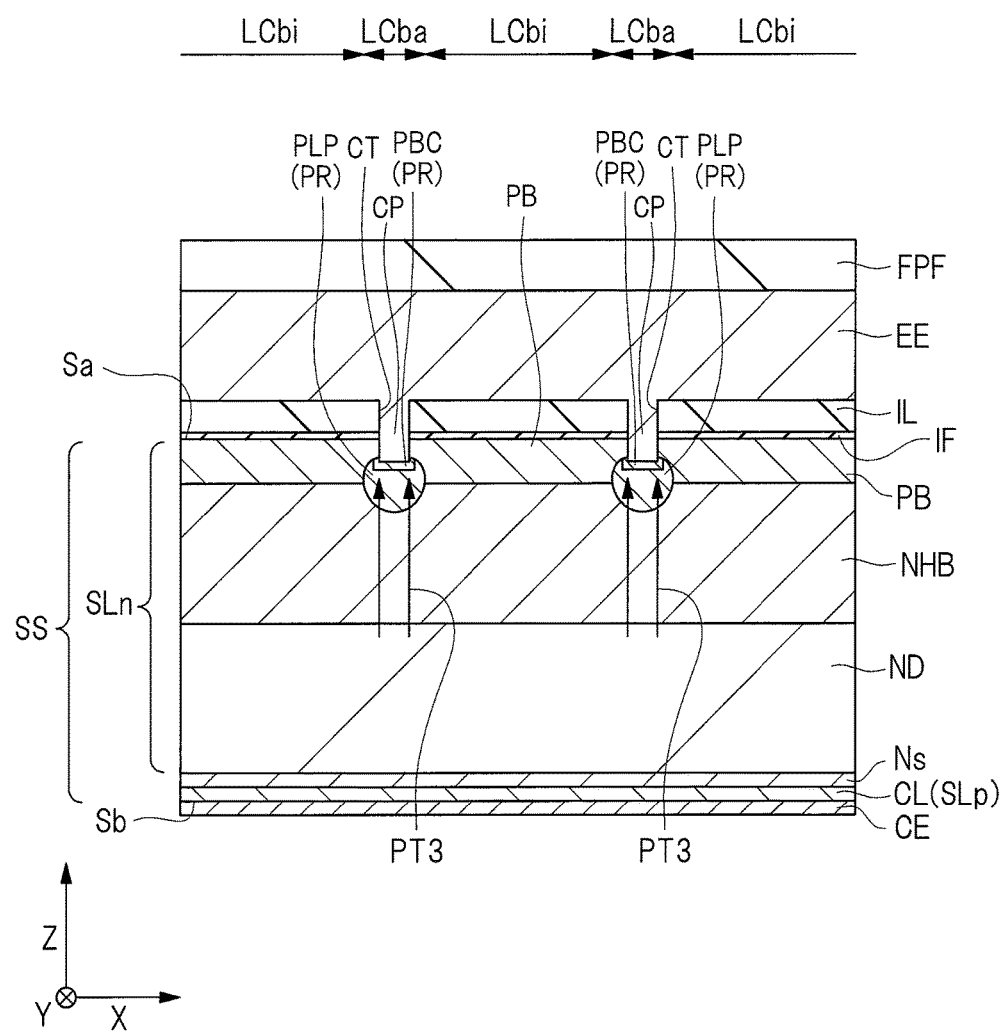
FIG. 44 is a cross-sectional view of a principal part of the semiconductor device according to the fourth embodiment.
Figure 45:
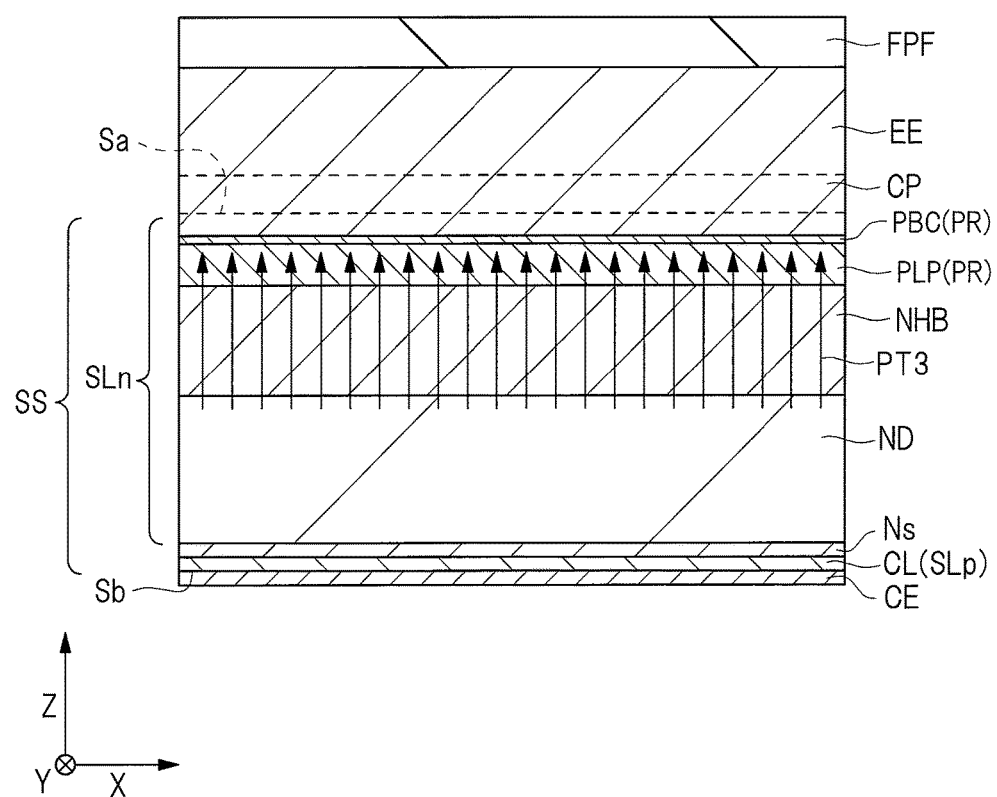
FIG. 45 is a cross-sectional view of a principal part of the semiconductor device according to the first embodiment.

Each of FIGS. 41 and 42 is a plan view of a principal part of the semiconductor device according to the fourth embodiment. Each of FIGS. 43 and 44 is a cross-sectional view of a principal part of the semiconductor device according to the fourth embodiment. FIG. 45 is the illustration for comparison, and is a cross-sectional view of a principal part of the semiconductor device according to the first embodiment. FIG. 43 is a cross-sectional view taken along a line B-B in FIG. 42, FIG. 44 is a cross-sectional view taken along a line C-C in FIG. 42, and FIG. 45 is a cross-sectional view taken along a line C-C in FIG. 3. Note that each cross-sectional view taken along a line A-A illustrated in FIGS. 41 and 42 is similar to the cross-sectional view illustrated in FIG. 4.

In the present fourth embodiment, in the hybrid sub-cell region LCh1, a plurality of p$^+$-type semiconductor regions PR each including the p$^+$-type body contact region PBC and the p$^+$-type latch-up prevention region PLP are provided. In the hybrid sub-cell region LCh1, each of the plurality of p$^+$-type semiconductor regions PR is formed in a part of the semiconductor layer SLn, the part being located between the trench T1 and the trench T2, and contacts the p-type body region PB. In the hybrid sub-cell region LCh1, the p-type impurity concentration in the plurality of p$^+$-type semiconductor regions PR is higher than the p-type impurity concentration in the p-type body region PB. The emitter electrode EE is electrically connected to the p-type body region PB via the plurality of p$^+$-type semiconductor regions PR.

In the hybrid sub-cell region LCh1, the plurality of p$^+$-type semiconductor regions PR are arranged to be spaced from each other in the Y axial direction when seen in a plan view. Accordingly, the on-voltage of the semiconductor chip CHP can be decreased, and the switching loss at the time of turn-on in the L load switching can be decreased.

Also, in the hybrid sub-cell region LCh1, the plurality of contact trenches CT serving as opening portions are formed in the interlayer insulating film IL and the p-type body region PB. The plurality of contact trenches CT are arranged to be spaced from each other in the Y axial direction when seen in a plan view. In each of the plurality of contact trenches CT, each of the plurality of connection electrodes CP is buried. Also, in the hybrid sub-cell region LCh1, the emitter electrode EE is electrically connected to the n$^+$-type emitter region NE and the plurality of p$^+$-type semiconductor regions PR via the plurality of connection electrodes CP.

Also, in the present fourth embodiment, in the hybrid sub-cell region LCh2, the plurality of p$^+$-type semiconductor regions PR each including the p$^+$-type body contact region PBC and the p$^+$-type latch-up prevention region PLP are provided. In the hybrid sub-cell region LCh2, each of the plurality of p$^+$-type semiconductor regions PR is formed in a part of the semiconductor layer SLn, the part being located between the trench T1 and the trench T3, and contacts the p-type body region PB. In the hybrid sub-cell region LCh2, the p-type impurity concentration in the plurality of p$^+$-type semiconductor regions PR is higher than the p-type impurity concentration in the p-type body region PB. The emitter electrode EE is electrically connected to the p-type body region PB via the plurality of p$^+$-type semiconductor regions PR.

In the hybrid sub-cell region LCh2, the plurality of p$^+$-type semiconductor regions PR are arranged to be spaced from each other in the Y axial direction when seen in a plan view. Accordingly, the on-voltage of the semiconductor chip CHP can be decreased, and the switching loss at the time of turn-on in the L load switching can be decreased.

Also, in the hybrid sub-cell region LCh2, the plurality of contact trenches CT serving as opening portions are formed in the interlayer insulating film IL and the p-type body region PB. The plurality of contact trenches CT are arranged to be spaced from each other in the Y axial direction when seen in a plan view. In each of the plurality of contact trenches CT, each of the plurality of connection electrodes CP is buried. Also, in the hybrid sub-cell region LCh2, the emitter electrode EE is electrically connected to the n$^+$-type emitter region NE and the p$^+$-type semiconductor regions PR via the plurality of connection electrodes CP.

As illustrated in FIG. 44, in each of the hybrid sub-cell regions LCh1 and LCh2, a region provided with the p$^+$-type semiconductor region PR in the Y axial direction, that is, an active section LCba, and a region not provided with the p$^+$-type semiconductor region PR in the Y axial direction, that is, an inactive section LCbi, are alternately arranged.

Preferably, in the present fourth embodiment, in the hybrid sub-cell region LCh1, each of the plurality of n$^+$-type emitter regions NE is arranged at the same position as that of each of the plurality of p$^+$-type semiconductor regions PR in the Y axial direction. Also, preferably, in the present fourth embodiment, in the hybrid sub-cell region LCh2, each of the plurality of n$^+$-type emitter regions NE is arranged at the same position as that of each of the plurality of p$^+$-type semiconductor regions PR in the Y axial direction.

As described above with reference to FIGS. 2 and 3, and as illustrated in FIG. 45, note that, in the first embodiment, the p$^+$-type semiconductor region PR is formed continuously along the Y axial direction in each of the hybrid sub-cell regions LCh1 and LCh2.

<Method of Manufacturing Semiconductor Device>

A method of manufacturing the semiconductor device according to the present fourth embodiment is similar to the method of manufacturing the semiconductor device according to the first embodiment described with reference to FIGS. 5 to 20 except that, in each of the hybrid sub-cell regions LCh1 and LCh2, the plurality of contact trenches CT are formed, and that the plurality of p$^+$-type semiconductor regions PR are formed.

That is, in a step of manufacturing the semiconductor device according to the present fourth embodiment, in each of the hybrid sub-cell regions LCh1 and LCh2, the plurality of contact trenches CT are arranged to be spaced from each other in the Y axial direction when seen in a plan view. Also, in the step of manufacturing the semiconductor device according to the present fourth embodiment, in each of the hybrid sub-cell regions LCh1 and LCh2, the p$^+$-type body contact region PBC serving as a p-type semiconductor region is formed in a part of the p-type body region PB, the part being exposed to a bottom surface of each of the plurality of contact trenches CT. Also, the p$^+$-type latch-up prevention region PLP is formed below each of the plurality of p$^+$-type body contact regions PBC. Thus, in the step of manufacturing the semiconductor device according to the present fourth embodiment, in each of the hybrid sub-cell regions LCh1 and LCh2, the p$^+$-type semiconductor regions PR each including the p$^+$-type body contact region PBC and the p$^+$-type latch-up prevention region PLP are arranged to be spaced from each other in the Y axial direction when seen in a plan view.

In this manner, in the step of manufacturing the semiconductor device according to the present fourth embodiment, the plurality of contact trenches CT arranged to be spaced from each other in the Y axial direction when seen in a plan view are formed. Then, the plurality of p$^+$-type semiconductor regions PR arranged to be spaced from each other in the Y axial direction when seen in a plan view can be formed while using the interlayer insulating film IL provided with the plurality of contact trenches CT as a mask. Thus, in the step of manufacturing the semiconductor device according to the present fourth embodiment, it is not required to prepare an additional mask for forming the plurality of p$^+$-type semiconductor regions PR, and it is not required to prepare additional lithography for forming the plurality of p$^+$-type semiconductor regions PR.

<Main Characteristics and Effects of Present Embodiment>

In the semiconductor device according to the present fourth embodiment, as similar to the semiconductor device according to the first embodiment, the p-type floating region PF included in the interposition portion PR2 interposed between the two adjacent element portions PR1 is divided into two by the two trenches T4.

Accordingly, in the present fourth embodiment, as similar to the first embodiment, the gate capacitance can be increased, and the rapid change or oscillation of current flowing in the IGBT at the time of turn-on can be prevented or suppressed. Also, the IE effect can be enhanced, the on-voltage can be decreased, and the switching loss at the time of turn-on in the L load switching can be decreased.

On the other hand, in the present fourth embodiment, as different from the first embodiment, the plurality of contact trenches CT are arranged to be spaced from each other in the Y axial direction when seen in a plan view, and the p$^+$-type semiconductor regions PR are arranged to be spaced from each other in the Y axial direction when seen in a plan view.

As illustrated in FIG. 45, in the semiconductor device according to the first embodiment, in the hybrid cell region LCh, the p$^+$-type body contact region PBC is formed continuously in the Y axial direction when seen in a plan view, and the p$^+$-type body contact region PBC in a part arranged at any position in the Y axial direction also contacts the emitter electrode EE. Thus, in the semiconductor device according to the first embodiment, the p-type body region PB in a part arranged at any position in the Y axial direction is also electrically connected to the emitter electrode EE via the p$^+$-type body contact region PBC on the part. Accordingly, as illustrated as a current path PT3 in FIG. 45, in the semiconductor device according to the first embodiment, the holes are discharged to the emitter electrode EE also from the n⁻-type drift region ND in a part arranged at any position in the Y axial direction in the hybrid cell region LCh.

On the other hand, in the semiconductor device according to the present fourth embodiment, in comparison to the semiconductor device according to the first embodiment, the plurality of contact trenches CT are arranged to be spaced from each other in the Y axial direction when seen in a plan view, and the p⁺-type semiconductor regions PR are arranged to be spaced from each other in the Y axial direction when seen in a plan view. Thus, as illustrated as the current path PT3 in FIG. 44, in the semiconductor device according to the fourth embodiment, in the hybrid cell region LCh, the holes are discharged to the emitter electrode EE only from the n⁻-type drift region ND in a part arranged in the active section LCba.

Thus, in the present fourth embodiment, hole discharge resistance is higher than that in the first embodiment, the holes are easy to be accumulated in a part of the n⁻-type drift region ND on the emitter electrode EE side, an implantation efficiency of the electrons from the emitter electrode EE can be increased, and the IE effect can be further enhanced. Accordingly, in the present fourth embodiment, performance of the semiconductor device can be further improved than that in the first embodiment.

Fifth Embodiment

In a fifth embodiment, the explanation is made about an example of a module which has a plurality of semiconductor chips each including the semiconductor device according to the first embodiment are included and in which the plurality of semiconductor chips are connected in parallel with each other.

Figure 46:
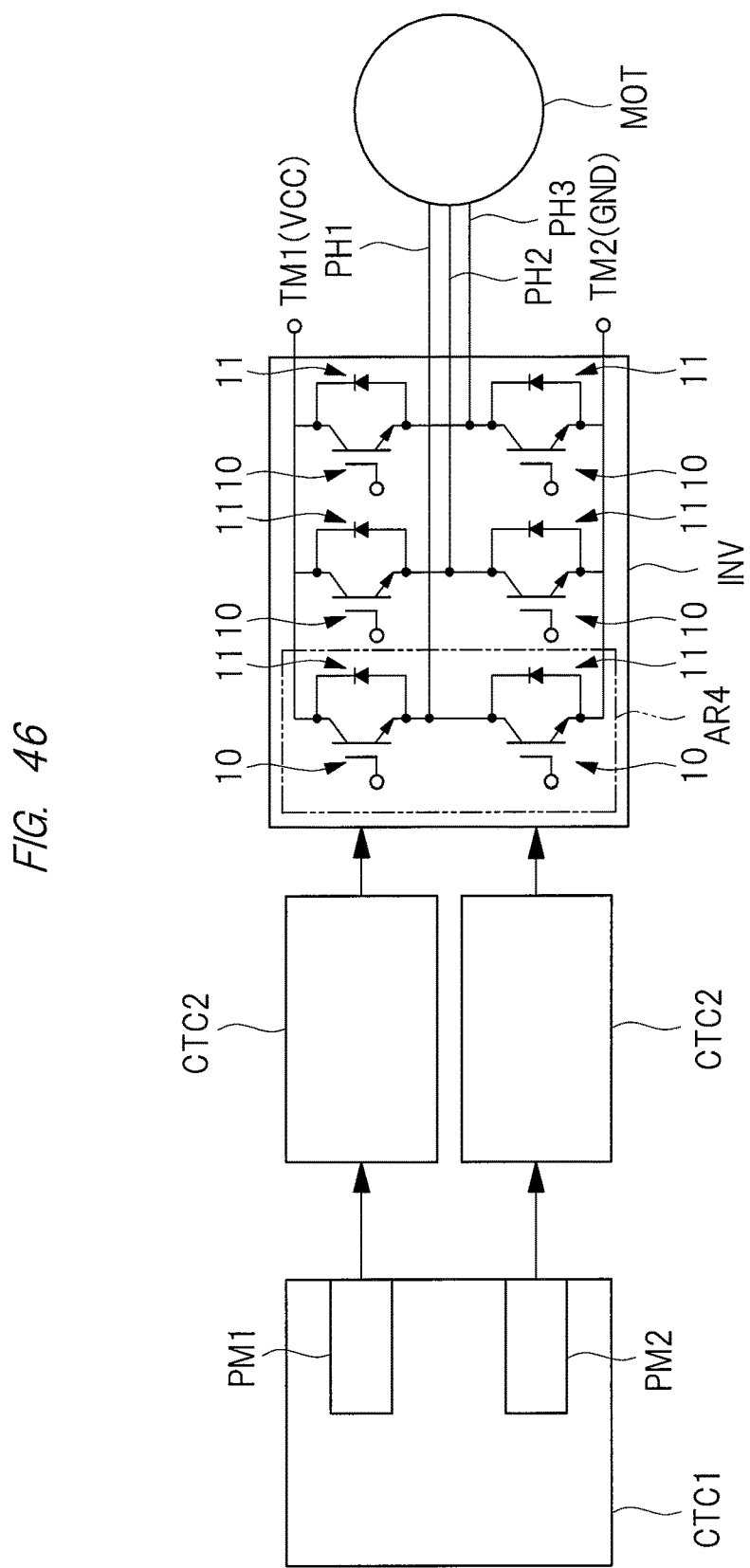
FIG. 46 is a circuit block diagram illustrating an example of an electronic system in which a semiconductor device according to a fifth embodiment is used.
Figure 47:
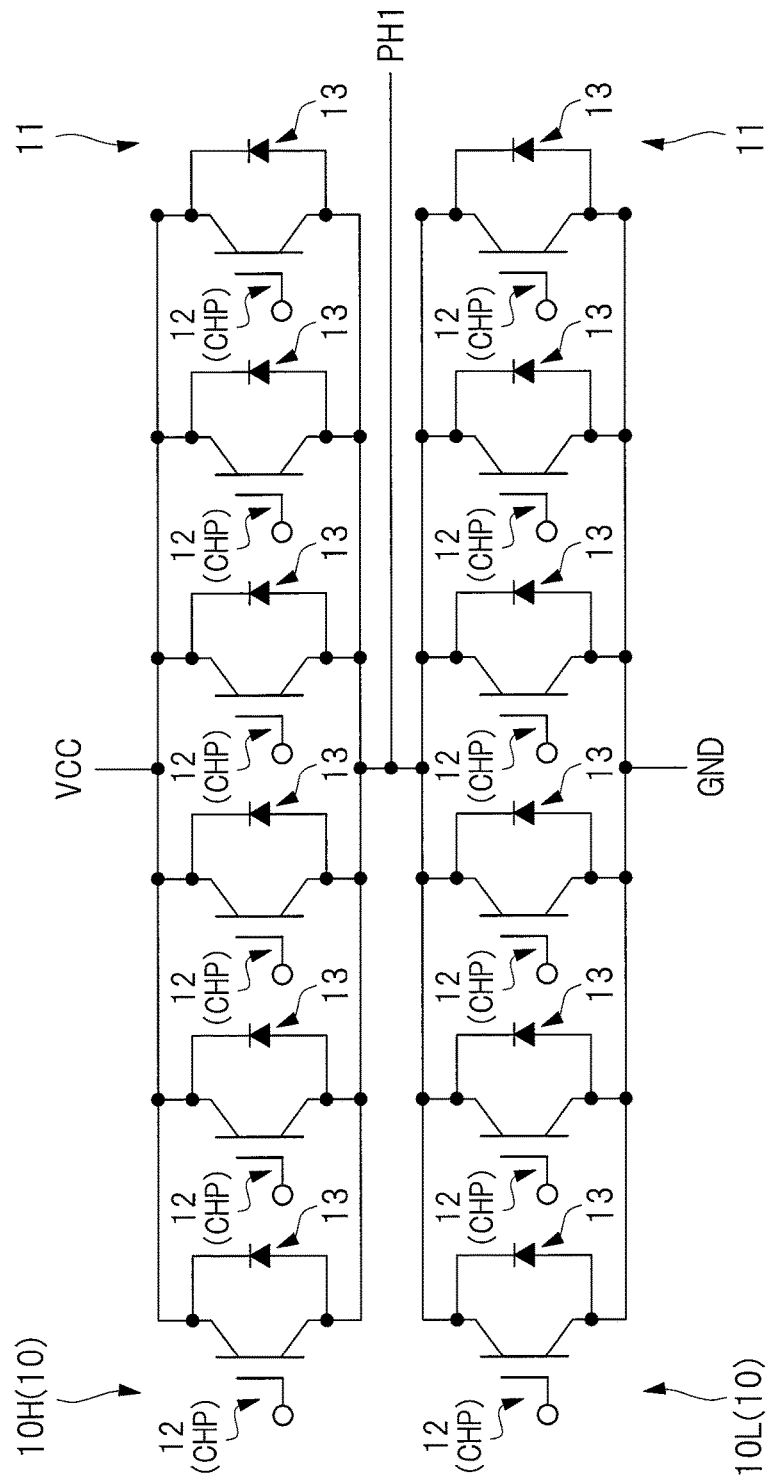
FIG. 47 is an equivalent circuit diagram illustrating a module serving as the semiconductor device according to the fifth embodiment.

FIG. 46 is a circuit block diagram illustrating an example of an electronic system using a semiconductor device according to the fifth embodiment. FIG. 47 is an equivalent circuit diagram illustrating a module serving as the semiconductor device according to the fifth embodiment. FIG. 47 illustrates two IGBT modules 10 of six IGBT modules 10 included in an inverter INV illustrated in FIG. 46, the two IGBT modules corresponding to U-phase PH1.

As illustrated in FIG. 46, the electronic system using the semiconductor device according to the present fifth embodiment includes a load such as a motor MOT, the inverter INV, a control circuit CTC1, and a control circuit CTC2. As such an electronic system, for example, a photovoltaic power generation system, a wind power generation system, and an uninterruptible power supply (UPS) system are cited. As the motor MOT, a three-phase motor is used here. The three-phase motor is configured to be operated by a voltage with three phases which are different from each other. The control circuit CTC1 includes a plurality of power modules PM1 and PM2.

In the electronic system illustrated in FIG. 46, an output of a power generation module (illustration is omitted) in, for example, the photovoltaic power generation system, the wind power generation system, or the uninterruptible power supply system is connected to input terminals TM1 and TM2 of the inverter INV, so that a direct-current voltage, that is, a direct-current power of the power generation module is supplied to the inverter INV.

The control circuit CTC1 is configured by, for example, an ECU (Electronic Control Unit), and has a semiconductor chip for control such as an MCU (Micro Controller Unit) embedded therein. The control circuit CTC1 includes the plurality of power modules PM1 and PM2. Each of the power modules PM1 and PM2 is also configured by, for example, an ECU, and has a semiconductor chip for control such as an MCU embedded therein.

Each of the plurality of power modules PM1 and PM2 included in the control circuit CTC1 is connected to the control circuit CTC2. The inverter INV is controlled by this control circuit CTC2. Although illustration is omitted, the control circuit CTC2 includes, for example, a gate driver and a photo coupler. The gate driver (illustration is omitted) included in the control circuit CTC2 is connected to the inverter INV. At this time, the gate driver (illustration is omitted) included in the control circuit CTC2 is connected to the gate electrode of the IGBT provided in the inverter INV.

The motor MOT is connected to the inverter INV. A direct-current voltage, that is, a direct-current power supplied to the inverter INV from the power generation module (illustration is omitted) in, for example, the photovoltaic power generation system, the wind power generation system, or the uninterruptible power supply system, is converted into an alternate-current voltage, that is, an alternate-current power by the inverter INV, and is supplied to the motor MOT. The motor MOT is operated by the alternate-current voltage or the alternate-current power supplied from the inverter INV.

In the example illustrated in FIG. 46, the motor MOT is a three-phase motor having U-phase PH1, V-phase PH2, and W-phase PH3. Thus, the inverter INV also corresponds to the three phases formed of the U-phase PH1, the V-phase PH2, and the W-phase PH3. Such an inverter INV corresponding to the three phases totally includes six pairs of the IGBT module 10 and the diode module 11.

The semiconductor device according to the present fifth embodiment is equivalent to the IGBT module 10. Also, the IGBT module 10 includes a plurality of IGBT chips 12, and each of the IGBT chips 12 is equivalent to the semiconductor chip CHP (see FIG. 1).

In a case in which the motor MOT is a two-phase motor, note that the inverter INV totally includes four pairs of the IGBT module 10 and the diode module 11.

A part of the inverter INV, the part being closer to a power supply potential VCC side than an input potential of the motor MOT, is referred to as a high side. Also, a part of the inverter INV, the part being closer to a ground potential GND side than the input potential of the motor MOT, is referred to as a low side. In the example illustrated in FIG. 46, three IGBT modules 10 are used as high-side IGBT modules 10, and three IGBT modules 10 are used as low-side IGBT modules 10. Also, three diode modules 11 are used as high-side diode modules 11, and three diode modules 11 are used as low-side diode modules 11.

A high-side IGBT module 10H out of two IGBT modules 10 corresponding to, for example, the U-phase illustrated in a region AR4 in FIG. 46, includes a plurality of, for example, six IGBT chips 12 each configured by the semiconductor chip CHP as illustrated in FIG. 47. Also, a low-side IGBT module 10L out of the two IGBT modules 10 corresponding to, for example, the U-phase includes a plurality of, for example, six IGBT chips 12 each configured by the semiconductor chip CHP. In both of the high side and the low side, the respective emitter electrodes EE of the plurality of IGBT chips 12 are electrically connected to each other, and the respective collector electrodes CE of the plurality of IGBT chips 12 are electrically connected to each other.

As each of the plurality of IGBT chips 12 included in the IGBT module 10, the semiconductor device according to the first embodiment illustrated in FIGS. 1 to 4 can be used.

In the example illustrated in FIG. 46, in each phase of the three phases formed of the U-phase PH1, the V-phase PH2, and the W-phase PH3, the IGBT module 10 and the diode module 11 are connected in antiparallel with each other between the input potential of the motor MOT and the power supply potential VCC supplied to the inverter INV via the input terminals TM1 and TM2, that is, in the high side. Also, in each phase of the three phases formed of the U-phase PH1, the V-phase PH2, and the W-phase PH3, the IGBT module 10 and the diode module 11 are connected in antiparallel with each other between the input potential of the motor MOT and the ground potential GND, that is, in the low side.

The control circuit CTC2 is connected to the respective gate electrodes of the plurality of IGBT chips 12 included in the six respective IGBT modules 10, so that each of the plurality of IGBT chips 12 included in the six IGBT modules 10 is controlled by this control circuit CTC2. Note that a plurality of diodes 13 are included in each of the six diode modules 11, and each IGBT chip 12 and each diode 13 are connected in antiparallel with each other.

By controlling a current flowing in each IGBT module 10 by using the control circuit CTC2, the motor MOT is driven and rotated. That is, by controlling on/off of each IGBT module 10 by using the control circuit CTC2, the motor MOT can be driven. When the motor MOT is driven as described above, it is required to turn on and off the IGBT module 10. However, the motor MOT includes an inductance. Thus, when the IGBT module 10 is turned off, a reverse current which flows in a reverse direction to a direction in which the current in the IGBT module 10 flows is generated by the inductance included in the motor MOT. The IGBT module 10 does not have a function to cause this reverse current to flow, and therefore, the diode module 11 is provided in antiparallel with the IGBT module 10, so that the reverse current flows back to release energy accumulated in the inductance.

<Main Characteristics and Effects of Present Embodiment>

As described above, the semiconductor device according to the first embodiment can be used as each of the plurality of IGBT chips 12 included in the IGBT module 10 serving as the module according to the present fifth embodiment.

Accordingly, also in the plurality of IGBT chips 12 included in the module according to the present fifth embodiment, the gate capacitance can be increased, and the rapid change or oscillation of the current flowing in the IGBT at the time of turn-on can be prevented or suppressed as similar to the semiconductor device according to the first embodiment.

As described above in the first embodiment, note that the lower the current flowing in the electronic system using the semiconductor device is, the easier the oscillation, that is, the ringing is observed at the time of turn-on. Accordingly, when the electronic system using the semiconductor device according to the present fifth embodiment is a photovoltaic power generation system or an uninterruptible power supply which is an electronic system in which a lower current than a current flowing in a wind power generation system flows, the effect of increasing the gate capacitance and preventing or suppressing the rapid change or oscillation of the current flowing in the IGBT at the time of turn-on is further enhanced.

Also in the plurality of IGBT chips 12 included in the module according to the present fifth embodiment, the IE effect can be enhanced, the on-voltage can be decreased, and the switching loss at the time of turn-on in the L load switching can be decreased as similar to the semiconductor device according to the first embodiment.

Note that each of the semiconductor devices according to the modification example of the first embodiment and the second to fourth embodiments can be used as each of the plurality of IGBT chips 12 included in the IGBT module 10 serving as the module according to the present fifth embodiment. At this time, the plurality of IGBT chips 12 included in the module according to the present fifth embodiment have effects that each of the semiconductor devices according to the modification example of the first embodiment and the second to fourth embodiments has, in addition to similar effects to effects that the semiconductor device according to the first embodiment has.

In the foregoing, the invention made by the present inventor has been concretely described based on the embodiments. However, it is needless to say that the present invention is not limited to the foregoing embodiments and various modifications and alterations can be made within the scope of the present invention.

What is claimed is:

1. A semiconductor device comprising:
  a semiconductor substrate having a first main surface and a second main surface on an opposite side of the first main surface;
  a drift region disposed in the semiconductor substrate and having a first conductive type;
  a second semiconductor region having a second conductivity type different from the first conductivity type, and disposed in the semiconductor substrate located closer to the second main surface than the drift region;
  a first cell region and a second cell region disposed in the first main surface, and arranged in a first direction on the first main surface and extending along a second direction which is perpendicular to the first direction in a plan view; and
  a third cell region disposed in the first main surface between the first and second cell regions and extending along the second direction,
  wherein each of the first and second cell regions include:
  a first gate electrode disposed in a first trench in the first main surface, and extending along the second direction;
  second and third gate electrodes disposed in second and third trenches in the first main surface, respectively, and located on both sides of the first trench in the plan view;
  a first semiconductor region having the second conductivity type disposed between the first and second trenches to be in contact with the first and second trenches over the drift area;
  a second semiconductor region having the second conductivity type disposed between the first and third trenches to be in contact with the first and third trenches over the drift area;
  a third semiconductor region having the first conductivity type disposed between the first and second trenches to be in contact with the first trench in the first semiconductor region; and
  a fourth semiconductor region having the first conductivity type disposed between the first and third trenches to be in contact with the first trench in the second semiconductor region,
  wherein the third cell region includes:
  fourth and fifth gate electrodes disposed in fourth and fifth trenches in the main surface, and arranged in the first direction on the first main surface and extending along the second direction;

a fifth semiconductor region having the second conductive type disposed between the fourth and fifth trenches to be in contact with the fourth and fifth trenches over the drift area;
a sixth semiconductor region having the second conductive type disposed between the fourth trench and the second trench of the first cell region to be in contact with the fourth and second trenches; and
a seventh semiconductor region having the second conductive type disposed between the fifth trench and the third trench of the second cell region to be in contact with the fifth and third trenches,
a gate wiring disposed over the first main surface and connected to the first gate electrodes in the first and second cell regions; and
an emitter wiring disposed over the first main surface and connected to the second and third gate electrodes in the first and second cell regions, and connected to the first and second semiconductor regions in the first and second cell regions,
wherein a depth of the sixth semiconductor region is deeper than a lower end of the second trench of the first cell region in depth, and
wherein a depth of the seventh semiconductor region is deeper than a lower end of the third trench in the first cell region in depth.

2. The semiconductor device according to claim 1, wherein the emitter wiring connects to the fourth and fifth gate electrodes in the third cell region.

3. The semiconductor device according to claim 1, further comprising:
an eighth semiconductor region having the first conductivity type disposed in the drift region and between the first and second trenches in the first and second cell regions in contact with the first and second trenches; and
a ninth semiconductor region having the first conductivity type disposed in the drift region and between the first and third trenches in the first and second cell regions in contact with the first and third trenches.

4. The semiconductor device according to claim 3, further comprising:
a tenth semiconductor region having the first conductivity type disposed in the drift region and between the fourth and fifth trenches in the third cell region in contact with the fourth and fifth trench.

5. The semiconductor device according to claim 4, wherein the tenth semiconductor region has an impurity concentration higher than that of the drift region and lower than that of the third semiconductor region.

6. The semiconductor device according to claim 3, wherein the eighth semiconductor region has an impurity concentration higher than that of the drift region and lower than that of the third semiconductor region.

7. The semiconductor device according to claim 3, wherein a lower end of the eighth semiconductor region is shallower than that of the sixth semiconductor region in depth.

8. The semiconductor device according to claim 3, wherein a lower end of the eighth semiconductor region is deeper than that of the second trench in depth; and
wherein a lower end of the eighth semiconductor region is shallower than that of the sixth semiconductor region in depth.

9. The semiconductor device according to claim 1, further comprising:
an eleventh semiconductor region having the second conductivity type disposed in the sixth semiconductor region to be in contact with the fourth and second trenches and located closer to the first main surface; and
a twelfth semiconductor region having the second conductivity type disposed in the seventh semiconductor region to be in contact with the fifth and third trenches and located closer to the first main surface.

10. The semiconductor device according to claim 1, wherein a lower end of the sixth semiconductor region is deeper than that of the second trench of the first cell region in depth.

11. The semiconductor device according to claim 10, wherein a lower end of the seventh semiconductor region is deeper than that of the third trench of the second cell region in depth.

12. The semiconductor device according to claim 1, wherein a width of the sixth semiconductor region is wider than a width between the second and fifth trenches.

13. The semiconductor device according to claim 1, further comprising:
the third semiconductor region having the first conductivity type disposed between the first and second trenches to be in contact with the first trench in the first semiconductor region; and
wherein the third semiconductor region is apart from the third semiconductor region in the second direction in the plan view.

* * * * *